US008228071B2

(12) United States Patent  (10) Patent No.: US 8,228,071 B2
Sexton et al.  (45) Date of Patent: *Jul. 24, 2012

(54) ELECTRICAL SAFETY DEVICES AND SYSTEMS FOR USE WITH ELECTRICAL WIRING, AND METHODS FOR USING SAME

(75) Inventors: Robert Jay Sexton, Hendersonville, TN (US); Fred Lane Martin, Carrollton, GA (US)

(73) Assignee: Newire, Inc., Knoxville, TN (US)

( * ) Notice: Subject to any disclaimer, the term of this patent is extended or adjusted under 35 U.S.C. 154(b) by 646 days.

This patent is subject to a terminal disclaimer.

(21) Appl. No.: 12/398,660

(22) Filed: Mar. 5, 2009

(65) Prior Publication Data
US 2009/0201027 A1   Aug. 13, 2009

Related U.S. Application Data

(63) Continuation-in-part of application No. 11/782,450, filed on Jul. 24, 2007, now Pat. No. 7,915,899.

(60) Provisional application No. 61/034,002, filed on Mar. 5, 2008, provisional application No. 60/820,197, filed on Jul. 24, 2006.

(51) Int. Cl.
*G01R 31/02* (2006.01)
*H02H 3/00* (2006.01)
(52) U.S. Cl. .......................................... 324/539; 361/42
(58) Field of Classification Search ........................ None
See application file for complete search history.

(56) References Cited

U.S. PATENT DOCUMENTS

| 5,228,072 | A | * | 7/1993 | Ingalsbe et al. ............ 379/21 |
| 5,600,524 | A | | 2/1997 | Neiger et al. |
| 6,026,145 | A | | 2/2000 | Bauer et al. |
| 6,232,556 | B1 | | 5/2001 | Daugherty et al. |
| 6,344,748 | B1 | * | 2/2002 | Gannon .................... 324/542 |
| 6,697,238 | B2 | | 2/2004 | Bonilla et al. |
| 6,833,713 | B2 | | 12/2004 | Schoepf et al. |
| 6,856,137 | B2 | | 2/2005 | Roden et al. |
| 6,930,490 | B2 | * | 8/2005 | Saunders et al. ........... 324/511 |
| 2004/0207407 | A1 | | 10/2004 | Shander |

OTHER PUBLICATIONS

Written Opinion of the International Search Report of PCT/US2007/074247.

* cited by examiner

*Primary Examiner* — Jeff Natalini
(74) *Attorney, Agent, or Firm* — Sutherland Asbill & Brennan LLP

(57) ABSTRACT

Disclosed are systems and methods for monitoring an electrical wire. An appropriate safety device is utilized to monitor the electrical wire. The safety device includes a line side input configured to connect a line side power source and receive an electrical power signal from the line side power source. Additionally, the safety device includes a wire connection configured to connect to an electrical wire. The safety device further includes at least one relay or other suitable disconnection component configured to control the communication of the electrical power signal onto the electrical wire. The safety device also includes a control unit configured to test the electrical wire for at least one of miswires, wire faults, or abnormal conditions and, based at least in part on the results of the testing, to control the actuation of the at least one relay.

19 Claims, 27 Drawing Sheets

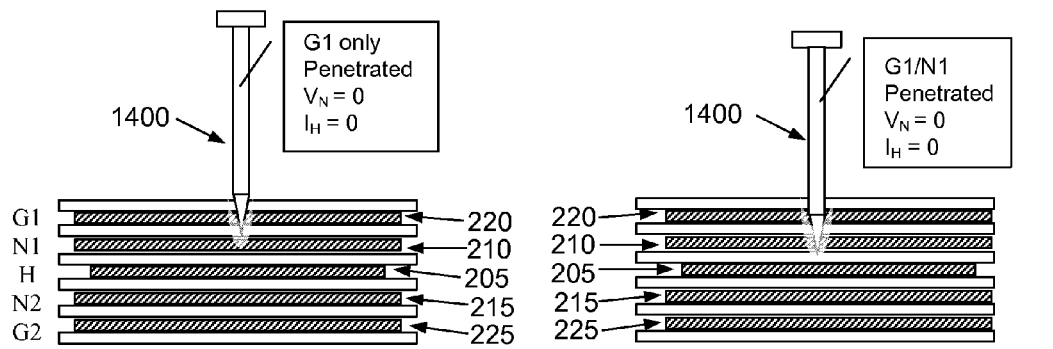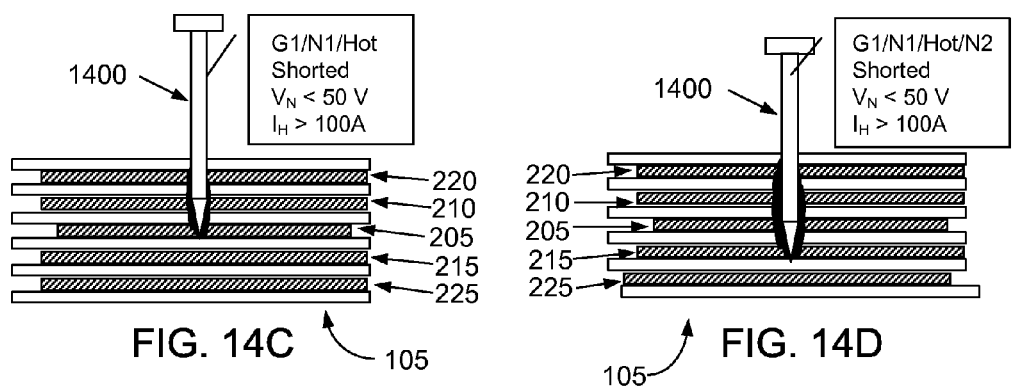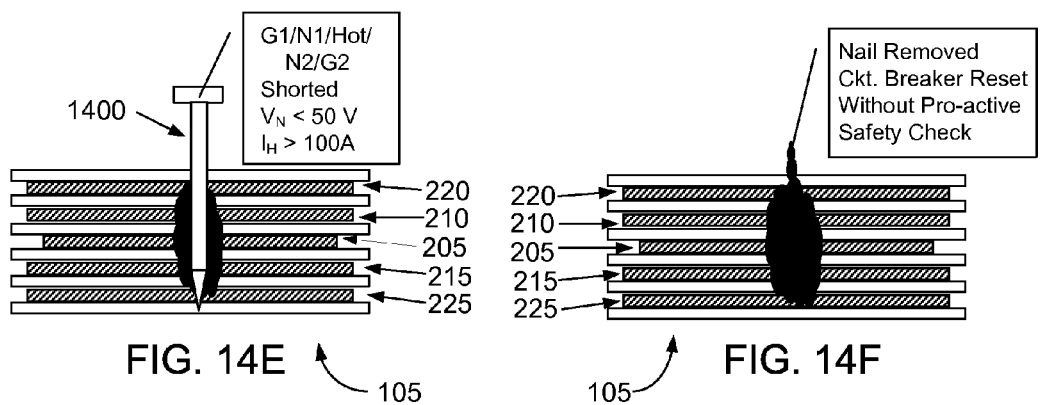

ELECTRICAL SAFETY DEVICES AND SYSTEMS FOR USE WITH ELECTRICAL WIRING, AND METHODS FOR USING SAME

CROSS REFERENCE TO RELATED APPLICATIONS

This application is a continuation-in part of co-pending U.S. patent application Ser. No. 11/782,450, filed Jul. 24, 2007, entitled ELECTRICAL SAFETY DEVICES AND SYSTEMS FOR USE WITH ELECTRICAL WIRING, AND METHODS FOR USING SAME, which claims priority to U.S. Provisional Application No. 60/820,197, entitled ACTIVE SAFETY DEVICES, which was filed on Jul. 24, 2006. Additionally, the present application claims priority to U.S. Provisional Application No. 61/034,002, filed Mar. 5, 2008, entitled ACTIVE SAFETY DEVICES AND METHODS FOR USE WITH ELECTRICAL WIRE. The disclosures for each of these applications are incorporated herein by reference in their entirety.

FIELD OF THE INVENTION

Embodiments of the invention generally relate to safety devices and systems used in conjunction with electrical wiring.

BACKGROUND OF THE INVENTION

Most homes and commercial buildings utilize electrical wiring systems to distribute power throughout the structure. Typically, electrical wiring systems carry a 120 or 240 volt signal at 15 or 30 amps, respectively, to provide electrical power for lighting systems, climate control systems, appliances, and other electrical loads. Many accidents occur annually due to penetrations of electrical wires or due to deterioration of older wiring systems.

According to reports issued by the Consumer Products Safety Commission (CPSC) in 1997, home wire systems caused over 40,000 fires that resulted in 250 deaths and over $670 million of property damage. Further study by the CPSC based on 40,300 electrical circuit fires showed that 36% were due to installed wiring and 16% were due to cord/plugs.

Today, circuit breakers primarily protect against certain overload and short circuit conditions which occur primarily in fixed wiring. The overload protection is provided by the slow heating of a bimetal strip that breaks the circuit causing the breaker to trip after a specified period of time. The more current that runs through the bimetal, the shorter the time it takes to trip the breaker. Short circuit protection may be provided magnetically, that is, a high level of current may trip a breaker instantaneously. The lower limit of the magnetic trip setting may be determined by the manufacturer such that the device does not nuisance trip on high inrush loads.

Circuit breakers do not protect against all hazards that may occur within electrical wiring systems. Therefore, in addition to circuit breakers, there are many other safety devices that have been designed for use with electrical wiring. One such safety device that is commonly installed in electrical wiring systems is a Ground Fault Circuit Interrupter (GFCI). A GFCI measures the difference between the currents flowing through the hot conductor and the neutral conductor of a conventional electrical wire. If the difference between the current flowing through the hot conductor and the current flowing through the neutral conductor exceeds a few milliamps, the presumption is that current is leaking to ground via some other path. This may be because of a short circuit to, for example, the chassis of an appliance, or to the ground lead, or through a person. Any of these situations may be hazardous, so the GFCI trips, breaking the circuit.

Another safety device that is commonly installed in electrical wiring systems is an Arc Fault Circuit Interrupter (AFCI). An AFCI adds electronic protection to the standard thermal and magnetic protection provided by circuit breakers. The circuitry in an AFCI detects specific arcs that are determined to be likely to cause a fire. The AFCI uses electronics to recognize the current and voltage characteristics of the arcing faults on the electrical wire, and interrupts the circuit when a fault is detected. Each AFCI has circuit logic, and perhaps control logic, that is designed to detect specific types of arc faults. These arc faults are specific to the type of wiring the AFCI is designed to be implemented with.

A problem with many electrical wire safety devices is that they are specifically designed to be used in conjunction with conventional three-conductor electric wire. Current safety devices are not designed to be used in wiring systems that include flat electrical wire. A flat electrical wire and method of fabricating the electrical wire are described in U.S. patent application Ser. No. 10/790,055 (Now U.S. Pat. No. 7,145,073), which is incorporated by reference herein in its entirety. Flat electrical wire is designed to be a surface-mounted wiring system that can be installed on surfaces such as a wall, ceiling or floor. Accordingly, flat electrical wire is designed to be thin and flexible in order to allow it to be easily concealed, for example, by being painted or papered over. Currently existing safety devices are not specifically designed to be used in conjunction with and in many cases are incompatible with flat electrical wire. Accordingly, a need exists for one or more safety devices that are suitable for use with flat electrical wire.

Another problem with many electrical wire safety devices is that they require manual intervention and/or manual reset once a fault is detected. The electrical wire safety devices are not capable of making a determination of when a fault is no longer present on a monitored wire and, therefore, will maintain the wire in a de-energized state. This inability to determine when a fault is no longer present can lead to undesirable situations. For example, an electrical wire that provides power to a refrigerator or freezer may be de-energized by an electrical wire safety device and, if a user does not reset the safety device, perishable food items may spoil. Accordingly, a need exits for one or more improved safety devices that are capable of determining when a fault is no longer present within a monitored wire or within a portion or all of a monitored wiring system.

BRIEF DESCRIPTION OF THE INVENTION

Embodiments of the invention include electrical safety devices and systems for use with electrical wiring, and methods for using the same. In one embodiment, a source device for use with electrical wire is provided. The source device may include a line side input, a wire connection, at least one relay, and a control unit. The line side input may be configured to connect to a line side power source and receive an electrical power signal from the line side power source. The wire connection may be configured to connect to an electrical wire. The at least one relay may be configured to control the communication of the electrical power signal onto the electrical wire. The control unit may be configured to test the electrical wire for at least one of miswires, wire faults, or abnormal conditions and, based at least in part on the results of the testing, to control the actuation of the at least one relay.

According to another embodiment of the invention, an electrical wiring system is provided. The electrical wiring system may include a source device, a destination device, and an electrical wire. The source device may be configured to be coupled to a line side power source, and the source device may include an active safety device and a first wire termination. The destination device may include a second wire termination. The electrical wire may have a first end coupled to the first wire termination and a second end coupled to the second wire termination. The active safety device may monitor the electrical wire for at least one of miswires, wire faults, or abnormal conditions and, based on the results of the monitoring, control the communication of an electrical power signal from the line side power source to the electrical wire.

According to yet another embodiment of the invention, a method for monitoring an electrical wire terminated between a source and a destination is provided. One or more conductors of the electrical wire may be tested for at least one of miswires, wire faults or abnormal conditions. The communication of an electrical power signal from a power source to the electrical wire may be controlled based at least in part on results of the testing.

Additional systems, methods, apparatus, features, and aspects are realized through the techniques of various embodiments of the invention. Other embodiments are aspects of the invention are described in detail herein and are considered a part of the claimed invention. Other advantages and features can be understood with reference to the description and drawings.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIGS. 14A-14F are cross-sectional views depicting an example of the dynamics of a nail or tack penetration of a live multi-planar flat wire.

DETAILED DESCRIPTION OF THE INVENTION

The invention now will be described more fully hereinafter with reference to the accompanying drawings, in which some, but not all embodiments of the invention are shown. Indeed, embodiments of the invention may be embodied in many different forms and should not be construed as limited to the embodiments set forth herein; rather, these embodiments are provided so that this disclosure will satisfy applicable legal requirements. Like numbers refer to like elements throughout.

As used herein, the term "relay" may refer to any suitable device, component, system, and/or combination thereof that facilitates the electrification of a wire and/or control over the electrification of a wire. Examples of relays include, but are not limited to, electrical switches, mechanical switches, electromechanical switches, electromagnetic switches, triacs, and/or any other suitable disconnection component. Additionally, for purposes of this disclosure, the terms "relay" and "disconnection component" may be utilized interchangeably.

Disclosed are systems and methods for monitoring an electrical wire or electrical wiring system for miswires and/or wire faults. An Active Safety Device (ASD) may be utilized to perform tests on an electrical wire prior to the electrification of the electrical wire, during the electrification of the electrical wire, and/or following the electrification of the electrical wire. If a miswire or wire fault is identified or detected by the ASD prior to the electrification of the electrical wire, then the electrical wire may be prevented from being electrified. If a miswire or wire fault is identified or detected by the ASD during or following the electrification of the electrical wire, then the electrical wire may be de-energized. An ASD may be utilized in many different types of applications, for example, in conjunction with commercial and/or residential wiring. As an example, an ASD may be utilized to monitor electrical wiring that is installed in a home or at a commercial or industrial site. The monitored electrical wiring may be wiring that is installed at the location at the time of construction or during a rewiring project.

Figure 1:
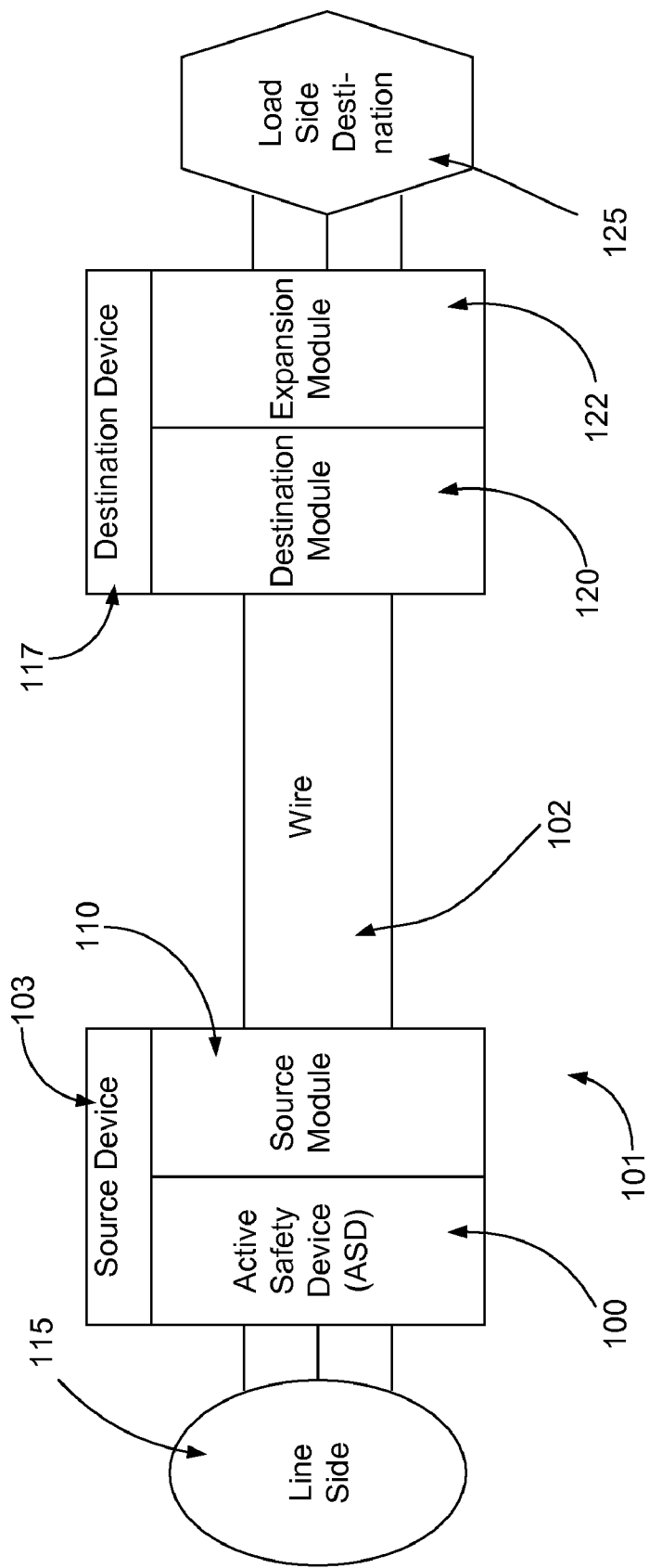
FIG. 1 is a schematic diagram of one example of a wiring system including an Active Safety Device (ASD), according to an illustrative embodiment of the invention.

Referring now to FIG. 1, an Active Safety Device (ASD) 100 implemented in an electrical wire system 101 is shown, according to an illustrative embodiment of the invention. The electrical wire system 101 may include a source device 103, a wire 102 that is monitored by the ASD, a line side power source 115, a destination device 117, and a load side destination 125. The source device 103 may include an ASD 100 and a source module 110. The destination device 117 may include a destination module 120 and an expansion module 122. For purposes of the present disclosure, an ASD 100 is an electrical safety device, circuit, or module in accordance with embodiments of the invention containing reactive and/or proactive safety components, circuits, and/or circuitry, as explained in greater detail below. In some embodiments, for example, some commercial embodiments, the source device 103 and its associated components, circuitry, and modules may be designated as an ASD.

The ASD 100 may be utilized to monitor a variety of different wire types, including but not limited to, flat electrical wire, other types of flat wiring, and/or conventional electrical wiring, such as electric wire comprising elongated cylindrical conductors based on the teaching disclosed herein. For purposes of this disclosure, the term "wire" 102 is utilized to refer generally to a wire that may be monitored by the ASD 100, irregardless of the model, type, and/or construction of the wire.

Figure 2A:
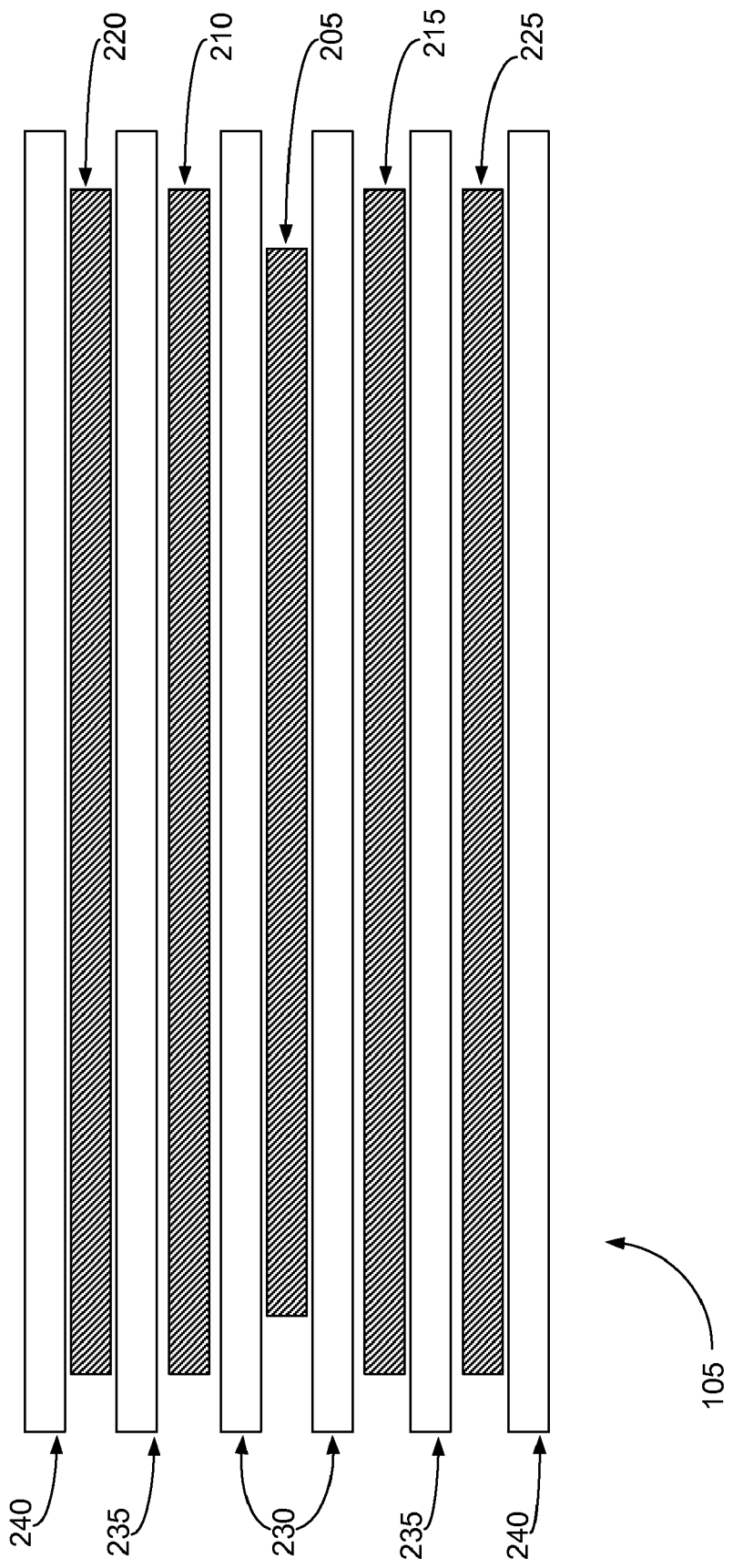
FIG. 2A is a cross-section view of a multi-planar, stacked, or protective layered flat wire that may be used in conjunction with an ASD, according to an illustrative embodiment of the invention.

A variety of flat wires may be used in conjunction with an ASD 100 in accordance with embodiments of the invention, such as the flat wire 105 depicted in FIG. 2A. A flat wire may be a flat electrical wire or other flat wire such as a speaker wire, telephone wire, low voltage wire, CATV wire, or under surface wire. The flat wire typically will be made up of multiple flat conductors that may be configured in a stacked, multi-planar, or protective layered arrangement or in a parallel or coplanar arrangement having conductors within the same plane. Additionally, the conductors of the flat wire may contain multiple conductive adjacent or non-insulated sub-layers or flat strands. The flat wire may also contain one or more optical fibers. One example of a flat wire that may be used in association with the ASD 100 discussed herein is described in U.S. Pat. No. 7,145,073, entitled "Electrical Wire and Method of Fabricating the Electrical Wire," which is hereby incorporated by reference in its entirety. Further embodiments of the electrical flat wire are described in U.S. Pat. No. 7,217,884, entitled, "Electrical Wire and Method of Fabricating the Electrical Wire," U.S. patent application Ser. No. 11/437,992, entitled, "Electrical Wire and Method of Fabricating the Electrical Wire," U.S. patent application Ser. No. 11/932,871, entitled, "Electrical Wiring Safety Device for Use with Electrical Wire," and U.S. patent application Ser. No. 11/932,757, entitled, "Electrical Wire and Method of Fabricating the Electrical Wire," the disclosures of which are incorporated by reference herein in their entirety. Other examples of flat wires that may be used in association with the ASD 100 include, but are not limited to, the flat wires disclosed in U.S. Pat. No. 5,804,768, entitled "Flat Surface-Mounted Multi-Purpose Wire," U.S. Pat. No. 6,107,577, entitled "Flat Surface-Mounted Multi-Purpose Wire," U.S. Pat. No. 6,492,595, entitled "Flat Surface-Mounted Multi-Purpose Wire," and U.S. Pat. No. 6,774,741, entitled "Non-uniform Transmission Line and Method of Fabricating the Same," the disclosures of which are incorporated by reference herein in their entirety.

FIG. 2A is a cross-section view of a multi-planar flat wire 105 that may be used in association with an ASD 100, according to an illustrative embodiment of the invention. The flat wire 105 of FIG. 2A may be an electrical flat wire with stacked conductors. At least one electrifiable conductor 205 (or hot conductor) may be situated between two return conductors 210, 215, (or neutral conductors) and the two return conductors 210, 215 may be formed such that the electrifiable conductor 205 is substantially entrapped by the first and second return conductors 210, 215. The term substantially entrapped may be utilized to refer to a situation in which the electrifiable conductor 205 cannot be contacted by a foreign object (e.g., a nail, screw, staple, etc.) without the foreign object first contacting one of the return conductors 210, 215. The term substantially entrapped does not necessarily mean that the return conductors 210, 215 completely surround the electrifiable conductor 205 (although such a design is possible). Instead, the term may mean that any distance between the return conductors 210, 215 may be small enough that a foreign object cannot reasonably go between the return conductors 210, 215 and the electrifiable conductor 205 without contacting one or more of the return conductors 210, 215.

With continued reference to FIG. 2A, two grounding conductors 220, 225 may be included in the flat wire 105. The various conductors of the flat wire 105 may be assembled in a stacked configuration such that the electrifiable conductor 205 is situated between the two return conductors 210, 215 and that three conductor arrangement is then sandwiched between the two grounding conductors 220, 225. This configuration may be referred to as a G-N-H-N-G configuration.

Additionally, insulation material may be disposed between each of the conductors of the flat wire 105. The insulation material may prevent the various conductors of the flat wire 105 from contacting one another and creating a short circuit in the flat wire 105. Electrifiable conductor insulation material 230 may surround the electrifiable conductor 205 and prevent the electrifiable conductor 205 from making electrical contact with the other conductors of the flat wire 105. Additionally, return conductor insulation material 235 may be disposed between the return conductors 210, 215 and the corresponding grounding conductors 220, 225 to prevent the first return conductor 210 from contacting the corresponding first grounding conductor 220 and to prevent the second return conductor 215 from contacting the corresponding second grounding conductor 225. Grounding conductor insulation 240 may be disposed opposite the first grounding conductor 220 and the second grounding conductor 225, and the grounding conductor insulation 240 may prevent the grounding conductors 220, 225 from contacting an object or surface that is external to the flat wire 105.

Alternatively, each conductor of the flat wire 105 may be individually wrapped with an insulation material. In this alternative configuration, electrifiable conductor insulation material 230 would be disposed on both sides of the electrifiable conductor 205 to separate the electrifiable conductor 205 from the return conductors 210, 215. Return conductor insulation material 235 would be disposed on both sides of each of the return conductors 210, 215 to separate the return conductors 210, 215 from the electrifiable conductor 205 and the grounding conductors 220, 225. Grounding conductor insulation material 240 would be disposed on both sides of each of the grounding conductors 220, 225 to separate the grounding conductors 220, 225 from the return conductors 210, 215 and any objects or surfaces that are external to the flat wire 105. In the alternative configuration, two layers of insulation material are disposed between any two conductors of the flat wire 105, thereby decreasing the possibility of short circuits between the conductors of the flat wire 105. In other words, a short circuit between two conductors of the flat wire 105 exists when there is a flaw in the insulation material between the two conductors. For example, if only a single layer of insulation material is disposed between each of the conductors of the flat wire 105, a short circuit might occur if there is a flaw in the insulation material disposed between the electrifiable conductor 205 and one of the return conductors 210. If, however, each of the conductors of the flat wire 105 is individually wrapped with insulation material, the possibility of a short circuit between two conductors is decreased because flaws would need to be present in both layers of insulation material disposed between the two conductors, and the flaws would need to line up with one another or be situated in close proximity to one another. For example, for a short circuit to occur between the electrifiable conductor 205 and one of the return conductors 210, flaws must be present in both the electrifiable conductor insulation material 230 and in the return conductor insulation material 235 disposed between the two conductors. Additionally, these flaws would need to line up with one another or be situated in close proximity to one another.

Although a five-conductor stacked flat wire is depicted in FIG. 2A, the ASD 100 may be utilized to monitor flat wires with many different conductor configurations. For example, flat wires with a wide variety of stacked conductor configurations may be monitored by the ASD 100. As an example, a three conductor flat wire having a stacked configuration may be monitored by the ASD 100. The three conductor flat wire may include an electrifiable conductor that is substantially entrapped by first and second return conductors, and the three conductor configuration may be referred to as a N-H-N configuration. Additionally, various flat wire embodiments containing parallel or coplanar arrangements of conductors may be monitored by the ASD 100. For example, a three conductor flat wire having a coplanar arrangement may be monitored by the ASD 100. The three conductor coplanar flat wire may include an electrifiable conductor, a return conductor, and a grounding conductor disposed in a parallel configuration within the same plane.

Figure 2B:
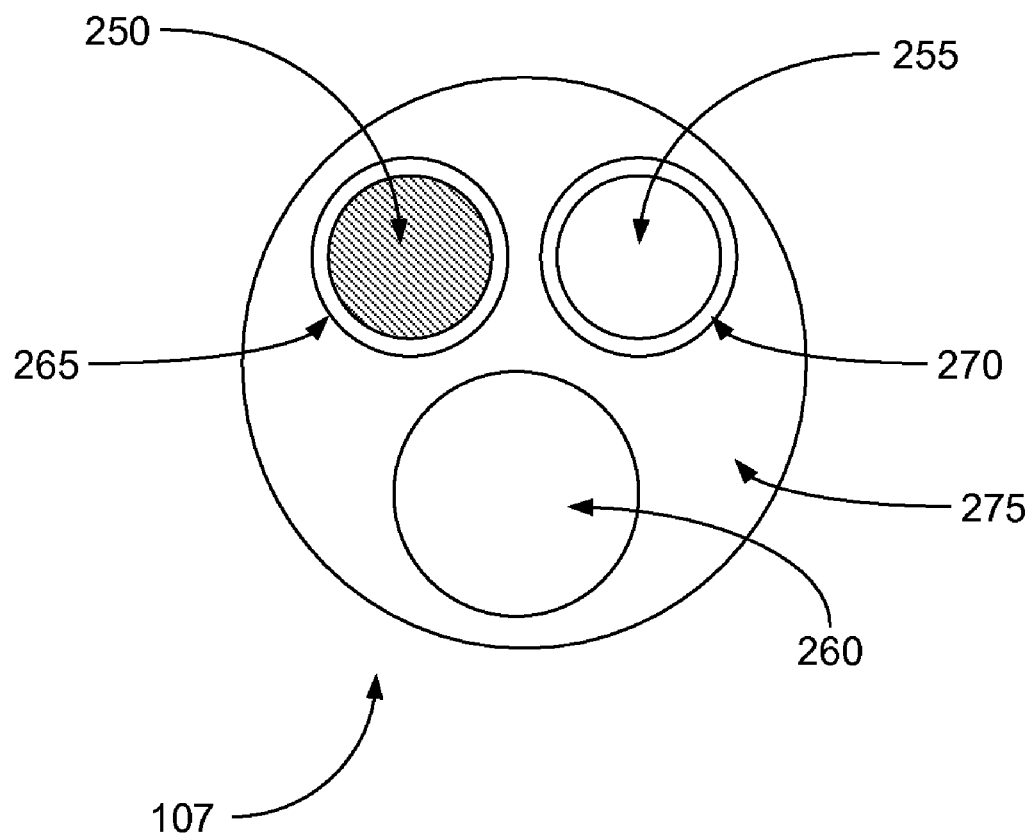
FIG. 2B is a cross-section view of a standard or conventional three-conductor electrical wire that may be used in conjunction with an ASD, according to an illustrative embodiment of the invention.

In addition to various types of flat wire, the ASD 100 may be utilized to monitor other types of wire, including round wires and/or wires having a concentric or substantially concentric arrangement of conductors. FIG. 2B is a cross-section view of a standard three-conductor electrical wire, discussed herein as a conventional wire 107, that may be used in conjunction with an ASD 100, according to an illustrative embodiment of the invention. With reference to FIG. 2B, the conventional wire 107 may include an electrifiable or hot conductor 250, a return, neutral, or grounded conductor 255, and a grounding or ground conductor 260. Suitable insulation material may be wrapped around or provided for the electrifiable conductor 250 and the return conductor 255. As shown in FIG. 2B, electrifiable conductor insulation material 265 may be provided for the electrifiable conductor 250 and return conductor insulation material 270 may be provided for the return conductor 265. The grounding conductor 260 may not contain its own individual insulation; however, suitable insulation material, such as thermoplastic insulation, may be provided for all three of the conductors 250, 255, 260 of the conventional wire 107.

FIG. 2B illustrates a typical construction for an electrical wire; however, electrical wires having constructions that vary from that shown in FIG. 2B may be utilized in association with an ASD 100 in accordance with various embodiments of the invention. The conventional wire 107 illustrated in FIG. 2B and its construction is provided merely to depict one example of a wire that may be utilized in association with an ASD 100 in accordance with certain embodiments of the invention.

With reference back to FIG. 1, in a wire system 101, a wire 102 may be connected to the ASD 100 through a source module 110. The source module 110 may be physically separate from the ASD 100, or alternatively, the source module 110 may be integrated into the ASD 100. The source module 110 may serve as a mechanical or electromechanical connection between the wire 102 and the ASD 100. The various conductors of the wire 102, may be terminated at the source module 110. Termination points within the source module 110 may include terminal blocks, crimp-on terminals, plug and socket connectors, insulation displacement connectors (IDC), conductor penetration connectors (CPC), or any other suitable electrical connector as combination of electrical connectors. One or more appropriate detection devices may be utilized to verify that the source module 110 is connected to the ASD 100 and/or that the termination points are connected to the source module 110. For example, a ground pin or plug may be extended through the source module 110 and/or the termination points in order to detect the presence of the source module 110 and/or the termination points. As another example, an optical detection device may be utilized. Furthermore, a combination of detection devices may be utilized as desired in certain embodiments.

The ASD 100 may also be connected to a line side power source 115. The line side power source 115 may be any standard electric power source including a power wire coming from a circuit box, a conventional in-wall electrical wire, a flat electrical wire, or any other electrical wire capable of delivering electric power. For flat wire 105 and/or conventional wire 107 branch circuit applications, the line side power source 115 may be a typical wall-mounted or in-wall power outlet or power receptacle. Typically, the line side power source 115 will carry an electrical voltage of approximately 110-130 VAC or approximately 220-250 VAC.

The line side power source 115 may be physically separate from the source device 103 or, alternatively, the line side power source 115 may be integrated into the source device 103. For example, if a conventional in-wall electrical wire were directly connected to the source device 103, the line side power source 115 would be physically separate from the source device 103. Alternatively, the line side power source 115 may be integrated into the source device 103 in a situation in which the source device 103 includes, for example, a conventional three-prong plug that may be inserted into a standard electrical outlet.

Still referring to FIG. 1, the wire 102 may create a connection between the source module 110 and one or more destination devices 117. The one or more destination devices 117 may include a destination module 120 and an expansion module 122. Much like the source module 110, a destination module 120 may serve as a mechanical or electro-mechanical connection between the wire 102 and the destination device 117. The various conductors of the wire 102 may be terminated at the destination module 120. Termination points within the destination module 120 may include terminal blocks, crimp-on terminals, plug and socket connectors, insulation displacement connectors (IDC), conductor penetration connectors (CPC), or any other suitable electrical connector or combination of electrical connectors.

An expansion module 122 may be included in a destination device 117, and the expansion module 122 may serve as a mechanical or electro-mechanical connection between the destination device 117 and a load side destination 125. A load side destination 125 may include a power outlet or receptacle, a wired device, a terminal block, a safety component, "flying leads," or any other suitable load side connection as desired in various embodiments. Termination points within the expansion module 122 used to connect the load side destination 125 to the expansion module 122 may include terminal blocks, crimp-on terminals, plug and socket connectors, insulation displacement connectors (IDC), conductor penetration connectors (CPC), or any other electrical connector as desired in various embodiments. Additionally, in certain embodiments of the invention, the load side destination may be connected to the destination module 120 as an alternative to being connected to the expansion module 122.

The load side destination 125 may be physically separate from the destination device 117 or, alternatively, the load side destination 125 may be integrated into the destination device 117. For example, if an electrical device such as a lamp were directly connected to the destination device 117, the load side destination 125 would be physically separate from the destination device 117. Alternatively, the load side destination 125 may be integrated into the destination device 117 in a situation in which the destination device 117 includes, for example, one or more electrical sockets. The destination device 117 may include any number of electrical sockets configured to receive electrical plugs. For example, the destination device 117 may include one, two, three, or four sockets that serve as a load side destination 125.

Additionally, the expansion module 122 may be used to create a mechanical or electro-mechanical connection between the destination device 117 and a second destination device, as explained in greater detail below with reference to FIG. 19. In such an embodiment, a second wire 102 may be, for example, connected to the expansion module 122 and used to create a connection between the expansion module 122 and the second destination device. Termination points within the expansion module 122 may include terminal blocks, crimp-on terminals, plug and socket connectors, insulation displacement connectors (IDC), conductor penetration connectors (CPC), or any other electrical connector as desired in various embodiments.

Additionally, as explained in greater detail below, the destination device 117 may be capable of communicating with the ASD 100 through the source module 110 over one or more suitable conductors of the wire 102. The destination device 117 may also be capable of communicating with a second destination device through the expansion module 122 over a second wire 102, as explained in greater detail below with reference to FIG. 19.

Figure 3:
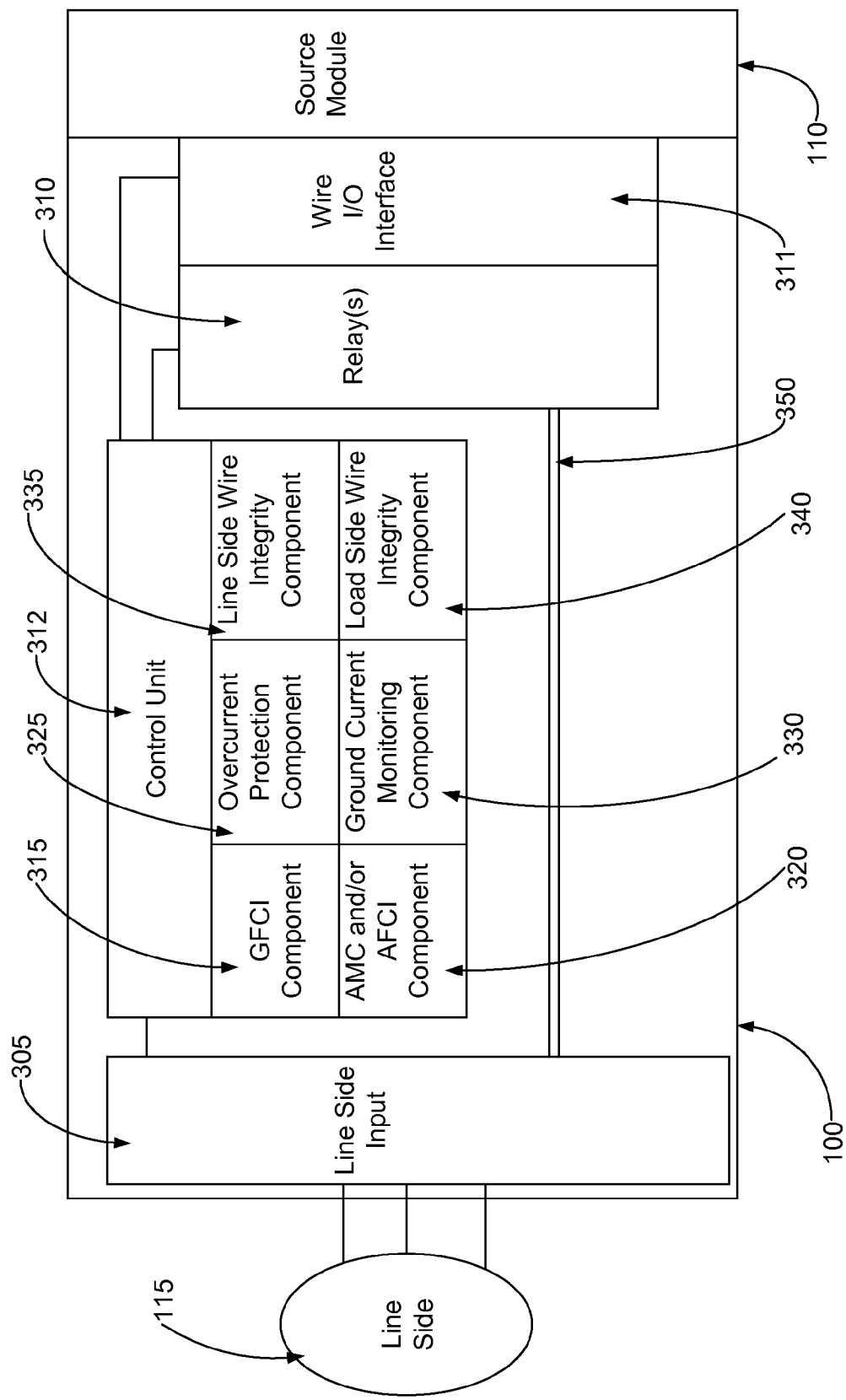
FIG. 3 is a block diagram of the components of an example ASD, according to an illustrative embodiment of the invention

FIG. 3 is a block diagram of the components of a source device 103, according to an illustrative embodiment of the invention. The ASD 100 may include a line side input 305, one or more relays 310, a wire I/O interface 311, a control unit 312, and various safety components including one or more of a GFCI component 315, an AMC and/or AFCI component 320, an over-current protection component 325, a ground current monitoring component 330, a line side wire integrity component 335, and a load side wire integrity component 340.

The ASD 100 may be powered by a power source, which may be connected to the ASD 100 at the line side input 305. For example, the line side power source 115 may be connected to the line side input 305 of the ASD 100 to provide power to the ASD 100. Further, the one or more relays 310 may control the flow of an electrical signal, which may be an electrical power signal, from a power source through the ASD 100 to the source module 110. Each of the one or more relays 310 may be, for example, a double pole single throw (DPST) relay. As desired, a multitude of other relays and/or types of relays may be used by the ASD 100 including, but not limited to, one or more single pole single throw (SPST) relays, one or more single pole double throw (SPDT) relays, one or more single pole changeover or center off relays (SPCO), one or more double pole double throw relays (DPDT), or one or more double pole changeover or center off relays (DPCO).

The ASD 100 may include a single (common or main) relay 310 or it may include multiple relays in other suitable configurations within the ASD 100. For example, each safety component of the ASD 100 may include subordinate or dedicated relays or, alternatively, various components of the ASD 100 may share a common or main relay 310. As another example, a separate relay may be provided for various conductors of a wire 102 that is connected to the source module 110. For example, if an electrical flat wire 105 as illustrated in FIG. 2A is connected to the source module, a first relay may be provided for the electrifiable conductor 205 and a second relay may be provided for the return conductors 210, 215. As another example, if a conventional electrical wire 107 as illustrated in FIG. 2B is connected to the source module, a first relay may be provided for the electrifiable conductor 250 and a second relay may be provided for the return or neutral conductor 255.

Each of the relays may be actuated independently of one another or, alternatively, a plurality of the relays may be jointly actuated. The ASD 100 may utilize one or more relays to communicate test signals onto the wire 102 without providing an electrical power signal to the electrifiable conductor, such as conductor 205, of the wire 102. For example, as explained in greater detail below with reference to a flat wire in FIG. 11, the second relay may be utilized to communicate a test signal onto the return conductors 210, 215 of the flat wire 105, and the ASD 100 may then monitor the flat wire 105 for miswires and/or wire faults. If the ASD 100 determines that no miswires and/or wire faults exist on the flat wire 105, then the ASD 100 may utilize the first relay to permit an electrical power signal to be communicated onto the electrifiable conductor 205. As another example, the second relay may be utilized to communicate a test signal onto the return conductor 255 of a conventional wire 107 while a first relay may be utilized to communicate a test signal onto the electrifiable conductor 250 of the conventional wire 107. The ASD 100 may then monitor the conventional wire 107 for miswires and/or faults. Unless otherwise stated in this disclosure, for purposes of simplicity, reference will be made to an ASD 100 that includes a single relay 310 that is utilized to control the communication of an electrical power signal onto the electrifiable conductor, such as 205 or 250 of a wire 102.

In the illustrative embodiment with a single relay 310, also referred to as the common or main relay, the ASD 100 may maintain the relay 310 in either an opened position or a closed position. When the relay 310 is maintained in a closed position, electrical power may be permitted to flow from a line side power source 115 through the ASD 100 to the source module 110. As shown in FIG. 3, an ASD power line 350 may be included in the ASD 100 to carry the electrical power from the line side input 305 through the ASD 100 to the source module 110; however, in certain embodiments of the invention, the electrical power could be propagated through the ASD 100 via circuitry other than an ASD power line 350, such as through the various individual safety components of the ASD 100. The ASD power line 350 is included in this disclosure for simplification purposes in order to facilitate the understanding of the invention. From the source module 110, the electrical power may then be transmitted onto the wire 102 and be delivered to the destination module 120.

Alternatively, when the relay 310 is maintained in an opened position, an electrical signal is not allowed to flow from a line side power source 115 through the ASD 100 to the source module 110. The ASD 100 may beneficially be configured to default to maintaining the relay 310 in an opened position. By defaulting to an opened position, the ASD 100 may ensure that no faults are present in the wire system 101 prior to full electrification or energization of the wire system 101. Accordingly, whenever the ASD 100 loses power, if the relay 310 is not in an opened position, the relay 310 may be switched to an opened position in order to permit the ASD 100 to perform tests on the wire system 101.

According to an aspect of the invention, the relay 310 may be part of a zero crossing circuit. Alternatively, the zero crossing circuit may be a part of the control unit 312, and the control unit 312 may receive a power signal, such as an alternating current power signal, from the line side input 305 and provide a coil control signal (such as a 120 VAC, 24 VDC or 12 VDC signal) to the relay 310. A zero crossing circuit is an electrical circuit that detects an alternating current load voltage at or close to zero phase occurring once for each alternating current half cycle. The zero crossing circuit may be used in connection with the opening or closing of the relay 310 in order to assist in opening or closing the relay 310 at a point in time that is close to the zero phase of the input signal. Zero crossing circuits may work on voltage zero crossings or on current zero crossings. The zero crossing circuit may take inherent turn-on and turn-off delays associated with the relay 310 into account when making zero crossing contact closures or breaks of the main relay 310. Since typical power systems in many countries run at 60 cycles per second or Hertz (Hz), a zero crossing occurs approximately every 8.3 milliseconds (ms). A typical relay 310 may have, for example, a 5 millisecond actuation time (closing time) and a 3 millisecond break time (opening time). In this example, for zero crossing turn-on, the relay coil must be energized for 3.3 ms (or the 8.3 ms cycle time–the 5 ms actuation time) after the last zero crossing of the input signal to produce a contact closure (actuation) of the relay 310 at the next zero crossing of the input signal. Similarly, in the same example, the relay coil must be de-energized for 5.3 ms (or the 8.3 ms cycle time–the 3 ms break time) after the last zero crossing to produce a contact break (de-actuation or opening) at the next zero crossing of the input signal. Accordingly, the output of power from the ASD 100 onto the wire 102 will start as soon as possible once the relay 310 is closed. Additionally, the input waveform from the line side 115 will match the output waveform across the wire 102 as closely as possible meaning that less energy is dissipated in the ASD 100 and source module 110 circuitry. The ability of the ASD 100 to perform a zero cross turn on or turn off of the relay 310 may extend the lifetime of the contacts in the relay 310, limit the contact arc-showering effect, limit electromagnetic emissions, and limit conducted electrical noise from the relay 310.

According to another aspect of the invention, the relay 310 may be actuated for a relatively short period of time in which tests may be performed on the wire 102. For example, the relay 310 may be actuated for a period of time that is less than or approximately equal to the time that it takes for one half of a typical power cycle. As explained in greater detail below with reference to FIGS. 9, 11 and 12, the ASD 100 may test one or more conductors of the wire 102 during the time that the relay 310 is actuated.

According to another aspect of the invention, the ASD 100 may be able to detect slow breaking (i.e., sticky) contacts in the relay 310. The control unit 312 of the ASD 100 may monitor the contact break times of the relay 310 with a counter or other timing device. The control unit 312 may directly monitor the break time of the relay 310, or the control unit 312 may monitor the break time of the relay 310 by receiving information from the wire I/O interface 311. By monitoring the break time of the relay 310, the control unit 312 may detect a slow break time for the relay 310. For preventative maintenance purposes, the ASD 100 may alert a user of these slow breaking contacts so that the ASD 100 may be repaired or replaced. The user may be alerted in a number of ways by the ASD 100. One possible method for alerting a user is to activate an LED on the exterior of the ASD 100 that will alert the user to the potential main relay contact problems. Another method for alerting the user is to transmit a communication from the ASD 100 to either another ASD 100, a central hub or control panel, or some other device, as will be explained in greater detail below with reference to FIGS. 19-20.

According to another aspect of the invention, the ASD 100 may include a control unit 312. The control unit 312 may control the various safety components of the ASD 100. Alternatively, each individual safety component of the ASD 100 may include its own control unit or various components of the ASD 100 may share control units. The control unit 312 may contain one or more microcontrollers and associated components such as resistors, diodes, capacitors, and crystals or, alternatively, the control unit 312 may be any other suitable device and associated circuitry for controlling an electronic circuit including, but not limited to, microprocessors, one or more programmable logic arrays, a state machine, a minicomputer, or a general purpose computer along with any associated firmware and software. The execution of programmable logic and/or software components by one or more processors of the control unit 312 may form a special purpose machine or a particular machine that is operable to monitor the wire 102 and/or control the electrification of the wire 102. As desired, many different types of control units may be incorporated into, associated with, or in communication with the ASD 100. Additionally, a control unit may include any number of processors. A control unit may also be external to and/or located remotely to the ASD 100, and the control unit may communicate with the components of the ASD 100 via a suitable network connection, for example, a wired network connection or a wireless network connection.

According to an aspect of the invention, the control unit 312 may be configured to or operable to store various types of data associated with the operation of the ASD 100. The data may include data associated with the operation of the various safety components of the ASD 100. Additionally, the data may include measurements data that has been taken while monitoring the wire 102 in accordance with the operation of the various safety components of the ASD 100. The data may also include one or more counters associated with the operation of the ASD 100 and the various safety components of the ASD 100. For example, the data may include a number of counters that the ASD 100 and/or the various safety components of the ASD 100 has recognized a miswire or wire fault on wire that is monitored by the ASD 100. The stored data may be utilized during subsequent operations of the ASD 100. For example, data stored in associated with the operation of a safety component of the ASD 100 may later be utilized in association with the operation of the safety component of the ASD 100 and/or in association with the operation of other safety components (or the control unit 312) of the ASD 100. A wide variety of data may be stored by the ASD 100 or by one or more memory devices associated with the ASD 100 as desired in various embodiments. The data items that may be stored by the ASD 100 include, but are not limited to those listed in Table 1 below:

TABLE 1

Data Items that may be Stored

| Data Item | Type | Initial Value |
|---|---|---|
| Hot Relay Normal Actuations Count | counter | 0 |
| Hot Relay Normal Actuations limit for end of life | limit | 75000 |
| Hot Relay High Current Actuations Count | counter | 0 |
| Hot Relay High Current Actuations Limit for end of life | limit | 5 |
| Fatal non-resetable (internal) Fault Code | code | 0 |
| Non-fatal Limited Resetable Fault Count | counter | 0 |
| Non-fatal Unlimited Resetable Fault Count | counter | 0 |
| Hot Relay Actuation Time | value | 0 |
| Hot Relay Release Time | value | 0 |
| Fault code #1 count | counter | 0 |
| Fault code #2 count | counter | 0 |
| Fault code #3 count | counter | 0 |
| Fault code #4 count | counter | 0 |
| Fault code #5 count | counter | 0 |
| Fault code #6 count | counter | 0 |
| Fault code #7 count | counter | 0 |
| Fault code #8 count | counter | 0 |
| Fault code #9 count | counter | 0 |
| Fault code #10 count | counter | 0 |
| Fault code #11 count | counter | 0 |
| Fault code #12 count | counter | 0 |
| Fault code #13 count | counter | 0 |
| Fault code #14 count | counter | 0 |
| Fault code #15 count | counter | 0 |
| Fault code #16 count | counter | 0 |
| Fault code #17 count | counter | 0 |
| Fault code #18 count | counter | 0 |
| Fault code #19 count | counter | 0 |

Other data items may be stored by the ASD 100 as desired in various embodiments of the invention. Additionally, in certain embodiments of the invention, the initial values of one or more of the data items may be different than those listed in Table 1. With reference to Table 1, the Hot Relay Normal Actuations Count may keep track of the number of times that the relay 310 is actuated during the normal course of the operation of the ASD 100; the Hot Relay Normal Actuations Limit may establish a limit for the normal actuations of the relay 310 during the lifetime of the ASD 100; the Hot Relay High Current Actuations Count may keep track of the number of times that the relay 310 is tripped as a result of a high current event, as explained in greater detail below with reference to FIG. 4A; the Hot Relay High Current Actuations Limit for end of Life parameter may establish a limit for the number of high current actuations of the relay 310 during the lifetime of the ASD 100, as explained in greater detail below with reference to FIG. 4A; the Fatal Non-Resetable Fault Code may establish a code to be stored for any identified Fatal Non-Resetable Faults; the Non-fatal Limited Resetable Fault Count may keep track of the number of Non-fatal Limited Resetable Faults that are identified; the Non-fatal Unlimited Resetable Fault Count may keep track of the number of Non-fatal Unlimited Resetable Faults that are identified; the Hot Relay Actuation Time Parameter may establish a value for the time that it takes to actuate the relay 100; the Hot Relay Release Time Parameter may establish a value for the time that it takes to release the relay 100; and the parameters for Fault Codes 1-19 Counts may keep track of the number of different types of faults that are identified by the ASD 100.

Many different types of faults may be identified as desired in various embodiments of the invention. Each fault may be associated with its own counter. Additionally, the tracking of faults in one or more memories and/or control units 312 associated with the ASD 100 may facilitate post mortem failure analysis and/or detections of abuse or misuse of an ASD 100. As one example, an ASD 100 may track the number of GFCI trips, overcurrent trips, self test failures, and/or other types of identified faults as desired. The tracking of these various types of faults may then be utilized in a determination of the reasons that a lifetime counter (as discussed below with reference to FIG. 4A) of the ASD 100 has been reached. Additionally and/or alternatively, the tracking of these various types of faults may be utilized in a determination of abuse or misuse of an ASD 100, such as overloading a circuit.

The ASD 100 may utilize one or more values and/or parameters stored in memory during the monitoring of a wire 102. The ability to store values and/or parameters in a memory of the ASD 100 may facilitate additional monitoring capabilities of the ASD 100. For example, the use of a memory may facilitate the continued monitoring of a wire 102 in which a fault has been identified in order to determine whether the fault is still present on the wire. In this regard, the ASD 100 may determine if and when a fault is no longer present on a monitored wire 102 and re-energize the wire 102 when the fault is no longer present.

As an example, an ASD 100 may be utilized to monitor an energized wire 102, such as a flat wire 105 or a conventional wire 107. If a fault is detected on the wire 102, then the relay 310 of the ASD 100 may be opened and the wire 102 may be de-energized. One or more flags may be set within the memory of the ASD 100 indicating that a fault has been detected on the wire 102 while the wire was energized. While the one or more flags are set, the ASD 100 may continually or periodically test the wire 102 in order to determine whether the fault is still present on the wire 102. For example, the ASD 100 may test the wire 102 every ten minutes or every hour (or at any other desired time interval) in order to determine whether the fault is still present on the wire 102. If, at any time, it is determined that the fault is no longer present on the wire 102, then the relay 310 of the ASD 100 may be closed, allowing the wire 102 to be re-energized.

The ability to automatically test a wire 102 in which a fault has been previously identified may allow electrical devices that are connected downstream from the wire 102 to receive power again after it has been determined that a fault is no longer present on the wire 102. Additionally, these downstream devices may receive power without any user actions being taken in association with the wire 102 and/or ASD 100. For example, a fault, such as a ground fault, may be identified in a wire 102 that supplies power to a refrigerator. It may later be determined that the fault is no longer present on the wire 102, and the wire 102 may be re-energized, thereby allowing the refrigerator to receive power again. The refrigerator may receive power again without any user interaction, such as a user resetting a conventional GFCI device.

Figure 4A:
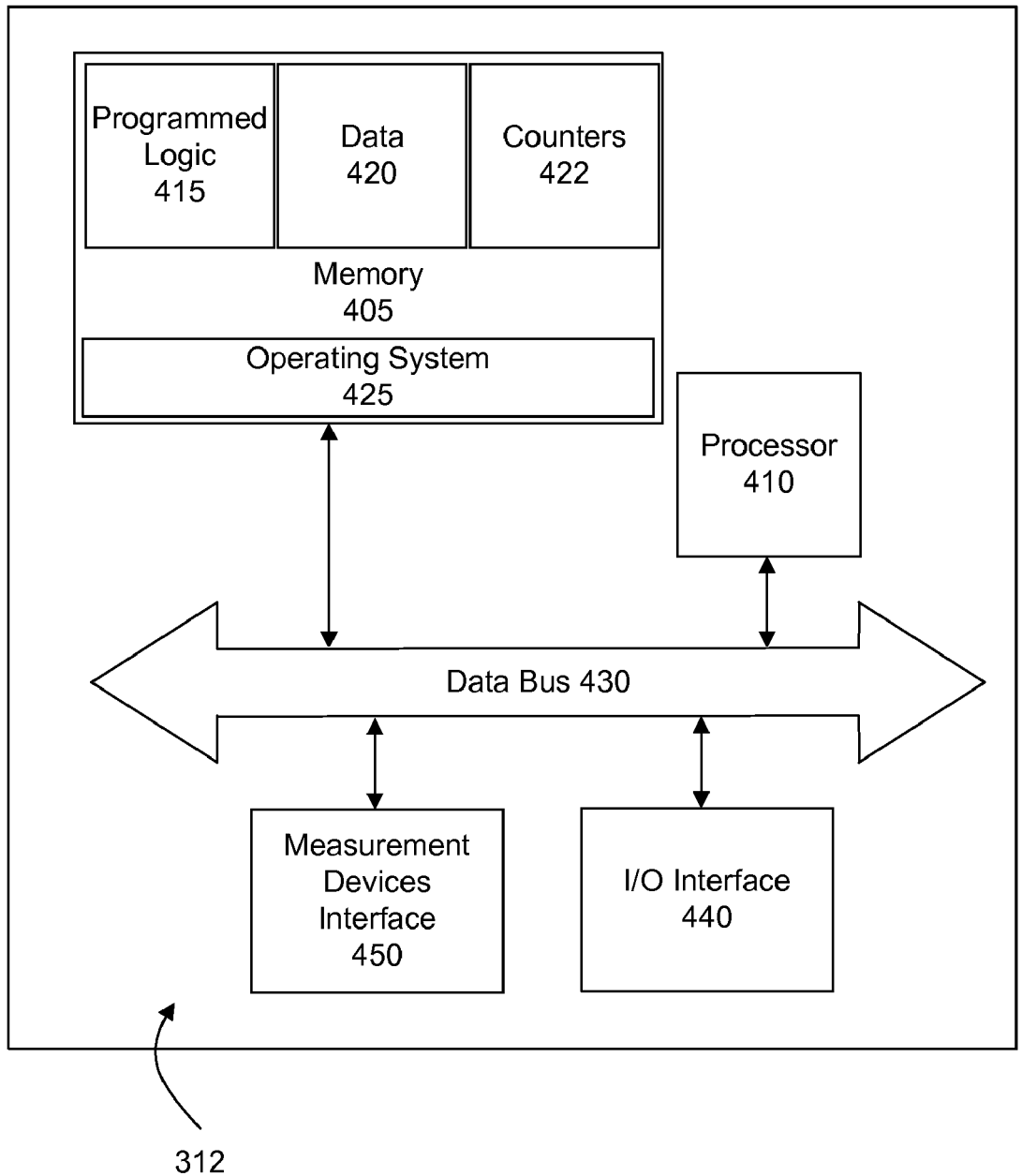
FIG. 4A is a block diagram of an example control unit that may be associated with an ASD according to certain embodiments of the invention.

FIG. 4A is a block diagram of one example of a control unit 312 that may be associated with an ASD 100 according to certain embodiments of the invention. The control unit 312 may include one or more suitable memory devices 405 and one or more processors 410. Any number of suitable memory devices 405 may be utilized as desired in embodiments of the invention, for example, caches, read only memories, random access memories, magnetic storage devices, etc. The memory devices 405 may store programmed logic 415 (e.g., software code) in accordance with various embodiments the invention. The memory devices 405 may also include measurements data 420 utilized in the operation of the invention, counters or states utilized in the operation of the invention 422, and an operating system 425. The one or more processors 410 may utilize the operating system 425 to execute the programmed logic 415, and in doing so, may also utilize the measurement data 420. The programmed logic 415 may include the logic associated with the operation of the one or more safety components of the ASD 100. Execution of the programmed logic 415 by the one or more processors 410 may form a special purpose computer or a particular machine that facilitates the control the ASD 100, the monitoring of a wire 102 connected to the ASD 100, and/or the electrification of the wire 102. A data bus 430 may provide communication between the memory devices 405 and the one or more processors 410. The control unit 312 may be in communication with the other components of the ASD 100 and perhaps other external devices, for example, lights, light emitting diodes (LED's), LED displays, other displays, speakers, keyboards, mouse devices, and other user interface devices, as well as data lines connected to other ASD's or electrical appliances, via an I/O Interface 440. Additionally, measurement devices configured to take various electrical measurements of the wire 102 may be in direct communication with the control unit 312 via a measurement devices interface 450 or, alternatively, may communicate with the control unit 312 via the I/O Interface 440. These measurement devices may be included in the wire I/O interface 311, as described in greater detail below. Further, the control unit 312 and the programmed logic 415 implemented thereby may comprise software, hardware, firmware or any combination thereof.

The control unit 312 may control and/or include the various safety components of the ASD 100. Additionally, the control unit 312 may store data relating to the status of the wire system 101. For example, the control unit 312 may maintain flags or states for each of the safety components of the ASD 100 in order to determine when to trip the relay 310 of the ASD 100 and to indicate, in the event of a miswire or fault detection, which safety component identified the wire 102 miswire or fault. The control unit 312 may also store measurements data 420 associated with the operation of the various safety components of the ASD 100. In addition, before the relay 310 of the ASD 100 is closed, allowing a wire 102 to be electrified, the control unit 312 may cause each safety component to test the wire 102 for miswire and/or wire faults. The control unit 312 may also be configured to take a control action when a miswire or wire fault in the wire 102 is detected. A control action may include, in addition to maintaining or forcing the relay 310 into its open position, an action that informs a user of the ASD 100 about the miswire or fault detection. For example, a visual indicator such as an LCD display or one or more LED's may be included in the ASD 100, and the display or LED's may be actuated in such a manner as to inform a user of the miswire or fault detection and the nature of the miswire or fault detected. As one example, the ASD 100 may include a single LED that is activated by the control unit 312 when a fault is detected to inform a user of the fault. As an alternative example, the ASD 100 may include an LED associated with each safety component of the ASD 100 and, when a miswire or fault is detected, the control unit 312 may activate the LED associated with the safety component that detected the miswire or fault. Another control action that may be taken by the control unit 312 is the transmission of a message indicating the detection of the miswire or fault. The control unit 312 may transmit the message to another ASD 100, to a central hub or control panel, or to another destination, as will be explained in greater detail below. Other indicators, such as audible alarms, may additionally or alternatively be utilized by the ASD 100 as desired in various embodiments of the invention. Indicators that may be used by the ASD 100 beneficially add to the overall safety of the ASD 100 by informing a user of a fault and potentially pinpointing the fault for the user.

The control unit 312 may also include one or more counters and/or timers 422. Counters and/or timers 422 associated with each safety component may be used by the control unit 312 to track the number of times a particular safety component has detected a miswire or wire fault in the wire 102. Additionally, a universal timer or counter may be used to track the number of times the ASD 100 has detected a miswire or wire fault in the wire system 101. Separate counters may also be utilized to track detected miswires and detected wire faults. These counters and/or timers 422 may be used to monitor the wire system 101, and may be used to generate states that indicate the current condition of the wire system 101. The counts and/or states may be used to perform preventive maintenance on the wire system 101. The storage capability of the counters and/or timers 422 may also be non-volatile, for example, in non-volatile memory, so that information including counts and states are not lost during a power outage or brown-out condition.

According to an aspect of the invention, the control unit 312 may additionally include at least one lifetime counter. In certain embodiments, the relay 310 may have a lifetime associated with it. In other words, the relay 310 may cease to operate properly after it has been actuated normally for a certain number of times or after it has been tripped several times as the result of a detected high current event. For normal actuations of the relay 310, the lifetime of the relay may be a relatively large value, for example, the value shown for the Hot Relay Normal Actuations Limit for End of Life parameter of Table 1. For the number of trips due to detected high current events, a predicted lifetime of the relay 310 may be similar to a mean trips to failure for the relay 310, for example, the value shown in the Hot Relay High Current Actuations Limit for end of Life parameter of Table 1. Different types of relays 310 that may be utilized by the ASD 100 may be associated with different lifetimes. A lifetime counter associated with a relay 310 may be configured to count down from or up to a predetermined threshold value. The threshold value may be a value that is less than or equal to the predicted lifetime of the relay 310. For example, if the predicted lifetime of the relay is 8-10 trips, then the threshold value may be established as 5 trips of the relay 310. Once the relay 310 has been tripped a number of times equal to the threshold value, the ASD 100 may deactivate the relay 310 and prevent the relay 310 from being closed by a user event, for example, a reset of the ASD 100. Utilizing the example of the relay 310 with a threshold value established as 5 trips, a user may reset an ASD 100 and the relay 310 following the first four trips of the relay 310; however, once the relay 310 has tripped for the fifth time, a user will not be permitted to reset the ASD 100 and the relay 310. In such a situation, the user may be required to return or send the ASD 100 to a retailer, distributor, manufacturer, or repair center associated with the ASD 100 in order to have the relay 310 and/or the ASD 100 tested, updated, and/or replaced. The lifetime counter may prevent a situation in which the ASD 100 and the relay 310 is reset, but the relay 310 is not capable of tripping when a miswire or wire fault is detected by the ASD 100.

According to an aspect of the invention, each of the one or more lifetime counters of the ASD 100 may be associated with specific types of errors detected by the ASD 100. For example, the lifetime counter may be associated with errors that lead to a tripping of the relay 310 due to a high current event, thereby causing an electrified wire 102 to be de-energized. In certain embodiments, not all errors detected or detectable by the ASD 100 will lead to a tripping of the relay 310 as a result of a high current event. For example, an error detected prior to the electrification of the wire 102 may not lead to a tripping of the relay 310. According to an aspect of the invention, there are three different types of exceptions or alarms that may be recognized by the ASD 100. The first type of alarm is a fatal non-resetable alarm, which may be recognized if a failure of any of the internal circuitry of the ASD 100 is detected. For example, a fatal non-resetable alarm may be recognized if a stuck relay is identified, if a fuse incorporated into the ASD 100 is blown, if a detected signal is outside of a detectable range, if a failure of self-test circuitry associated with the ASD 100 is detected, and/or if a lifetime counter has exceeded or reached a threshold value. The second type of alarm is a non-fatal limited resetable alarm, which may be an alarm that is associated with a high current event on the wire 102. For example, a non-fatal limited resetable alarm may be recognized if a wire fault is detected on an electrified wire 102. The third type of alarm may be a non-fatal unlimited resetable alarm, which may be associated with a non-fatal alarm that does not involve a high current event. In certain embodiments, the ASD 100 may allow an unlimited number of the third type of alarm to occur; however, as desired, a limit may be associated with this type of alarm. An ASD 100 in accordance with embodiments of the invention may recognize many different types of alarms and that those alarms described herein are merely examples of various types of alarms and should not be construed as limiting.

Figure 4B:
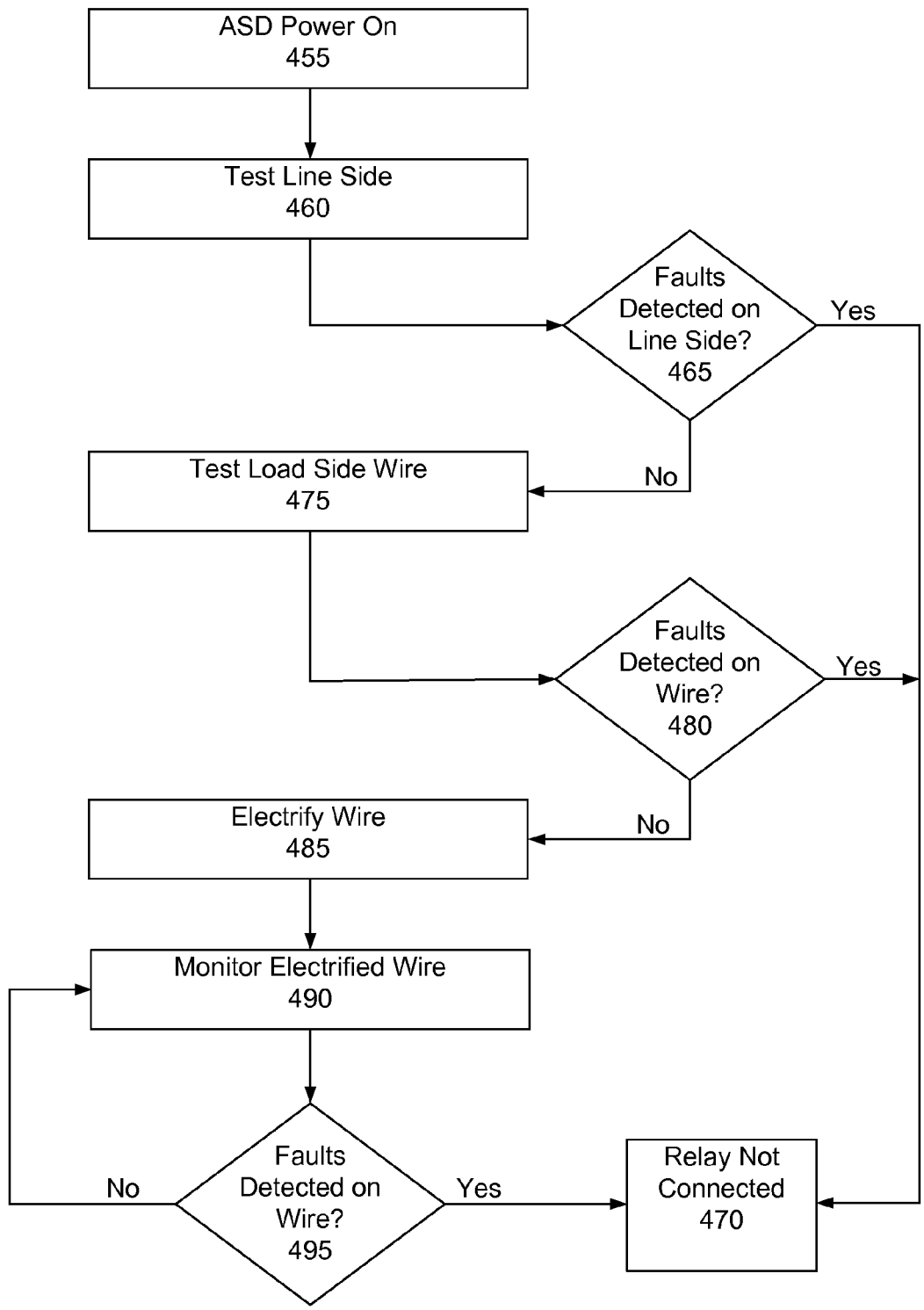
FIG. 4B is a flowchart of one example of the operation of the control unit of FIG. 4A, according to an illustrative embodiment of the invention.

FIG. 4B is a flowchart of one example of the general operation of the ASD 100 of FIG. 3 and the control unit 312 of FIG. 4A, according to an illustrative embodiment of the invention. The operations described in FIG. 4B may include the operations that are performed to monitor a wire 102 by the ASD 100. At block 455, power may be applied to the ASD 100, and the ASD 100 may commence operation at block 460. At block 460, the ASD 100 may test the line side 115 for miswires. If a line side miswire is detected at block 465, then the ASD 100 may go to block 470 and prevent the relay 310 from being closed, thereby preventing the electrification of the wire 102. If, at block 465, no line side miswires are detected by the ASD 100, then the ASD 100 may go to block 475 and test the load side wire 102 and/or any other wires or devices connected on the load side for miswires and/or wire faults. If, at block 480, a miswire or wire fault is detected on the wire 102, then the ASD 100 may go to block 470 and prevent the relay 310 from being closed, thereby preventing the electrification of the wire 102. If, however, at block 480, no miswires and/or wire faults are detected on the wire 102, then the ASD 100 may go to step 485. At lock 485, the relay 310 of the ASD 100 may be closed, and the wire 102 may be electrified. During the electrification of the wire 102 and/or after the wire 102 has been electrified, the ASD 100 may monitor the wire 102 and/or any other wires or devices connected on the load side for wire faults at block 490. If a fault is detected on the wire 102 or on the load side at block 495, then the ASD 100 may go to block 470 and open the relay 310, thereby causing the wire 102 to be de-electrified or de-energized. If, however, no wire faults are detected on the wire 102 or on the load side at block 495, then the ASD 100 may go to block 490 and continue monitoring the wire 102.

The method depicted in FIG. 4B may be applicable to the monitoring of any type of wire, including electrical flat wire and/or conventional wire. Additionally, the tests performed by the control unit 312 do not necessarily have to be performed in the order set forth in the logic of FIG. 4B, but instead may be performed in any suitable order. Additionally, the control unit 312 does not have to conduct each test set forth in FIG. 4B, but instead may conduct less than all of the tests set forth in FIG. 4B. Additionally, if a miswire or wire fault is detected by the control unit 312 or by a safety component in communication with the control unit 312, then an indicator may be stored by the control unit 312 or the associated safety component, and the indicator may include information as to which test(s) resulted in the detection of the miswire or wire fault. This indicator may then be transmitted by the ASD 100 to another device such as a second ASD 100, a central monitoring device, or a computer.

As mentioned earlier, the ASD 100 may include both reactive and/or proactive safety components. A reactive safety component of the ASD 100 may detect a wire fault in the wire 102 after the wire 102 has been fully electrified. A reactive safety component may also detect a wire fault during the full electrification of the wire 102 or during the time period that it takes to fully electrify the wire 102 after a full electrification signal is allowed to flow onto the wire 102. In other words, a reactive safety component may detect wire faults while a voltage in the range of approximately 90 to 130 VAC (for a standard 120 VAC power system, such as a North American power system) or a voltage in the range of approximately 220 to 250 VAC (for a standard 240 VAC power system, such as a European power system) is present on the electrical wire 102. Each country or region may have differing voltage or current standards that may be taken into account in the design and implementation of the ASD 100. Additionally, in certain embodiments of the invention, one or more reactive tests may be conducted constantly following the electrification of the wire 102. Alternatively, one or more reactive tests may be conducted periodically following the electrification of the wire 102.

A proactive safety component of the ASD 100 may detect a wire fault prior to full power electrification of the wire 102. In other words, a proactive safety component may perform checks or tests on the electrical wire 102, for example, checks or tests that involve the communication of voltage or current test signals onto the wire 102, prior to allowing full electrification of the wire 102.

Reactive safety components of the ASD 100 may include one or more of a ground fault circuit interrupter (GFCI) 315, an arc mitigation circuit (AMC) and/or an arc fault circuit interrupter (AFCI) 320, an over-current protection component 325, and a ground current monitoring component 330. Proactive safety components of the ASD 100 may include one or more of a line side wire integrity component 335 and a load side wire integrity component 340. Each of these safety components is discussed in greater detail below.

The reactive and proactive safety components of the ASD 100 may utilize various electrical measurements associated with line side and/or load side conventional wiring, such as wire 107, as well as line side and/or load side flat wire, such as flat wire 105, that is connected to the line side input 305 of the ASD 100 and to the source module 110 in determining whether or not a miswire condition or wire fault exists on either side of the ASD 100. The ASD 100 may utilize the various measurements to detect miswires on the line side of the ASD 100 and to detect miswires and/or wire faults on the wire 102 that is connected on the load side of the ASD 100. The ASD 100 may include a wire I/O interface 311 that is capable of taking electrical measurements associated with the various conductors of the wire 102 connected to the ASD 100. Alternatively, these electrical measurements may be taken by the various components of the ASD 100.

For example, either the wire I/O interface 311 and/or the components of the ASD 100 may measure the voltage, current, impedance, resistance or any other electrical characteristic associated with the wire 102. For example, either the wire I/O interface 311 or the components of the ASD 100 may measure the current present on any of the conductors of a wire 102 with any number of suitable current measuring devices, such as a current transformer. As another example, the wire I/O interface 311 or the components of the ASD 100 may measure the voltages present on any of the conductors of a wire 102 with any number of suitable voltage measuring devices, such as a signal conditioning circuit or a volt meter. Each component of the ASD 100 may include measurement devices associated with that component or, alternatively, one component of the ASD 100 may make use of a measurement device used by another component of the ASD 100. As desired in certain embodiments, the ASD 100 may include a single set of measurement devices in the wire I/O interface 311 that are used by all of the components of the ASD 100, as shown in FIG. 3. Additionally, the wire I/O interface 311 may be adapted to the type of wire 102 that is connected on the load side of the ASD 100, such as flat wire 105 or conventional wire 107. Alternatively, the wire I/O interface 311 may facilitate the taking of electrical measurements from a wide variety of different types of wiring that may be connected to the ASD 100.

Additionally, the wire I/O interface 311 or the components of the ASD 100 may include excitation circuitry or devices that are capable of communicating a signal onto one or more of the conductors of the wire 102. Excitation circuits or devices may be capable of communicating a current signal onto one or more of the conductors of the wire 102. For example, excitation circuits or devices may be capable of communicating a current signal onto one or more conductors or layers of a flat wire, such as flat wire 105 or onto one or more conductors of a conventional wire, such as wire 107. Suitable excitation circuits or devices for communicating a current signal onto one or more of the conductors of the wire 102 include, but are not limited to, current transformers, current sources, isolators, multiplexers, and relays. As an alternative to, or in addition to transmitting a current signal onto the wire 102, excitation circuits or devices may be capable of transmitting a voltage signal onto one or more conductors of the wire 102. For example, excitation circuits or devices may be capable of communicating a voltage signal onto one or more conductors or layers of a flat wire, such as flat wire 105 or onto one or more conductors of a conventional wire, such as wire 107. Suitable excitation circuits or devices for transmitting a voltage signal onto one or more conductors of the wire 102 include, but are not limited to, voltage transformers, multiplexers, drivers, and voltage sources. Each component of the ASD 100 may include excitation circuit devices associated with that component or, alternatively, one component of the ASD 100 may make use of an excitation device used by another component of the ASD 100. The ASD 100 may also include a single set of excitation circuits or devices in the wire I/O interface 311 that are used by all of the components of the ASD 100, as shown in FIG. 3. As explained in greater detail below, the excitation devices may be used in conjunction with the measurement devices to perform tests on the wire 102.

The reactive and proactive safety components of the ASD 100 may operate independently of one another, or, alternatively, their operation may be controlled by the control unit 312. In the illustrative embodiment of FIG. 3 with a single set of measurement devices contained within a wire I/O interface 311, the individual safety components may receive electrical measurements from the wire I/O interface 311 or, alternatively, the individual safety components may receive electrical measurements from the wire I/O interface 311 through the control unit 312 or through another safety component. Additionally, one or more of the various safety components of the ASD 100 may share one or more circuit components.

According to an aspect of the invention, a ground fault circuit interrupter (GFCI) safety component 315 may be associated with the ASD 100, which will be referred to herein as a GFCI component 315. The GFCI component 315 may detect ground faults in a wire 102 that is monitored. A ground fault is an unintentional electric path which diverts current to ground. The GFCI component 315 may detect ground faults on a variety of different types of wiring that may be connected on the load side of the ASD 100, such as conventional wiring or flat wiring.

According to certain embodiments of the invention, the GFCI safety component 315 may be specially designed to account for the fact that it is being used in conjunction with flat wire, such as flat wire 105, as discussed below. As previously mentioned, in connection with FIG. 2A, a flat wire 105 will typically have one electrifiable or hot conductor 205 and may have one or more return or neutral conductors 210, 215. The GFCI component 315 may monitor the current differential between the electrifiable conductor 205 and the one or more return conductors 210, 215 of the flat wire 105. If the current flowing through the electrifiable conductor 205 differs from the combined current flowing through any of the one or more return conductors 210, 215 by more than a predetermined threshold amount, then the GFCI component 315 may cause the ASD 100 to open a relay 310, thereby preventing the further flow of electrical power onto the flat wire 105. For example, the GFCI component 315 may cause the ASD 100 to open the relay 310 if the current differential between the electrifiable conductor 205 and the combined current in any of the one or more return conductors 210, 215 (or H-N) is approximately 5.5 milliamps or greater. The GFCI component 315 may be set to open the relay 310 of the ASD 100 based on any number or measured current differentials.

According to certain embodiments of the invention, the GFCI safety component 315 may be designed to account for the construction of conventional wiring, such as wire 107, that may be connected on the load side of the ASD 100. The GFCI component 315 may monitor the current differential between the electrifiable conductor 250 and the return conductor 255 of the conventional wire 107. If the current flowing through the electrifiable conductor 250 differs from the current flowing through the return conductor 255 by more than a predetermined threshold amount, then the GFCI component 315 may cause the ASD 100 to open a relay 310.

Additionally, the trip time of the GFCI component 315, or the time it takes the GFCI component 315 to open a relay 310, may vary with the current differential detected by the GFCI component 315. For example, a slower trip time may be associated with a smaller current differential, and a faster trip time may be associated with a higher current differential. The trip time of the GFCI component 315 may be a linear function of the current differential detected by the GFCI component 315. Alternatively, the trip time of the GFCI component 315 may be a non-linear function of the current differential detected by the GFCI component 315, such as that defined by UL943, a standard established by Underwriters Laboratories, Inc. (UL).

According to another aspect of the invention, an arc mitigation circuit (AMC) safety component and/or arc fault circuit interrupter (AFCI) safety component 320 may be associated with the ASD 100. As used herein, the term arc mitigation circuit safety component may refer to a safety component that is designed to identify or detect arcing conditions and/or arc faults that are present on a monitored flat wire. As used herein, the term arc fault circuit interrupter safety component may refer to a safety component that is designed to identify arc faults that are present on other types of wiring monitored by the ASD 100, such as conventional wiring. The AMC safety component and/or the AFCI safety component may include software components, firmware components, special purpose circuits, application specific circuits, and/or other circuitry as desired in various embodiments of the invention.

According to certain embodiments of the invention, an arc mitigation circuit (AMC) safety component 320 may be associated with the ASD 100, which will be referred to herein as an AMC component 320. The AMC component 320 may detect an arcing condition that is present on a flat wire, such as flat wire 105. An arcing condition may include a high power discharge of electrical energy between two or more conductors. The arcing condition does not necessarily need to exceed the normal maximum load limits of a component of the wire system 101. The normal maximum load limit of a standard electrical outlet, for example, is 120 volts at 15 amps, or 1800 watts. The electrical energy discharged by an arcing condition may or may not exceed 1800 watts. For conventional wiring, there is a wide array of arc fault current signatures, but the signatures are typically characterized by spikes of current near the voltage peaks of an electrical signal as opposed to a sinusoidal signature. Arc faults or arcing faults on conventional wire are one of the major causes of fires attributed to home electrical wiring as normal circuit breakers do not reliably detect and trip on arc faults. When unwanted arcing occurs, it may generate high localized or spot temperatures that can ignite nearby combustibles such as wood, paper and carpets.

An arcing condition on a flat wire 105 may be very different than an arcing condition on a conventional wire. An arcing condition on a flat wire 105 may be, under certain conditions, a short duration flash which may be referred to as an arc flash. Other types of arc faults and/or arcing conditions may also be present on a flat wire 105, and the ASD 100 may monitor the flat wire 105 for these other types of arc faults and/or arcing conditions. A typical flash, if not eliminated, may last from the time that electrification of the flat wire 105 is initiated until the time that a wire fault is identified and the relay 310 is opened. The over-current protection component 325 and the ground current monitoring component 330 may be the primary safety components that are responsible for removing power to the flat wire 105 due to a penetration or other type of wire fault resulting in abnormally high RMS currents. In the case of arcing events that result from ohmic or higher resistance "shorts," there may be an associated arc signature current that has a high peak-to-peak value, but an RMS value that does not exceed the standard current limit of 15 amps RMS. Because standard arc faults are relatively slow phenomena, requiring several alternating current cycles to detect and respond to, they are different than the arc flashes that may occur on a flat wire 105. The AMC component 320, AFCI component, and/or the other safety components of the ASD 100 may be designed to work in combination or as a system to mitigate arc flash and/or arc fault events identified on a monitored wire 102.

There are typically two types of arc flash and/or arc fault events that may occur on a monitored wire 102. The first type is possible during a live (electrified) penetration of the wire 102 by a penetrating object whereby, under certain circumstances, a blow-by or escape of hot gases or particulate matter may occur around the perimeter of the penetrating object. The second type of arc flash or arc fault event is possible after a penetrating object has been removed from the wire 102. If the wire 102 is electrified again, an arc flash or arc fault may occur prior to other safety components of the ASD 100 identifying a wire fault. From the time that the wire 102 is electrified until the ASD 100 or other safety device reacts to de-energize the wire 102 once again, an arc flash or arc fault is possible whereby hot gases and particulate matter are expelled from the orifice left by the removed object.

The AMC or AFCI component 320 may be designed to reduce the amount of energy and temperature of the expelled gases and particulate matter in the aforementioned types of arc flash and/or arc fault events. For example, a current level and/or signature analysis may be monitored during the arc flash or arc fault events. In certain embodiments, such as embodiments using flat wire 105, the construction and materials used in the flat wire 105 itself may also have mitigating effect on arc flash events. The flat wire 105 may contains individual layers of insulated conductors which can be further bonded to form an essentially inseparable set of strata. This bonding technique tends to mitigate the arc flash events by enforcing lower impedance interlayer shorts. Accordingly, the safety components of the ASD 100 may be capable of more easily detecting these events. Additionally, the load side wire integrity component discussed below with reference to FIG. 12 may allow potential arcing conditions to be more easily recognized.

For arc current level and/or signature detection of an arc flash or fault, the AMC or AFCI component 320 may be operable to sense the current waveform on the electrifiable conductor 205 or 250 via a suitable current detection device, for example, a current transformer. The AMC or AFCI component 320 may analyze the rate of change of the current, the peak current, the current level, and/or the phasing of the peak current in order to make a decision on the presence of an arcing event.

As with the GFCI component 315, the AMC component 320 may be designed to take the physical characteristics of flat wire 105 into account, as discussed below. The AMC component 320 may detect specific arcing conditions which may occur on the flat wire 105 that may be hazardous. The AMC component 320 may discriminate between unwanted arcing conditions and normal arcing conditions. A normal arcing condition may be the switching on or off of a circuit or unplugging a device from an electrical outlet. An unwanted arcing condition may be present on the flat wire 105 if there is a penetration, puncture, or flaw in the insulation layers 230 between the electrifiable conductor 205 and one of the other conductors of the flat wire 105. If multiple layers of insulation are present between two conductors of the flat wire 105, such as to envelope each conductor separately, an arc flash may occur if each layer of insulation has a flaw (e.g., hole) and the flaws are situated in close proximity to one another. In other words, an arc flash may occur if the insulation layer flaws line up with one another or are in close proximity to one another. An arc flash condition may also occur if the flat wire 105 is penetrated by a foreign object and the penetrating object is removed from the flat wire 105. A situation might exist in which the conductors are no longer shorted together once the foreign object has been removed, and an arc flash might occur if the flat wire 105 is electrified.

The AMC component 320 uses current sensing circuitry to discriminate between normal and unwanted arcing conditions within the flat wire 105. The AMC component 320 may detect specific arc flash current signatures which are unique to flat wire 105. These flat wire 105 arc flash current signatures are often different than the arc fault current signatures of conventional wire. Additionally, the AMC component 320 may be configured to detect arcing conditions originating at a point in a wire that is beyond the flat wire 105 termination at the destination module 120, including arc flashes in another flat wire 105 or arc faults in a conventional wire that is external to the flat electrical wire system 101. Once an unwanted arcing condition is detected in the flat wire 105 or any down-line load, a relay 310 is opened to de-energize the flat wire 105, thus reducing the potential of a fire or other hazardous situation occurring.

A flat wire 105 arc flash signature may differ from the arc fault signature of other forms of electrical wire due to the physical construction of the flat wire 105 that includes stacked conductive layers in close proximity to one another. Once an arc flash condition begins in the flat wire 105, typically at the initial point of penetration or damage to the flat wire 105, high temperature droplets of copper and carbonized debris may be ejected away from the penetration sight. Although most of the copper and debris are ejected out of the damaged site orifice of the flat wire 105, some may proceed transversely into the flat wire 105, thus increasing the radius of the damaged area. If this phenomena proceeds unchecked, it may build or avalanche into larger areas with unique current signatures specific to the flat wire 105.

A potentially dangerous situation that may lead to an arc flash on the flat wire 105, for example, a wire fault on the flat wire 105, may be detected by one or more of the other safety components of the ASD 100, as explained in greater detail below. Accordingly, potentially dangerous situations that may lead to an arc flash may be detected prior to the formation of an arc flash on the flat wire 105.

According to certain embodiments of the invention, an arc fault circuit interrupter (AFCI) safety component 320 may be associated with the ASD 100, which will be referred to herein as an AFCI component 320. An AFCI component 320 may detect arc faults on wiring, such as conventional wire 107, that is connected on the load side of the ASD 100. The AFCI component 320 may detect the current and voltage character-istics of arcing faults on conventional wire 107 and may open the relay 310 if an arc fault is detected. A wide array of different arc fault current signatures may be detected in accordance with embodiments of the invention utilized to monitor conventional wire. These arc faults may typically be characterized by spikes of current near the voltage peaks of an electrical signal as opposed to a sinusoidal signature.

According to another aspect of the invention, an over-current protection safety component 325 may be associated with the ASD 100, which will be referred to herein as an over-current protection component 325. The over-current protection component 325 may provide primary and/or secondary over-current protection. If too much current is allowed to flow through a wire, such as wire 102, the wire may over-heat and there is a potential that a fire could be started in nearby combustibles such as wood, paper and carpets. The over-current protection component 325 may provide secondary over-current protection in addition to that provided by a standard circuit breaker. Typically, circuit breakers are rated with a maximum current that they can effectively handle in order to trip properly, and a circuit breaker may be ineffective if the current flowing through a circuit (which may be created by a short) is higher than the maximum rated current of the circuit breaker. If such a situation arises, the over-current protection component 325 of the ASD 100 may provide secondary over-current protection. Alternatively, the over-current protection component 325 may provide primary over-current protection if there is no circuit breaker connected to or associated with the line side power supply 115 or if a connected circuit breaker is ineffective. For example, the over-current protection component 325 would provide primary over-current protection if a homeowner closed a circuit in the circuit breaker by placing a penny across the circuit.

The over-current protection component 325 of the ASD 100 may monitor the current flowing through the electrifiable conductor of a monitored wire 102, such as electrifiable conductor 205 of a flat wire 105 or electrifiable conductor 250 of a conventional wire 107. If the current flowing through the electrifiable conductor, such as 205 or 250, increases above a maximum threshold value, the relay 310 may be opened to de-energize the wire 102. As desired, the maximum threshold current value may be set at many different values. For instance, the over-current protection component 325 may cause the relay 310 to open if the current in the electrifiable conductor, such as 205 or 250, exceeds approximately 15 amps (for 120 VAC applications). An over-current protection component 325 may also examine the current flowing through any of the one or more return conductors of a monitored wire 102, such as return conductors 210, 215 of an electrical flat wire 105 or return conductor 255 of a conventional wire, in a similar manner to the way in which the electrifiable conductor, such as 205 or 250, is monitored.

The over-current protection component 325 may utilize a variable scale algorithm in its monitoring of the current in the electrifiable conductor, such as 205 or 250. Based on the level or amount of over-current present on the electrifiable conductor, such as 205 or 250, the over-current protection component 325 may have a variable trip time, or time it takes to de-actuate or open the relay 310. For example, if the maximum allowable current on the electrifiable conductor, such as 205 or 250, is set at 15 amps and the over-current protection component 325 measures a current of approximately 15.1 amps on the electrifiable conductor 205, then the trip time of the over-current protection component 325 may be approximately one second. The trip time may or may not be adjusted for the next zero crossing condition. Alternatively, if a current of approximately 50 amps or more is detected on the electrifiable conductor, such as 205 or 250, then the trip time of the over-current protection component 325 may be approximately an immediate trip time (no added delay) or set for the next zero crossing condition. Having a longer trip time at lower over-current levels may serve to mitigate false tripping situations due to load inrush currents on the wire 102. Many different smart algorithms with a wide array of trip times may be utilized as desired in conjunction with the over-current protection component 325 of certain embodiments of the invention. Additionally, the trip time of the over-current protection component 325 may be a linear function of the amount of over-current detected by the over-current protection component 325. Alternatively, the trip time of the over-current protection component 325 may be a non-linear function of the amount of over-current detected by the over-current protection component 325.

According to yet another aspect of the invention, the ASD 100 may include a ground current monitoring safety component 330 to perform ground current monitoring, which will be referred to herein as a ground current monitoring component 330. The ground current monitoring component may be utilized as either a reactive component or in conjunction with the proactive components of the ASD 100. In the flat wire design utilized herein for purposes of disclosing certain embodiments of the invention, there should not be any significant current on a grounding conductor 220, 225 of any flat wire 105 connected to the ASD 100. If a significant current is present on a grounding conductor 220, 225 of the flat wire 105 connected to the ASD 100, a hazardous condition may exist. For example, there may be a short in the flat wire 105. Alternatively, a situation might exist in which electrical power is being supplied to a load and some of that electrical power is backfeeding across the flat wire 105 through, for example, one of the grounding conductors 220, 225, to the source module 110. Such a situation might arise if a faulty or malfunctioning appliance is being supplied power by the flat wire 105 or if an external source of power is miswired into the wire system 101 via the load side 125. In a similar manner, there should not be any significant current on a grounding conductor 260 of a conventional wire 107 connected to the ASD 100.

The ground current monitoring component 330 monitors the current flowing through one or more of the grounding conductors 220, 225 of a flat wire 105 connected to the ASD 100 and/or through the one or more grounding conductors of other types of wiring that may be connected to the ASD 100, such as the grounding conductor 260 of a conventional wire. If the current increases above a predetermined maximum threshold value, then the relay 310 may be opened to de-energize the flat wire 105. As desired, the maximum threshold current value may be set at many different values. For instance, the ground current monitoring component 330 may open the relay 310 if the current in any of the ground conductors exceeds approximately 3.0 milliamps.

According to an aspect of the invention, the ASD 100 may include a line side wire integrity (or miswire) safety component 335, also referred to herein as a Source Wire Integrity (SWI) component 335. The SWI component 335 may be a proactive safety device capable of detecting line side faults or defects in a wire system 101 prior to the full power electrification of the wire 102. Before the relay 310 of the ASD 100 is closed, thereby allowing the wire 102 to be electrified, the SWI component 335 may test the wire system 101 on the line side and determine whether the line side power source 115 has been properly terminated on the line side. For purposes of this disclosure, the term line side may refer to a power line that is input into the ASD 100. The line side may be a conventional wire, a flat wire, an electrical outlet, or another input to the ASD 100.

The SWI component 335 may detect line side miswiring of the line side power source 115, which may be conventional wiring or flat wire, via the line side input 305. The line side power source 115 may also be an electrical outlet that the ASD 100 is connected to or plugged into. It is a common mistake for an electrical outlet to be miswired, even by an experienced electrician. A line side miswire may include an open conductor of the line side power source 115, which may occur when a conductor of the line side power source 115 is not connected to the line side input 305 of the ASD 100. Alternatively, a line side miswire may occur when one or more conductors of the line side power source 115 are improperly connected to the line side input 305 of the ASD 100, such as when two conductors are reversed in their connection to the line side input 305. For example, if the line side power source 115 is a conventional electric wire, the SWI component 335 may detect a situation in which the line side electrifiable or hot conductor and the line side return or neutral conductor have been switched when connected to the line side input 305. As another example, if the line side power source 115 is an electrical flat wire 105, the SWI component 335 may detect a situation in which the line side electrifiable conductor 205 and one of the line side return conductors 210 have been switched when connected to the line side input 305.

Figure 5:
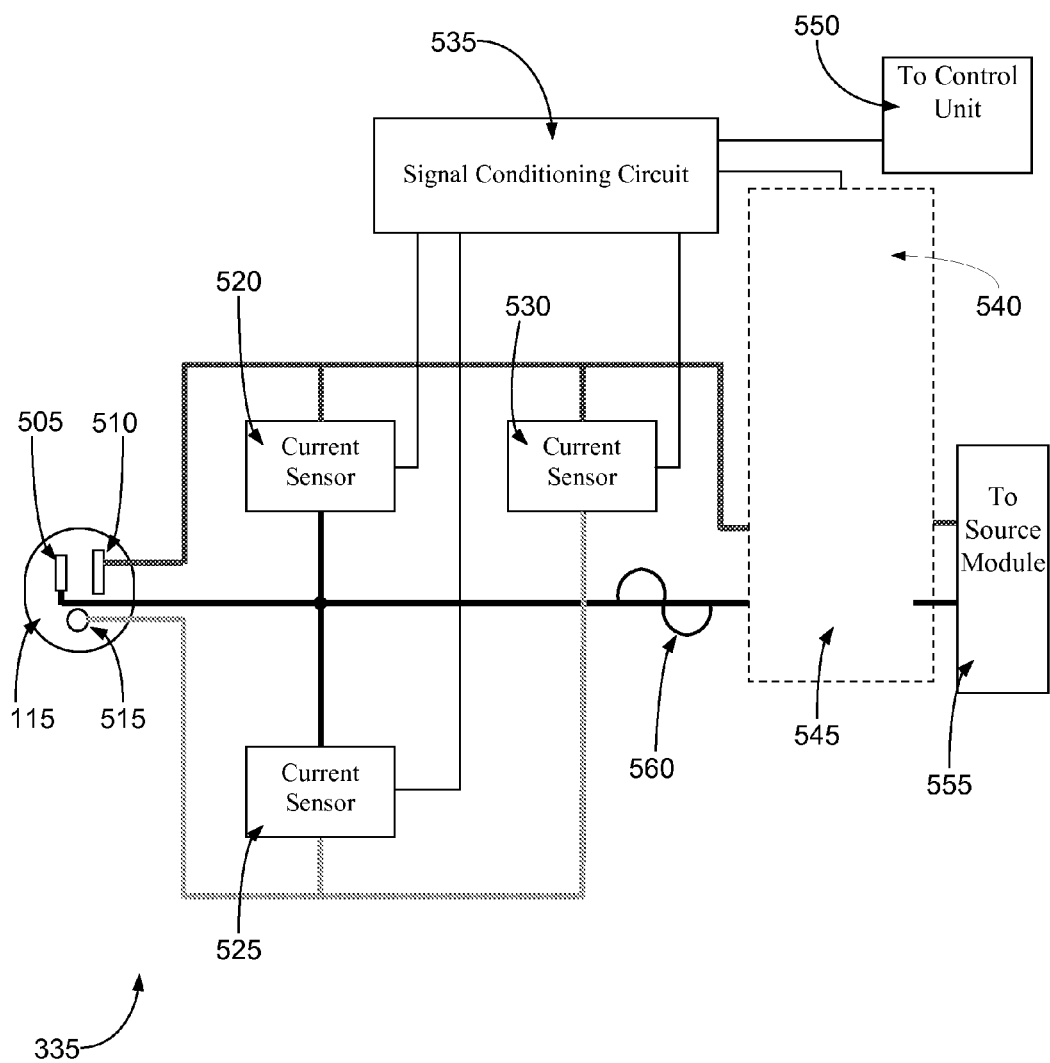
FIG. 5 is a schematic diagram of an example line side wire integrity component that may be incorporated into an ASD, according to an embodiment of the invention.

The SWI component 335 may contain line side miswire detection circuitry that uses one or more test signals to locate and detect miswire conditions. FIG. 5 is a schematic diagram of on example of a line side wire integrity component 335 that may be incorporated into an ASD 100 according to the invention. A line side power source 115 connected to the line side input 305 of the ASD 100 may include an electrifiable (or hot) conductor 505, a return (or neutral) conductor 510, and a grounding conductor 515. In certain embodiments, the line side input 305 may include more than three conductors. For example, if the line side input 305 is an electrical flat wire similar to the flat wire 105 illustrated in FIG. 2A, then the line side input 305 may include five conductors.

The SWI component 335 may include three current sensors 520, 525, 530 and a signal conditioning circuit 535. Any number of current sensors and/or signal conditioning circuits may be associated with the SWI component 335. The SWI component 335 may optionally include an SWI relay driver 540 and an SWI relay 545. The signal conditioning circuit 535 of the SWI component 335 may be in communication with the control unit 312 of the ASD 100 via a control unit communications link 550 or, alternatively, the signal conditioning circuit 535 may be incorporated into the control unit 312. The signal conditioning circuit 535, either on its own or in combination with the control unit 312, may allow a small test current to be transmitted from the line side power source 115 in order to determine whether any line side miswires are present.

The signal conditioning circuit 535 may be any appropriate signal conditioning circuit, and the signal conditioning circuit 535 may include any number of circuit components. The signal conditioning circuit 535 may operate to limit the value of the currents that are detected on the line side prior to communicating those values to the control unit 312 for analysis. Accordingly, the control unit 312 may receive a current measurement from each of the current sensors 520, 525, 530, and the control unit 312 may utilize these measurements to determine whether the line side is wired correctly. The signal conditioning circuit 535 may locate the electrifiable or hot conductor 505 of the line side power source 115, regardless of where it is connected to the line side input 305, and leak a small test current out of the electrifiable conductor 505. The test signal may be a voltage or current test signal, for example, a current test signal that is under approximately one milliamp. If there is no electrifiable conductor 505 connected to the line side input 305, then the SWI component 335 will be unable to locate the electrifiable conductor 505 to obtain a test signal. In such a situation, the signal conditioning circuit 535 of the SWI component 335 and/or the control unit 312 may determine that the electrifiable conductor 505 is open on the line side. If, however, an electrifiable conductor 505 is connected to the line side input 305, the signal conditioning circuit 535 may permit the test signal to leak out of the electrifiable conductor 505. The signal conditioning circuit 535 may then monitor the currents detected by the current sensors 520, 525, 530 to determine whether or not any line side miswires are present. A hot-neutral ("H-N") current sensor 520 may be used to detect a current between the electrifiable (or hot) conductor 505 and the return (or neutral) conductor 510. A hot-ground ("H-G") current sensor 525 may be used to detect a current between the electrifiable conductor 505 and the grounding conductor 515. A neutral-ground ("N-G") current sensor 520 may be used to detect a current between the return conductor 510 and the grounding conductor 515. In certain embodiments, a test current applied to a line side conductor may be limited by appropriate electrical standards and codes. For example, a test current applied to a grounding conductor of a line side power source 115 may be limited to an upper bound of approximately 0.5 milliamps by standards established by Underwriters Laboratory, Inc.

If the line side is wired correctly, a current between the electrifiable conductor 505 and the return conductor 510 will be detected by the H-N current sensor 520, a current between the electrifiable conductor 505 and the grounding conductor 515 will be detected by the H-G current sensor 525, and no current between the return conductor 510 and the grounding conductor 515 will be detected by the N-G current sensor 530. If there is a line side miswire, a different set of current measurements than those discussed above for a properly wired line side may be made by the current sensors 520, 525, 530, and the SWI component 335 may detect the miswire. In addition to an open electrifiable conductor 505, The SWI component 335 may detect other open conductors on the line side. For example, if the return conductor 510 is open on the line side, no current will be detected between the electrifiable conductor 505 and the return conductor 510 by the H-N current sensor 525. As another example, if the ground conductor 515 is open on the line side, no current will be detected between the electrifiable conductor 505 and the grounding conductor 515 by the H-G current sensor 525.

The SWI component 335 may also detect conductors that have been miswired or switched when connected to the line side input 305. For example, if the electrifiable conductor 505 and the return conductor 510 have been switched when connected to the line side input 305, the current detected by the H-N current sensor 520 will be reversed because the current will be flowing across the H-N current sensor 520 from the opposite direction. Additionally, no current will be detected by the H-G current sensor 525 and a current will be detected by the N-G current sensor 530. If the electrifiable conductor 505 and the grounding conductor 515 have been switched when connected to the line side input 305, the current detected by the H-G current sensor 525 will be reversed because the current will be flowing across the H-G current sensor 525 from the opposite direction. Additionally, no current will be detected by the H-N current sensor 520 and a current will be detected by the N-G current sensor 530. Any other miswire on the line side that produces a different set of currents across the current sensors 520, 525, 535 other than the set of currents representative of a properly wired line side may also be detected by the SWI component 335.

If the SWI component 335 detects a miswire on the line side, then the relay 310 of the ASD 100 may be maintained in its open position to prevent electrification of the wire 102. If no miswire is detected by the SWI component 335, then the relay 310 may be closed, to allow electrification of the wire 102. Alternatively, if the SWI component 335 detects a miswire on the line side, then the SWI relay 545 may be maintained in its open position to prevent the flow of electrical power from the line side input 305 to the source module 110 via a source module communications link 555. The source module communications link 555 may be any appropriate communication link, for example, a wired connection. If no miswire is detected by the SWI component 335, then the SWI relay driver 540 may be used to close the SWI relay 545 and allow electrical power to flow from the line side input 305 to the source module 110. The SWI component 335 may perform tests on the line side of the wire system 101 during a short time interval after power is applied to the line side power source 115. For example, the SWI component 335 may perform the tests on the line side of the wire system 101 in no more than approximately 500 milliseconds from the point in time at which power is applied to the line side power source 115. Additionally, a SWI component flag or state may be set in the ASD 100 to indicate that no miswires were detected by the SWI component 335. The SWI component flag may be, for example, stored in the memory 405 of the control unit 312 and/or in one or more other memories associated with the control unit 312 and/or the SWI component 335. The SWI component flag or state may be used by the ASD 100 in conjunction with the results of other tests performed by the ASD 100 in order to determine whether or not the relay 310 of the ASD 100 may be closed. Other data associated with the SWI component 335 and/or the measurements taken in accordance with the operation of the SWI component 335 may be stored in one or more appropriate memory devices, for example, the memory 405 of the control unit 312.

Although the SWI component 335 is described above as leaking a current signal from the electrifiable conductor 505 of the line side power source 115 and then testing the line side for current signals, as desired in various embodiments, other types of signals, such as a voltage signal may be leaked from the line side power source 115. Additionally, if a voltage signal is leaked from the line side power source 115, then the SWI component 335 may detect voltage signals on the line side in order to identify or locate line side miswires.

With continued reference to FIG. 5, the SWI component 335 may include at least one fuse 560 that is operable to act as a fail safe if too much current flows into the ASD 100 from the line side power source 115. Although the fuse 560 is illustrated in FIG. 5 as being a part of the SWI component 335, a fuse may alternatively or additionally be included in other components of the ASD 100. Additionally, as desired, many different types of fuses may be utilized by the ASD 100, for example, a standard 50 amp fuse. If a 50 amp fuse is utilized, the fuse 560 may be blown if a current of approximately 50 amps or more flows into the ASD 100 from the line side power source 115. Once the fuse 560 has been blown, an electrical power signal may no longer be permitted to flow into the ASD 100 from the line side power source 115.

Figure 6:
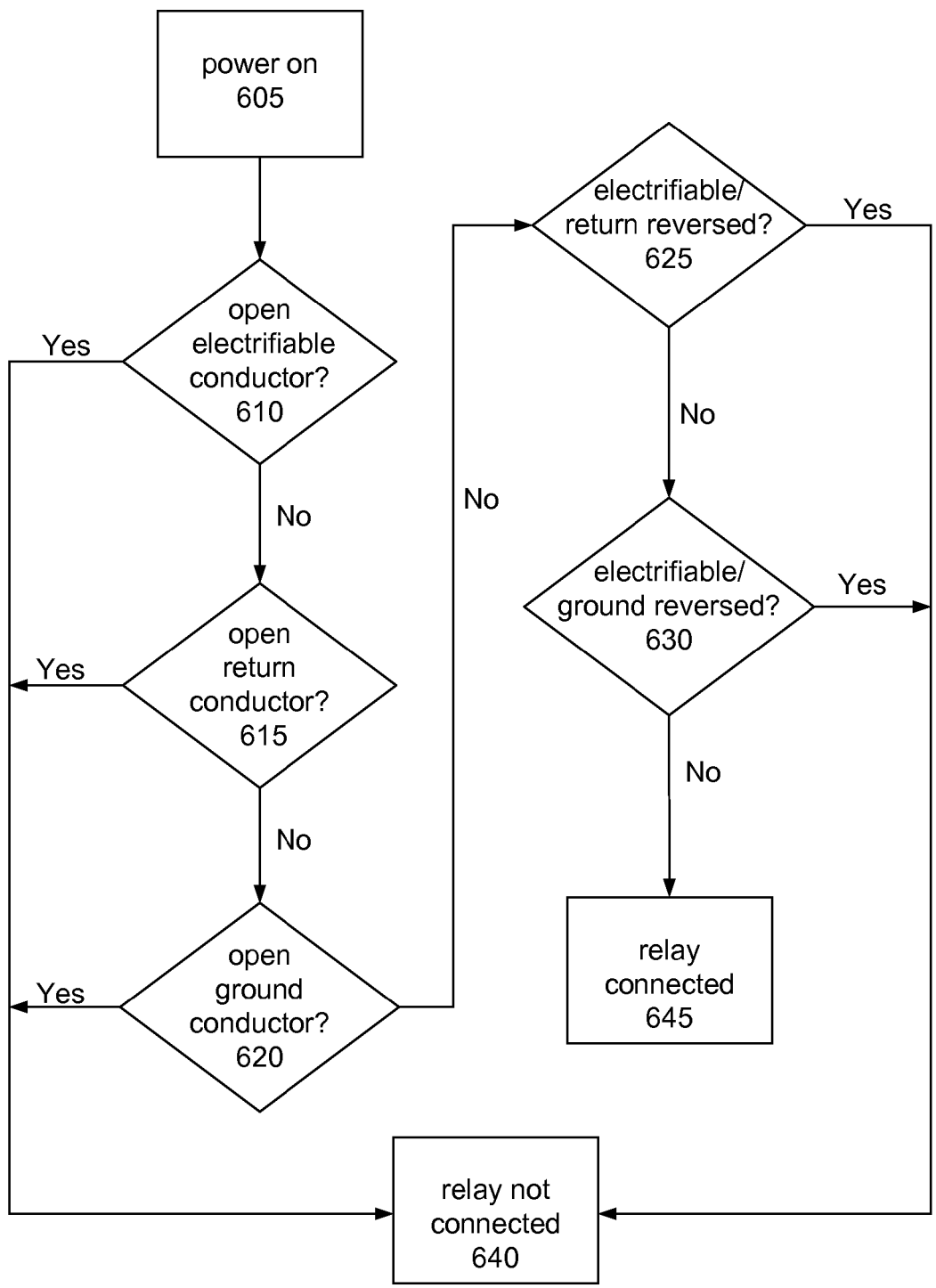
FIG. 6 is a flowchart of one example of the operation of a line side wire integrity component that may be incorporated into an ASD according to an embodiment of the invention.

FIG. 6 is a flowchart of one example of the operation of the SWI component 335, according to an illustrative embodiment of one aspect of the invention. If power is applied to the SWI component 335 at block 605, then the SWI component 335 may check a line side power source 115 connected to the line side input 305 for a line side miswire. For example, at block 610, the SWI component 335 may check the line side power source 115 for an open electrifiable (or hot) conductor 505. If an open electrifiable conductor 505 is detected, then the SWI component 335 may go to block 640 and prevent the electrification of the flat wire 105 by preventing the relay 310 of the ASD 100 from being closed. If an open line side power source electrifiable conductor 505 is not detected at block 610, then the SWI component 335 may go to block 615 and check the line side power source 115 for an open return (or neutral) conductor 510. If an open line side power source return conductor 510 is detected at block 615, then the SWI component 335 may go to block 640 and prevent the relay 310 of the ASD 100 from being closed. If no open line side power source return conductor 510 is detected at block 615, then the SWI component 335 may go to block 620 and check the line side power source 115 for an open grounding conductor 515. If an open line side power source grounding conductor 515 is detected at block 620, then the SWI component 335 may go to block 640 and prevent the relay 310 of the ASD 100 from being closed. If no open line side power source grounding conductor 515 is detected at block 620, then the SWI component 335 may go to block 625. At block 625, the SWI component 335 may check the line side power source 115 for a reversed electrifiable conductor 505 and return conductor 510. If the line side power source electrifiable conductor 505 has been reversed with the line side power source return conductor 510 at the line side input 305, then the SWI component 335 may go to block 640 and prevent the relay 310 of the ASD 100 from being closed. If, however, no reversed line side power source electrifiable conductor 505 and return conductor 510 is detected at block 625, then the SWI component 335 may go to block 630. At block 630, the SWI component 335 may check the line side power source 115 for a reversed electrifiable conductor 505 and grounding conductor 515. If the electrifiable conductor 505 has been reversed with the grounding conductor 515 at the line side input 305, then the SWI component 335 may go to block 640 and prevent the relay 310 of the ASD 100 from being closed. If, however, no line side power source reversed electrifiable conductor 505 and grounding conductor 515 is detected at block 630, then the SWI component 335 may go to block 645 and allow the relay 310 of the SWI component 335 to be closed.

The tests performed by the SWI component 335 do not necessarily have to be performed in the order set forth in the logic of FIG. 5, but instead may be performed in any suitable order. Additionally, in certain embodiments of the invention, the SWI component 335 does not have to conduct each test set forth in FIG. 5, but instead may conduct less than all of the tests set forth in FIG. 5. If any test results in the execution of block 540, then the SWI component 335 may still perform the remaining tests and may record the outcome of each test, or at least the ones that result in a positive miswire indication. Additionally, if a miswire is detected by the SWI component 335, an indicator may be stored by the SWI component 335 or by the control unit 312, and the indicator may include information as to which test(s) resulted in the detection of a miswire. This indicator may also be communicated by the ASD 100 to another device such as a second ASD 100, a central monitoring device, or a computer. The SWI component 335 and/or the control unit 312 may also be associated with one or more memory devices, for example, the memory 405 of the control unit 312, that are operable to store a variety of indicators and/or measurements data associated with the operation of the SWI component 335.

According to another aspect of the invention, the ASD 100 may include a load side or destination integrity (or load side miswire or short/fault detection) component 340, which will be referred to herein as a destination wire integrity (DWI) component 340. The DWI component 340 may be a proactive safety device capable of detecting faults or defects in the wire 102 or miswires on the load side prior to the full power electrification of the wire 102. For purposes of this disclosure, the term load side may be utilized to refer to a wire 102, such as a flat wire 105, conventional wire 107, or other wire connected between the ASD 100 and a downstream destination device 117 and/or a downstream ASD 100. Before the relay 310 of the ASD 100 is closed, thereby allowing the wire 102 to be electrified, the DWI component 340 may test the wire 102 on the load side and determine whether the wire 102 is free of faults, defects, and/or miswires. The DWI component 340 may test the wire 102 by applying either a voltage or a current test signal to one or more of the conductors of the wire 102 and measuring a response on the other conductors of the wire 102, as explained in greater detail below. The DWI component 340 may use one or both of a voltage-based test system and a current-based test system to check the wire 102 for miswires and wire faults, as described in greater detail below.

According to one aspect of the invention, the DWI component 340 may detect load side miswiring of the wire 102. A load side miswire may include an open conductor of the wire 102, which may occur when a conductor of the wire 102 is not connected to the destination module 120 or the source module 110. In addition, a load side miswire may include conductors of the wire 102 that are improperly connected to the destination module 120, for example, two conductors that are reversed in their connection to the destination module 120. For example, the DWI component 340 may detect a situation in which an electrifiable conductor, such as electrifiable conductor 205 of a flat wire 105, and one or more return conductors, such as return conductor 210 of a flat wire 105, have been switched when connected to the destination module 120. As another example, the DWI component 340 may detect a situation in which the electrifiable conductor 250 of a conventional wire 107 and the return conductor 255 of the conventional wire 107 have been switched when connected to the destination module 120. The DWI component 340 may detect miswires in both flat wiring and conventional wiring. If the DWI component 340 detects a miswire on the load side, then the relay 310 is maintained in its open position to prevent electrification of the wire 102.

According to another aspect of the invention, the ASD 100 may detect potentially hazardous conditions that may exist in association with a wire 102. Potentially hazardous conditions may be detected for many different types of wiring, such as flat wiring, conventional wiring, and/or wiring with concentric conductors. One hazardous situation of particular importance is the penetration of a flat wire, such as flat wire 105, that can lead to an inter-layer short in the flat wire 105. An inter-layer short occurs when a conductor in the flat wire 105 is placed in contact with one or more other conductors in the flat wire 105. Inter-layer shorts typically occur when an object, and particularly a metal object, penetrates the flat wire 105. Various types of penetrations of the flat wire 105 have been considered and analyzed. With respect to a flat wire 105 installed on a surface such as a wall or ceiling, typical penetration may be caused by nails, screws, push-pins, thumbtacks, staples, knife cuts, or saw cuts. Each type of penetration offers a different challenge to overcome fire and shock hazards. Penetrations may occur while the flat wire 105 is electrified or prior to its electrification. Penetrating objects may or may not be present during the initial electrification of a flat wire 105. In addition to inter-layer shorts, penetrations of the flat wire may lead to arc flashes or other arcing conditions which may be detected by the AMC safety component of the ASD 100. Potentially hazardous conditions may also be detected in conventional wire, such as wire 107. For example, the conventional wire 107 may be penetrated in a similar manner, leading to a short between two or more conductors of the conventional wire 107.

For flat wire 105, low impedance inter-layer shorts are typically needed in order to cause a primary safety device such as a circuit breaker to trip. These more desirable low impedance shorts, sometimes referred to as dead or good shorts, typically occur during the penetration of a flat wire 105 or after the penetration of a flat wire 105 when the penetrating object is still embedded in the flat wire 105. Once the penetrating object is removed from the flat wire 105, there may no longer be a penetrating metal object to provide a parallel path through which current can flow, thereby removing the good inter-layer short. Additionally, the penetrating object no longer adds a compressive force that serves to press the conductors of the flat wire 105 together. This lack of compressive force may contribute to the failure to maintain a good quality inter-layer short. After the removal of the penetrating object, therefore, the inter-layer shorts are typically not low impedance inter-layer shorts, which makes a successful trip of a primary safety device such as a circuit breaker less likely.

The DWI component 340 of the ASD 100 may aid in the detection of inter-layer shorts and/or other shorts, as explained in greater detail below. The DWI component 340 may be a proactive safety device capable of detecting faults or defects in a flat wire 105 or conventional wire 107 prior to the full power electrification of the flat wire 105 or conventional wire 107. Alternatively, as explained in greater detail below with reference to FIG. 11, the DWI component 340 may include a combination of proactive and reactive components. If a proactive device is utilized, then prior to the relay 310 being closed, the DWI component 340 checks for inter-layer shorts in the flat wire 105, which may have been caused by a penetration of the flat wire 105. Similarly, the DWI component 340 may check for shorts in a conventional wire 107 which may have been caused by a penetration of the conventional wire 107. The DWI component 340 may detect both low impedance shorts (e.g., dead or good shorts) and high impedance shorts in a wire 102. If a short is detected, then the DWI component 340 or the control unit 312 may open the relay 310 and prevent electrification of the wire 102. In a DWI component 340 that includes both proactive and reactive components, the DWI component 340 may detect shorts and/or wire faults (and miswires) by electrifying one or more conductors of the wire 102 and monitoring one or more of the conductors of the wire 102 for a return signal.

In both a voltage-based and current-based method of testing, the DWI component 340 may apply or communicate a test signal onto one or more conductors or layers of the wire 102 and test for a return signal on one or more of the other conductors or layers of the wire 102. If a flat wire, such as flat wire 105, is tested, then the two return conductors 210, 215 may form a return conductor loop and the two grounding conductors 220, 225 may form a grounding conductor loop. A loop may occur when a signal travels from the ASD 100 through the flat wire 105 via one conductor, to the destination module 120 and then back via another conductor of the flat wire 105 to the ASD 100. For example, a signal may travel through the flat wire 105 via a first return conductor 210, through the destination module 120, and back through the flat wire 105 via the second return conductor 215. The DWI component 340 may test the return conductor loop and the grounding conductor loop with independent test signals. Alternatively, the DWI component 340 may test the return conductor loop and the grounding conductor loop with a single test signal. If a single test signal is used to test the return and grounding conductor loops, alternating periods of the test signal may be used to test the return and grounding conductor loops independently. Additionally, if both the return and grounding conductor loops are determined to be properly terminated by the DWI component 340, the DWI component 340 may presume that the electrifiable conductor 205 of the flat wire 105 is properly terminated at the destination module 120. Alternatively, the DWI component 340 may perform additional tests on the electrifiable conductor 205 in order to determine whether or not the electrifiable conductor 205 is terminated properly. For example, the DWI component 340 may test the electrifiable conductor 205 to determine whether or not the electrifiable conductor 205 is shorted to one or more of the return conductors 210, 215 or the grounding conductors 220, 225.

Figure 7:
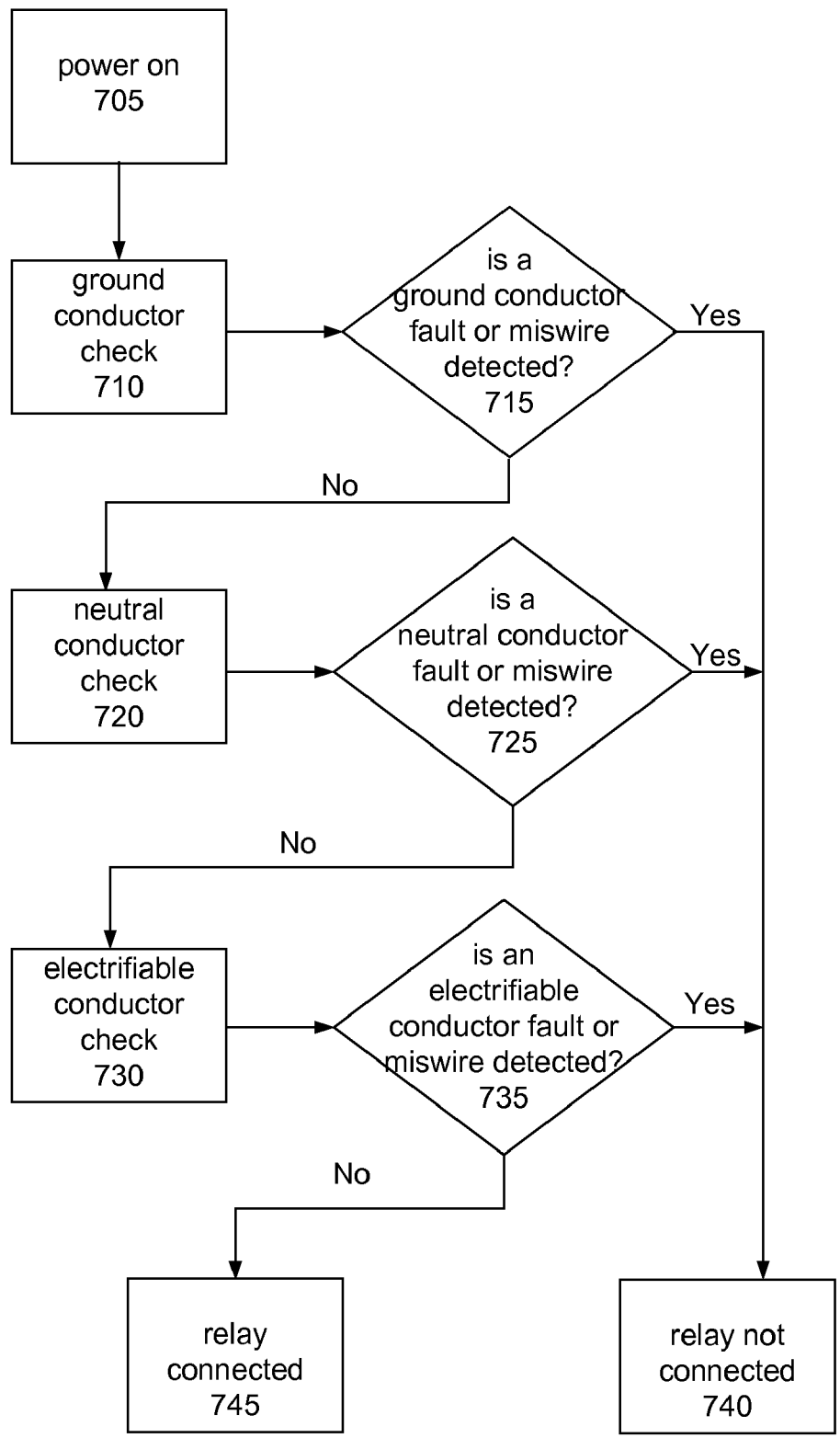
FIG. 7 is a flowchart of one example of the general operation of a load side wire integrity component, according to an illustrative embodiment of the invention.

FIG. 7 is a flowchart of one example of the general operation of a DWI component 340, according to an illustrative embodiment of the invention. The methodology of FIG. 7 may be implemented by the DWI component 340 for either a voltage-based test system or a current-based test system. Additionally, the DWI component 340 may be utilized to test many different types of wire, including flat wire, such as flat wire 105, and conventional wire, such as wire 107. If power is applied to the DWI component 340 at block 705, then the DWI component 340 may go to block 710. At block 710, the DWI component 340 may test one or more grounding conductors of the wire 102. For example, the DWI component 340 may test the grounding conductor loop of a flat wire 105. As another example, the DWI component 340 may test the ground or grounding conductor 260 of a conventional wire 107. At block 715, the DWI component 340 may determine whether or not the one or more grounding conductors have been terminated properly and whether or not there is a fault in the grounding conductor of the wire 102. For a flat wire 105, the DWI component may determine whether or not the grounding conductor loop has been terminated properly and whether or not there is a fault in the grounding conductors 220, 225 at block 715. If the one or more grounding conductors are determined not to be properly terminated or a fault is found in one of the grounding conductors, such as grounding conductors 220 and 225 if a flat wire 105 is tested, then, the DWI component 340 may go to block 740 and prevent the relay 310 from being closed to prevent electrification of the wire 102. If, however, the one or more grounding conductors (e.g., grounding conductor loop of a flat wire 105) are determined to be properly terminated and no faults are found in the one or more grounding conductors, such as conductors 220 and 225, at block 715, then the DWI component 340 may go to block 720. At block 720, the DWI component 340 may test the one or more return conductors of the wire 102. For example, the DWI component 340 may test the return conductor loop of a flat wire 105 or the DWI component 340 may test the return conductor 255 of a conventional wire 107. The DWI component 340 may determine whether or not the one or more return conductors have been terminated properly and whether or not there is a fault in the one or more return conductors of the wire 102 at block 725. If one or more of the return conductor loop are determined not to be properly terminated or a fault is detected in one or more of the return conductors, such as conductors 210, 215 if a flat wire 105 is tested, then the DWI component 340 may go to block 740 and prevent the relay 310 from being closed to prevent electrification of the wire 102. If, however, the one or more return conductors (e.g., return conductor loop of a flat wire 105) are determined to be properly terminated and no wire faults are found in the one or more return conductors at block 725, then the DWI component 340 may go to block 730. At block 730, the DWI component 340 may test the electrifiable conductor of the wire 102, such as electrifiable conductor 205 if a flat wire 105 is tested or electrifiable conductor 250 if a conventional wire is tested, in order to determine whether or not it is properly terminated and whether or not there are any wire faults in the electrifiable conductor. If, at block 735, it is determined that the electrifiable conductor (e.g., conductor 205 or 250) is not properly terminated or that a wire fault is detected on the electrifiable conductor, then the DWI component 340 may go to block 740 and prevent the relay 310 from being closed. If, however, the electrifiable conductor (e.g., conductor 205 or 250) is determined to be properly terminated and no wire faults are detected on the electrifiable conductor at block 735, then the DWI component 340 may go to block 745 and allow the relay 310 to be closed. Alternatively, a DWI component flag may be set and stored by the control unit 312, and the flag may be used by the ASD 100 in conjunction with other tests to determine whether or not the relay 310 may be closed.

The tests performed by the DWI component 340 do not necessarily have to be performed in the order set forth in the logic of FIG. 7, but instead may be performed in any suitable order. As previously mentioned, some of the tests set forth in FIG. 7 may be performed in parallel with one another. Additionally, the DWI component 340 does not have to conduct each test set forth in FIG. 7, but instead may conduct less than all of the tests set forth in FIG. 7. If any test results in the execution of block 740, then the DWI component 340 may still perform the remaining tests and may record the outcome of each test, or at least the ones that result in a positive miswire indication. Additionally, if a miswire is detected by the DWI component 340, an indicator may be stored by the DWI component 340 or by the control unit 312, and the indicator may include information as to which test(s) resulted in the detection of a miswire. This indicator may then be transmitted by the ASD 100 to another device such as a second ASD 100, a central monitoring device, or a computer. The DWI component 340 and/or the control unit 312 may be associated with one or more memory devices, for example, the memory 405 of the control unit 312, operable to store a variety of indicators and/or measurements data associated with the operation of the DWI component 340.

Figure 8A:
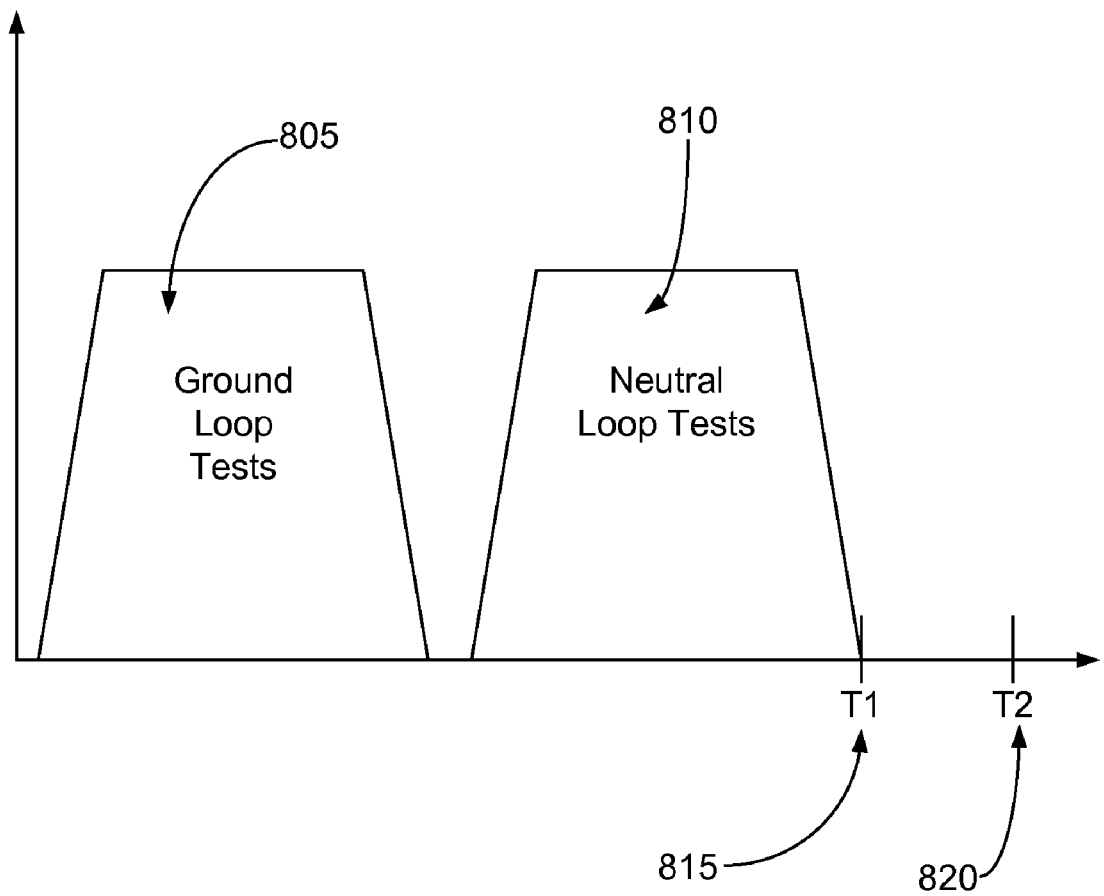
FIG. 8A is one example of a timing diagram of voltage or current based test signals that may be applied by a load side wire integrity component, according to an illustrative embodiment of the invention.

FIG. 8A is one example of a timing diagram of test signals that may be applied by a DWI component 340, according to an illustrative embodiment of one aspect of the invention. The timing diagram depicted in FIG. 8A may be applicable to testing certain types of flat wire, such as flat wire 105. As mentioned earlier, the return conductor loop and grounding conductor loop may be tested at alternating periods 805 and 810 of the test signal in order to isolate the loop that is being tested. According to an aspect of the invention, the signal used to drive the return and grounding conductor loops may be any signal with an alternating period, such as a 2400 Hertz (Hz) square wave signal. The signal may be generated by a microcontroller, clocking circuit, or other signal generation device and communicated onto the two loops of the flat wire 105, as explained in greater detail below. For example, the signal may be generated by one or more suitable components of a control unit 312 of the ASD 100. The signal may be passed through a low pass filter before being communicated onto one or more of the conductors of the flat wire 105 to remove any unwanted noise and/or harmonics. Tests on both the return conductor loop and ground conductor loop may be performed with the same test signal and, if it is determined that both loops are properly terminated and no faults are detected on the flat wire 105, then the relay 310 of the ASD 100 may be closed in order to allow the flat wire 105 to be electrified. In addition, a flag or state may be set in the ASD 100 to indicate whether the conductor loops are terminated properly. A conductor loops termination flag may be used in conjunction with the results of other tests performed by the ASD 100 in order to determine whether or not the relay 310 of the ASD 100 may be closed. The tests on both loops may be conducted by the DWI component 340 within a first time of approximately 300 milliseconds or less 815 and then the decision of whether or not to close the relay 310 may be made by a second time 820. The second time 820 may be less than approximately 375 milliseconds. The timing set forth in FIG. 8A is one example of timing and that a variety of timing goals or benchmarks may be utilized in accordance with embodiments of the invention.

Figure 8B:
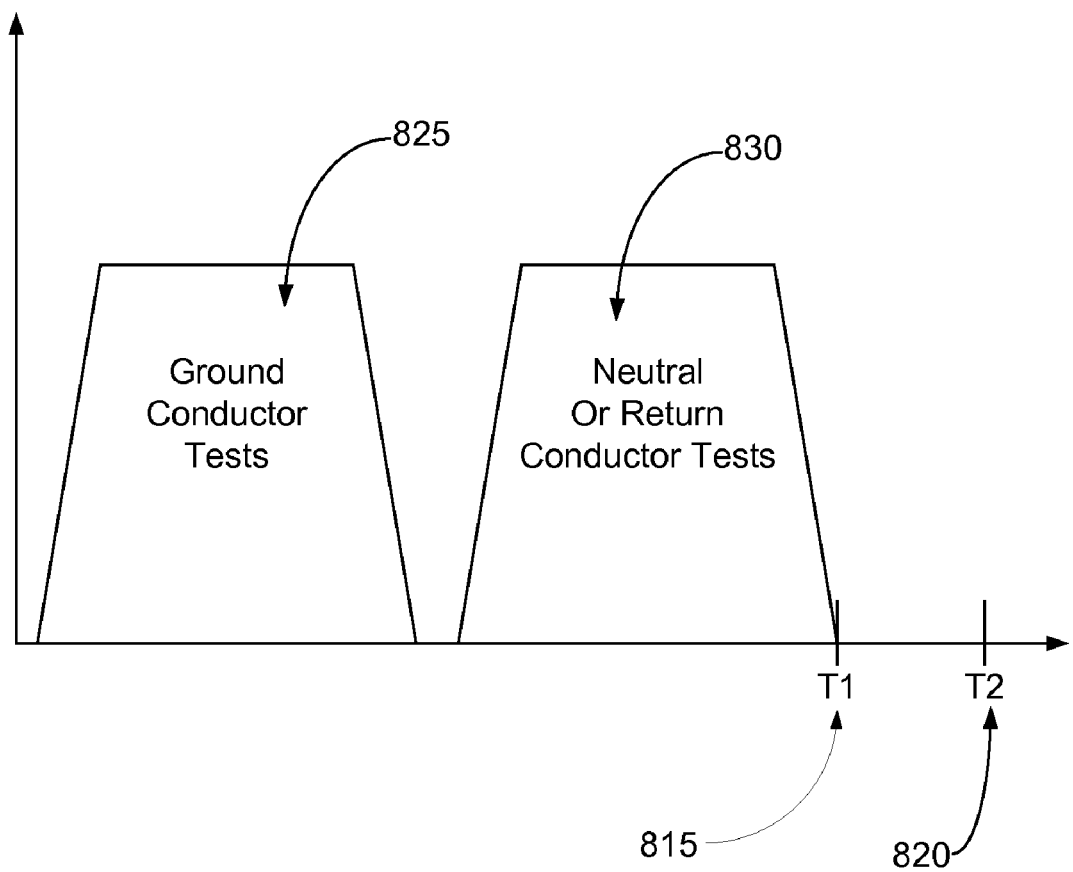
FIG. 8B is another example of a timing diagram for testing a convention wire utilizing a load side wire integrity component, according to an illustrative embodiment of the invention.

FIG. 8B is another example of a timing diagram of test signals that may be applied by a DWI component 340, according to an illustrative embodiment of one aspect of the invention. The timing diagram depicted in FIG. 8B may be applicable to testing various types of wire, such as conventional wire 107. With reference to the conventional wire 107 depicted in FIG. 2B, the return conductor 255 and grounding conductor 260 may be tested at alternating periods 825 and 830 of the test signal in order to isolate the conductor that is being tested. Additionally, in certain embodiments of the invention, the electrifiable conductor 250 may be tested. According to an aspect of the invention, the signal used to drive the respective tests of the return and grounding conductor may be any signal with an alternating period, such as, a 2400 Hertz (Hz) square wave signal. The signal may be generated by a microcontroller, clocking circuit, or other signal generation device and communicated onto the two conductors of the wire 107. For example, the signal may be generated by one or more suitable components of a control unit 312 of the ASD 100. The signal may be passed through a low pass filter before being communicated onto one or more of the conductors of the wire 107 to remove any unwanted noise and/or harmonics. Tests on both the return conductor 255 and ground conductor 260 may be performed with the same test signal and, if it is determined that both conductors are properly terminated and no faults are detected on the wire 107, then the relay 310 of the ASD 100 may be closed in order to allow the wire 107 to be electrified. In addition, a flag or state may be set in the ASD 100 to indicate whether the conductors are terminated properly. A conductor termination flag may be used in conjunction with the results of other tests performed by the ASD 100 in order to determine whether or not the relay 310 of the ASD 100 may be closed. The tests on both conductors may be carried out by the DWI component 340 within a first time 815, such as approximately 300 milliseconds or less, and then the decision of whether or not to close the relay 310 may be made by a second time 820. The second time 820 may be less than approximately 375 milliseconds. The timing set forth in FIG. 8B is merely one example of timing and that a variety of timing goals or benchmarks may be utilized in accordance with various embodiments of the invention.

According to some embodiments of the invention, the wire 102 may be tested by the DWI component 340 by electrifying one or more conductors of the wire 102 and testing one or more of the conductors of the wire 102 for a return signal. This manner of testing may be particularly applicable to electrical flat wire 105 in order to test for interlayer shorts due to the stacked arrangement of the electrical flat wire 105. For example, as explained in greater detail below with reference to FIG. 11, one or more of the return conductors 210, 215 of an electrical flat wire 105 may be electrified and one or more of the conductors of the flat wire 105 may be monitored or tested for a return signal. Miswires and/or wire faults may be identified based at least in part on one or more return signals. A similar method may be conducted by electrifying one or more of the grounding conductors 220, 225 and testing one or more of the conductors of the flat wire 105 for a return signal. The one or more conductors that are electrified for testing may be electrified for any period of time in order to conduct the testing.

As desired, the electrifiable conductor 205, 250 of a monitored wire 102 may be electrified for a predetermined period of time, and one or more conductors of the wire 102 may be monitored for miswire and/or wire faults. For example, the relay 310 may be closed at one zero crossing and then opened at the next zero crossing, thereby permitting one half cycle of an electrical power signal from the line side power source 115 to be communicated onto the wire 102. One or more conductors of the wire 102 may then be monitored for return signals that indicate the presence of miswires and/or wire faults. For example, if a return signal is detected on one or more of the grounding conductors 220, 225 or a flat wire 105 or the grounding conductor 260 of a conventional wire 107, a miswire or short may be present on the monitored wire 102. If a miswire or short is identified, then the DWI component 340 and/or the control unit 312 may prevent the further electrification of the wire 102 by maintaining the relay 310 in its opened position. The testing described above may be conducted at any time by the DWI component 340, for example, during the initial electrification of the wire 102 following installation or a reset condition of the ASD 100. The predetermined period of time that the wire 102 is electrified for testing may be virtually any predetermined period of time as desired. A half cycle of an electrical power signal is merely discussed as one example of a period of time.

A conventional wire, such as wire 107, or other types of wiring may be tested in a similar manner as an electrical flat wire 105. For example, a test signal may be applied to one conductor of a conventional wire 107 and the other conductors of the conventional wire 107 may be tested for a return signal. The tests that may be performed by a DWI component 340 that are described below are described with reference to an electrical flat wire 105; however, similar tests may be adapted to and applied to other types of wiring, such as to a conventional wire 107.

Additionally, the tests performed by the DWI component 340 may be contained between the source module 110 and the destination module 120 of the wire system 101. Accordingly, a current or voltage is not allowed to pass either to the line side source 115 or to the load side destination 125.

The DWI component 340 may use a voltage-based method to test a wire 102 for miswires and wire faults on the load side. The voltage-based method directly applies a voltage test signal to selected conductors or layers (stimulated layers) of the wire 102 while measuring voltages on the remaining conductors or layers (non-stimulated layers). Wire faults, or unwanted conductance between the conductors in the form of low or high impedance shorts, may be identified by detecting unexpected voltage present on the non-stimulated conductors or layers.

Figure 9A:
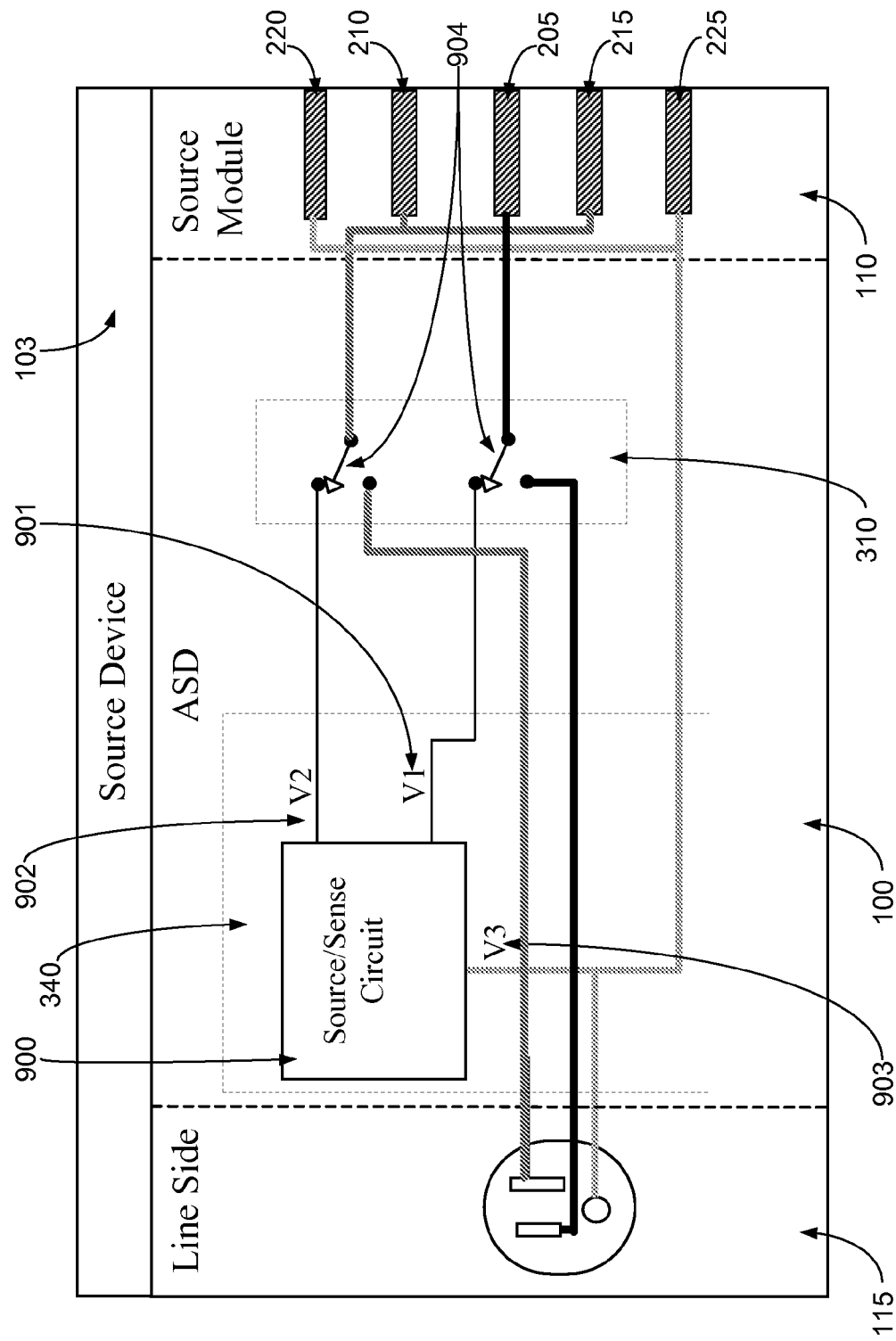
FIG. 9A is a schematic diagram of an example voltage-based load side wire integrity component that may be incorporated into an ASD, according to an embodiment of the invention.

FIG. 9A is a schematic diagram of a voltage-based DWI component 340 that may be incorporated into an ASD 100 according to one aspect of the invention. As a preliminary matter, it may be noted that FIG. 9A depicts a different source device 103 than that shown in FIG. 3. In FIG. 9A, the line side power source 115 is incorporated into the source device 103. Such a situation might occur, for example, if the source device 103 includes a standard electrical plug that may be plugged into an electrical outlet.

As shown in FIG. 9A, The voltage-based DWI component 340 may include a source/sense circuit 900, an electrifiable (or hot) conductor connection 901, a return conductor connection 902, a grounding conductor connection 903, and one or more test signal relays 904. The source/sense circuit 900 may be configured to transmit a voltage test signal onto one of the conductors of the flat wire 105 and then monitor the conductors of the flat wire 105 for a return voltage. As desired in various embodiments, the source/sense circuit 900 may test more than one conductor of the flat wire 105 simultaneously be using alternating periods of the same test signal, as explained in greater detail above with reference to FIG. 8. The source/sense circuit 900 may transmit a voltage test signal onto the electrifiable conductor 205 and/or monitor the electrifiable conductor 205 via the electrifiable conductor connection 901. Similarly, the source/sense circuit 900 may transmit a voltage test signal onto one or more of the return conductors 210, 215 and/or monitor one or more of the return conductors 210, 215 via the return conductor connection 902. Additionally, the source/sense circuit 900 may transmit a voltage test signal onto one or more of the grounding conductors 220, 225 and/or monitor one or more of the return conductors 220, 225 via the grounding conductor connection 902.

The voltage-based test signal transmitted by the source/sense circuit 900 may be a low voltage signal. The voltage-based test signal may be, for example, at a voltage of approximately 5 volts or at a voltage of approximately 12 volts, although other voltage levels may be used as desired for the test signal. As a safety precaution, the maximum amplitude of the voltage-based test signal may be limited to approximately 30 volts, although a test signal with an amplitude of greater than approximately 30 volts may be used in conjunction with certain embodiments of the invention. Additionally, the voltage-based test signal may be derived from the signal coming into the ASD 100 from the line side power source 115. The source/sense circuit 900 may receive a voltage signal from the line side power source 115 and step that signal down to a low voltage signal that may be used or modified to perform tests on the flat wire 105. For example, the source/sense circuit 900 may receive a voltage signal of approximately 110-130 V or approximately 220-250 V and step that voltage signal down to a low voltage signal for testing the flat wire 105. The voltage may be stepped down using a step down transformer, capacitor, or any other suitable device for decreasing the amplitude of a voltage signal. Additionally, the source/sense circuit 900 may constitute an isolated power source when applying a test signal to the flat wire 105.

A voltage test relay 904 may be used by the DWI component 340 to ensure that the flat wire cannot be fully electrified while it is being tested by the DWI component 340. As shown in FIG. 9A, the voltage test relay 904 may be a double-pole single throw relay, although other types of relays or combinations of relays may be used in accordance with embodiments of the invention. If the voltage test relay 904 is in a closed position, then electrical power may be allowed to flow from the line side power source 115 through the ASD 100 and onto the flat wire 105. If, however, the voltage test relay 904 is in a test position (or opened position), then electrical power will not be permitted to flow from the line side power source 115 through the ASD 100 and onto the flat wire 105. Instead, the voltage-based test signal will be allowed to flow from the source/sense circuit 900 onto the flat wire 105. In certain embodiments, the voltage test relay 904 may be the same circuit as that used for the main or common relay 310, as shown in FIG. 9A. Alternatively, the voltage test relay 904 may be one or more separate relays used in conjunction with the DWI component 340.

When the voltage test relay 904 is maintained in a test position, the source/sense circuit 900 may transmit or communicate a voltage-based test signal onto one or more of the conductors of the flat wire 105 while monitoring the conductors of the flat wire 105 for a return voltage. For example, the source/sense circuit 900 may communicate a voltage-based test signal onto the electrifiable conductor 205 of the flat wire 105 via the electrifiable conductor connection 901. The source/sense circuit 900 may then monitor the conductors of the flat wire 105 for a voltage signal to determine whether there are any inter-layer or termination shorts or faults present on the flat wire 105. If a voltage signal is detected by either the return conductor connection 902 or the grounding conductor connection 903, the source/sense circuit 900 (or the control unit 312 in communication with the source/sense circuit 900) may determine that an inter-layer or termination short is present on the flat wire 105 between the electrifiable conductor 205 and one of the other conductors of the flat wire 105. Similarly, the source/sense circuit 900 may communicate a voltage-based test signal onto the return conductors 210, 215 of the flat wire 105 via the return conductor connection 902 and then monitor the conductors of the flat wire 105 for a voltage signal to determine whether there are any inter-layer or termination shorts between one or more of the return conductors 210, 215 and one or more of the other conductors of the flat wire 105. If a voltage signal is detected by either the electrifiable conductor connection 901 or the grounding conductor connection 903, it may be determined that an inter-layer or termination short is present on the flat wire 105. The same method may be used to test the grounding conductors 220, 225 of the flat wire 105. The source/sense circuit 900 may communicate a voltage-based test signal onto the grounding conductors 220, 225 of the flat wire 105 via the grounding conductor connection 903 and then monitor the conductors of the flat wire 105 for a voltage signal to determine whether there are any inter-layer or termination shorts between one or more of the grounding conductors 220, 225 and one or more of the other conductors of the flat wire 105. If a voltage signal is detected by either the electrifiable conductor connection 901 or the return conductor connection 902, it may be determined that an inter-layer or termination short is present on the flat wire 105.

As shown in FIG. 9A, a test signal may be applied to either both return conductors 210, 215 or both grounding conductors 220, 225 at the same time by the source/sense circuit 900. However, as desired, a test signal may be individually applied to a single conductor of the flat wire 105. For example, two return conductor connections may be included to individually apply a test signal to and monitor each of the return conductors 210, 225 of the flat wire. When determining whether or not inter-layer shorts are present on the flat wire 105, it is not necessary to individually test and monitor each of the return conductors 210, 215 or each of the grounding conductors 220, 225 of the flat wire because a voltage-based test signal applied to one conductor in a loop will be transmitted through the destination module 120 and back to the DWI component 340 in the source device 103 via the associated other conductor in the loop. On the load side, the return signal may be transmitted through only the destination module 120 or, alternatively, the return signal may be transmitted through both the destination module 120 and any load side destination 125 connected to the wire system 101.

Limits may be placed on the detectable inter-layer impedance range between two conductors of the flat wire 105. The detectable inter-layer impedance range between the return conductors 210, 215 and electrifiable conductor 205 may be limited by the possible presence of real loads connected on the load side 125 of the flat wire 105. An example of such a load would be a hair dryer plugged into an electrical outlet. Real loads connected on the load side 125 may create an impedance on the flat wire 105 as low as 8-10 ohms; therefore, an inter-layer impedance check between the electrifiable 205 and return conductors 210, 215 may be limited at lower than 8-10 ohms or at approximately less than 1 ohm. For example, if a high impedance inter-layer short is 190 ohms and the real load is 10 ohms, the resulting or combined impedance is 9.5 ohms [(190×10)/(190+10)], thus the high impedance interlayer short may be virtually undetectable. This is referred to as the real load effect. To avoid the real load effect, a destination relay (not shown) may be placed in the destination module 120. The destination relay may be timed to delay a connection to the real load on a power up sequence while the DWI component 340 performs its tests, thereby eliminating the 8-10 ohm limitation.

Regarding the detectable inter-layer impedance range between return conductors 210, 215 and grounding conductors 220, 225, the DWI component 340 may accurately detect an inter-layer impedance as high as approximately 5000 ohms prior to the full electrification of the flat wire 105.

The DWI component 340 may limit or eliminate the detection of false alarms by performing pre-testing on the flat wire 105 prior to testing the flat wire 105 for inter-layer shorts. The DWI component 340 may also limit or eliminate the detection of false alarms by performing post-testing on the flat wire 105 after testing the flat wire 105 for inter-layer shorts. For pre-testing the flat wire 105, the source/sense circuit 900 may monitor the conductors of the flat wire 105 for a voltage signal prior to transmitting a voltage-based test signal onto the flat wire 105. If a voltage signal is detected on one of the conductors of the flat wire 105 prior to applying a test signal to the flat wire 105, then the source/sense circuit 900 may wait for the flat wire 105 to de-energize before applying a test signal to the flat wire 105. For post-testing of the flat wire 105, after the flat wire 105 has been tested with voltage-based test signals, the source/sense circuit 900 may continue to monitor the conductors of the flat wire 105 for a voltage signal. Further voltage-based testing of the flat wire 105 using test signals may not be permitted as long as there is a voltage signal detected on one of the conductors of the flat wire 105.

The voltage-based method of testing the load side of a flat wire 105 for miswires and wire faults may be implemented by devices other than the DWI component 340 of an ASD 100. For example, the voltage-based method may be particularly useful in a general purpose portable flat wire test system, such as a portable handheld flat wire testing device.

According to another aspect of the invention, the DWI component 340 may utilize one or more current-based methods to identify or locate line side faults or miswires of a flat wire 105 connected to an ASD 100. Before the relay 310 of the ASD 100 is closed, thereby allowing the flat wire 105 to be electrified, the DWI component 340 may use a current-based method to test the flat wire 105 on the load side and determine whether the flat wire 105 has been connected or wired properly. Determining whether the flat wire 105 is connected properly prior to the full electrification of the flat wire 105 may help prevent electrocution, other bodily harm, or property damage caused by a miswire. By using a current-based method of the DWI component 340, the DWI component 340 and/or the control unit 312 may determine whether a flat wire 105 has been installed correctly before the flat wire 105 is ever electrified. The DWI component 340 and/or the control unit 312 may also determine whether any faults exist in the flat wire 105 before the flat wire 105 is electrified.

As desired in various embodiments, the DWI component 340 illustrated in FIG. 9A may be adapted for use with other types of wiring, for example, a conventional wire 107. In one example embodiment, voltage-based test signals may be communicated onto one conductor 250, 255, 260 of a conventional wire 107 and one or more other conductors 250, 255, 260 of the conventional wire 107 may be tested for a return signal. In this regard, shorts may be detected in the conventional wire 107.

Figure 9B:
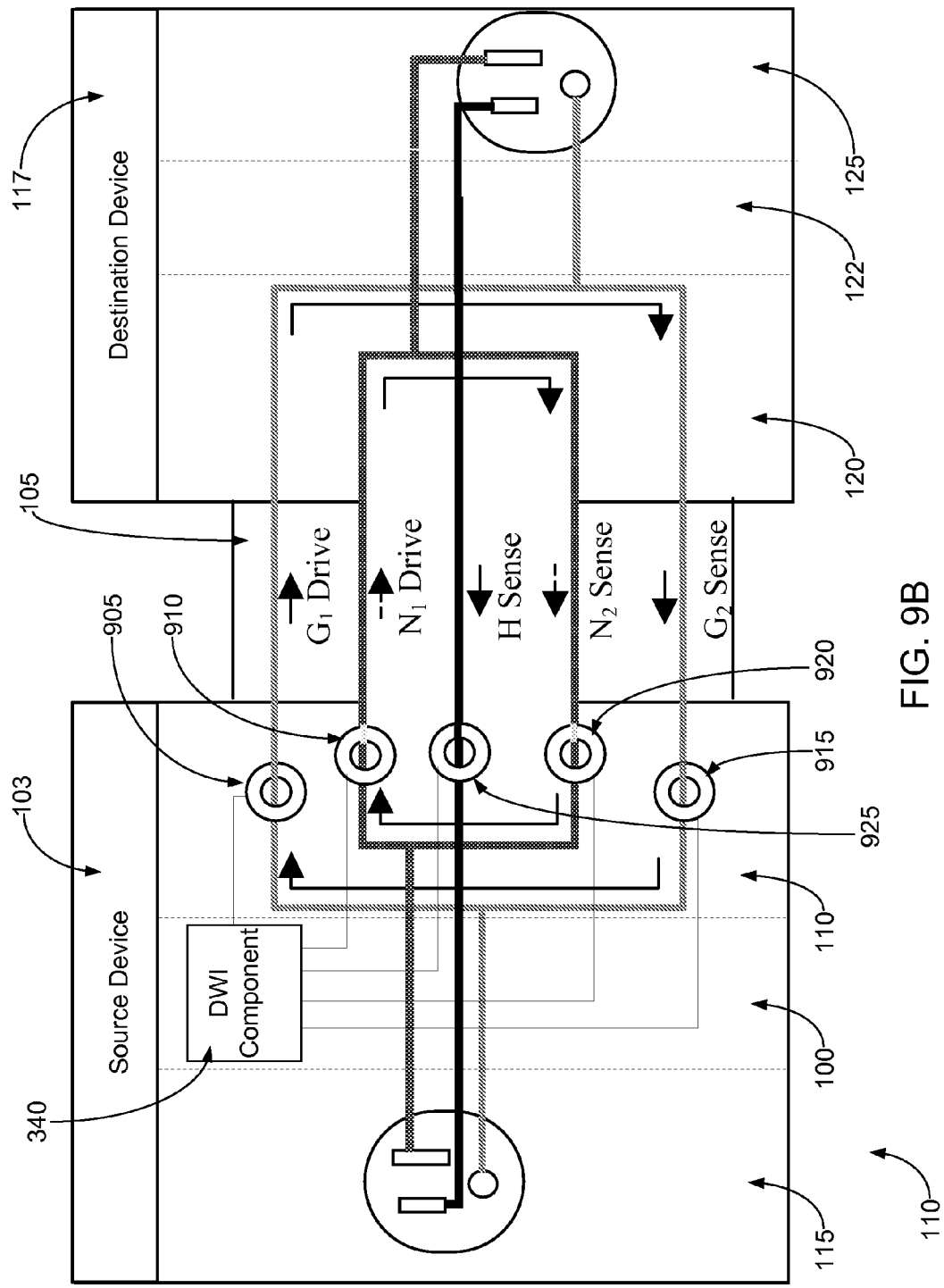
FIG. 9B is a schematic diagram of an example current-based load side wire integrity component that may be incorporated into an ASD, according to an embodiment of the invention.

FIG. 9B is a schematic diagram of a current-based DWI component 340 that may be incorporated into an ASD 100 according to an illustrative embodiment of the invention. As a preliminary matter, it may be noted that FIG. 9B depicts a different source device 103 and destination device 117 than that shown in FIG. 3. In FIG. 9B, the line side power source 115 is incorporated into the source device 103 and the load side destination 125 is incorporated into the destination device 117. Such a situation might occur, for example, if the source device 103 included a standard electrical plug that may be plugged into an electrical outlet and if the destination device 117 included one or electrical outlets.

As shown in FIG. 9B, the DWI component 340 may be in communication with one or more excitation or drive circuits 905, 910 and one or more sense circuits 915, 920, 925 that are used to detect miswires and/or wire faults in the flat wire 105. The excitation circuits 905, 910 and the sense circuits 915, 920, 925 may be included in or controlled by the DWI component. Alternatively, the excitation circuits 905, 910 and the sense circuits 915, 920, 925 may be included in the wire I/O interface 311, and the DWI component 340 may be in communication with the wire I/O interface 311 and the excitation circuits 905, 910 and sense circuits 915, 920, 925. The DWI component 340 may determine whether a flat wire 105 connected to the ASD 100 has been properly terminated prior to the electrification of the flat wire 100. The DWI component 340 depicted in FIG. 9B is designed to be used in conjunction with an electrical flat wire including an electrifiable conductor 205 and two return conductors 210, 215 formed on opposing sides of the electrifiable conductor 205. The electrical flat wire may further include two grounding conductors 220, 225 formed on opposing sides of the combined electrifiable conductor 205 and return conductors 220, 225. A DWI component 340 according to the invention may be used in conjunction with any flat wire (and/or any conventional wire), regardless of the number and type of conductors contained in that flat wire.

Referring to FIG. 9B, the DWI component 340 may test the flat wire 105 for miswires by transmitting a current-based signal over one conductor of the flat wire 105 and testing one or more of the other conductors of the flat wire 105 for a return signal. For example, the associated conductor of the loop may be tested for a current indicating that the flat wire 100 is wired correctly. For instance, the DWI component 340 may transmit a current-based signal over a first grounding conductor 220 and then monitor a second grounding conductor 225 for a current indicating that the grounding conductors 220, 225 are wired correctly. Alternatively, the DWI component 340 may transmit a current-based signal over a first return conductor 210 and then monitor a second return conductor 215 for a current indicating that the return conductors 210, 215 are wired correctly. If the grounding conductors 220, 225 and return conductors 210, 215 are wired correctly, then the DWI component 340 may presume that the electrifiable conductor 205 of the flat wire 105 is wired correctly. Alternatively, the DWI component 340 may perform additional tests to verify that the flat wire 105 is terminated properly, as discussed in greater detail below with reference to FIG. 13. The current that is tested for may be a predetermined threshold current, which may be, for example, 10 milliamps. If the current detected on the associated conductor of a flat wire loop is less than 10 milliamps, the loop may not be wired or terminated correctly at the destination module 120.

A method and circuit for determining whether the grounding conductors 220, 225 of a flat wire 105 have been wired correctly will now be described in greater detail. A similar method may be used to determine whether the return conductors 210, 215 have been wired correctly. In order to test for correct wiring, a ground excitation circuit 905 under control of the DWI component 340 (and/or the control unit 312) may transmit a current signal over a first grounding conductor 220. The ground excitation circuit 905 may be an excitation current transformer or any other suitable device capable of transmitting a signal over a first grounding conductor 220 including, but not limited to, multiplexers, isolators, and relays. In order to transmit a current signal onto the first grounding conductor 220, a test signal may be used to drive a voltage-to-current converter, which in turn forces the current through the primary windings of the current transformer in the ground excitation circuit 905. Additionally, in order to minimize the magnitude of the excitation placed on the flat wire 105, the signal transmitted by the ground excitation circuit 905 may be at a frequency much greater than 50 or 60 Hz, which is the frequency typically carried over electrical wires. According to an aspect of the invention, the frequency of the signal transmitted by the ground excitation circuit 905 may be at a frequency of approximately 1000 Hz or greater. The current-based signal communicated or transmitted onto the first grounding conductor 220 may be part of an alternating signal that is used to simultaneously test both the grounding conductor loop and the return conductor loop, as described above with reference to FIG. 8. Alternatively, the current-based signal used to test the grounding conductor loop may be a separate signal than that used to test the return conductor loop.

After a signal has been transmitted over a first grounding conductor 220, if the grounding conductors 220, 225 are properly terminated, then the signal will pass through the destination module 120 and return to the source module 110 via the second grounding conductor 225. A ground sense circuit 915 connected to the second grounding conductor 225 may be used to detect a current present on the grounding conductors 220, 225. The ground sense circuit 915 may be a sensing current transformer or it may be any other suitable device capable of sensing a current including, but not limited to, resistors, isolators, and Hall Effect devices.

The DWI component 340 may also determine whether the return conductors 210, 215 have been wired correctly on the load side. In order to test for correct wiring, a return excitation circuit 910 under control of the DWI component 340 transmits a current-based signal over a first return conductor 210, in the same manner as the ground excitation circuit 905 transmits a signal over a first grounding conductor 220. The current-based signal communicated or transmitted onto the first grounding conductor 220 may be part of an alternating signal that is used to simultaneously test both the grounding conductor loop and the return conductor loop, as described above with reference to FIG. 8. Alternatively, the current-based signal used to test the return conductor loop may be a separate signal than that used to test the grounding conductor loop. After a signal has been transmitted over a first return conductor 210, if the return conductors 210, 215 are properly terminated, then the signal will pass through the destination module 120 and return to the source module 110 via the second return conductor 215. A return sense circuit 920 connected to the second return conductor 215 may be used to detect a current present on the return conductors 210, 215. The return sense circuit 920 may be a sensing current transformer or it may be any other suitable device capable of sensing a current including, but not limited to, resistors, isolators, and Hall Effect devices.

According to an aspect of the invention, the DWI component 340 may also determine that the flat wire 105 is not terminated properly if a current is detected on a conductor of the flat wire 105 other than the conductors being tested in any given loop. As explained in greater detail below, such a situation may also indicate a wire fault. In certain embodiments, the DWI component 340 may differentiate between a miswire and a wire fault based upon the magnitude of a current signal detected on one of the other conductors and/or based on the number of other conductors on which a current signal is detected. For example, if a test current is applied to a return conductor 210 and a current that is approximately equal to the test current is detected on the electrifiable conductor 205, then the DWI component 340 may determine that the electrifiable conductor 205 and the other return conductor 215 have been miswired. As another example, if a test current is applied to a return conductor 210 and a current signal is detected on all of the conductors of the flat wire 105 (the detected current signals may have a lower amplitude than the test current), then the DWI component 340 may determine that a wire fault exists and that the conductors of the flat wire 105 have been shorted together.

According to another aspect of the invention, the DWI component 340 may use the current-based method to determine whether there are any wire faults or inter-layer shorts present on the flat wire 105 prior to the electrification of the flat wire 105. The DWI component 340 may detect inter-layer shorts on a non-electrified flat wire 105 by transmitting a low level current through a single flat wire conductor, such as the electrifiable conductor 205, or through one set of flat wire 105 layers, such as the return conductors 210, 215. Then, the DWI component 340 may monitor one or more of the other flat wire 105 layers for a return current. For instance, a current may be transmitted on the one or more return conductors 210, 215 of the flat wire 105. The DWI component 340 may then monitor the electrifiable conductor 205 and the one or more grounding conductors 220, 225 of the flat wire 105 for a return current. As another example, a current may be transmitted on the electrifiable conductor 205 of the flat wire 105, and the DWI component 340 will monitor the one or more return conductors 210, 215 and the one or more grounding conductors 220, 225 of the flat wire 105 for a return current.

The DWI component 340 may combine testing for miswires in the flat wire 105 with testing for wire faults or inter-layer shorts on the flat wire 105. For example, with reference to FIG. 9B, when a current-based test signal is transmitted onto the first grounding conductor 220 by the ground excitation circuit 905, the sense circuits 915, 920, 925 may be used to determine whether the flat wire 105 contains any miswires or inter-layer shorts. As previously mentioned, the ground sense circuit 915 may be used to determine whether or not the grounding conductors 220, 225 have been properly terminated at the load side. Additionally, the return sense circuit 920 and an electrifiable (or hot) sense circuit 925 may be used to monitor the flat wire 105 for a miswire or inter-layer short. If a current-based signal is detected on the second return conductor 210 by the return sense circuit 920, then the DWI component 340 may determine that there is an inter-layer short between one or more of the grounding conductors 220, 225 and one or more of the return conductors 210, 215. Similarly, if a current-based signal is detected on the electrifiable conductor 205 by the electrifiable sense circuit 925, the DWI component 340 may determine that there is an inter-layer short between one or more of the grounding conductors 220, 225 and the electrifiable conductor 205.

As an example, a test current of approximately 10 milliamps (mA) may be transmitted onto the first grounding conductor 220 of the flat wire 105 by the ground excitation circuit 910. If the ground sense circuit 915 detects a signal of approximately 10 milliamps on the second grounding conductor 220, then the DWI component 340 may determine that the grounding conductors 220, 225 are properly terminated. If, however, the ground sense circuit 915 does not detect a signal of approximately 10 milliamps on the second grounding conductor 220, then the DWI component 340 may determine that the grounding conductors 220, 225 are not properly terminated and the DWI component 340 may prevent the relay 310 from being closed to prevent electrification of the flat wire 105. Additionally, if a current is detected on either the second return conductor 215 by the return sense circuit 920 or on the electrifiable conductor 205 by the electrifiable sense circuit 925, then the DWI component 340 may determine that there is an inter-layer short in the flat wire 105. The DWI component 340 may then prevent the relay 310 from being closed to prevent electrification of the flat wire 105.

As desired in various embodiments, the DWI component 340 illustrated in FIG. 9B may be adapted for use with other types of wiring, for example, a conventional wire 107. In one example embodiment, voltage-based test signals may be communicated onto one conductor 250, 255, 260 of a conventional wire 107 and one or more other conductors 250, 255, 260 of the conventional wire 107 may be tested for a return signal. In this regard, shorts may be detected in the conventional wire 107.

The combination of excitation circuits 905, 910 and sense circuits 915, 920, 925 shown in FIG. 9B is simply one combination of these circuits that may be used in accordance with certain embodiments of the invention. Excitation circuits and/or sense circuits may be used to transmit a signal onto or monitor any of the conductors of the flat wire 105. Using the example above, when a test signal is transmitted onto the first grounding conductor 220, an additional sense circuit may be used to monitor the first return conductor 210 of the flat wire 105 for a return signal that indicates an inter-layer short between one or more of the grounding conductors 220, 225 and the first return conductor 210. Because the two return conductors 210, 215 form a loop if they are wired correctly, any inter-layer short between one or more of the grounding conductors 220, 225 and the first return conductor 210 would also be detected by the return sense circuit 920 that is monitoring the second return conductor 215.

The excitation circuits 905, 910 and the sense circuit 915, 920, 925 may be incorporated into the DWI component 340. Alternatively, the excitation circuits 905, 910 and the sense circuits 915, 920, 925 may be included in the wire I/O interface 311, and the DWI component 340 may be in communication with the wire I/O interface 311 either directly or through the control unit 312.

Figure 9C:
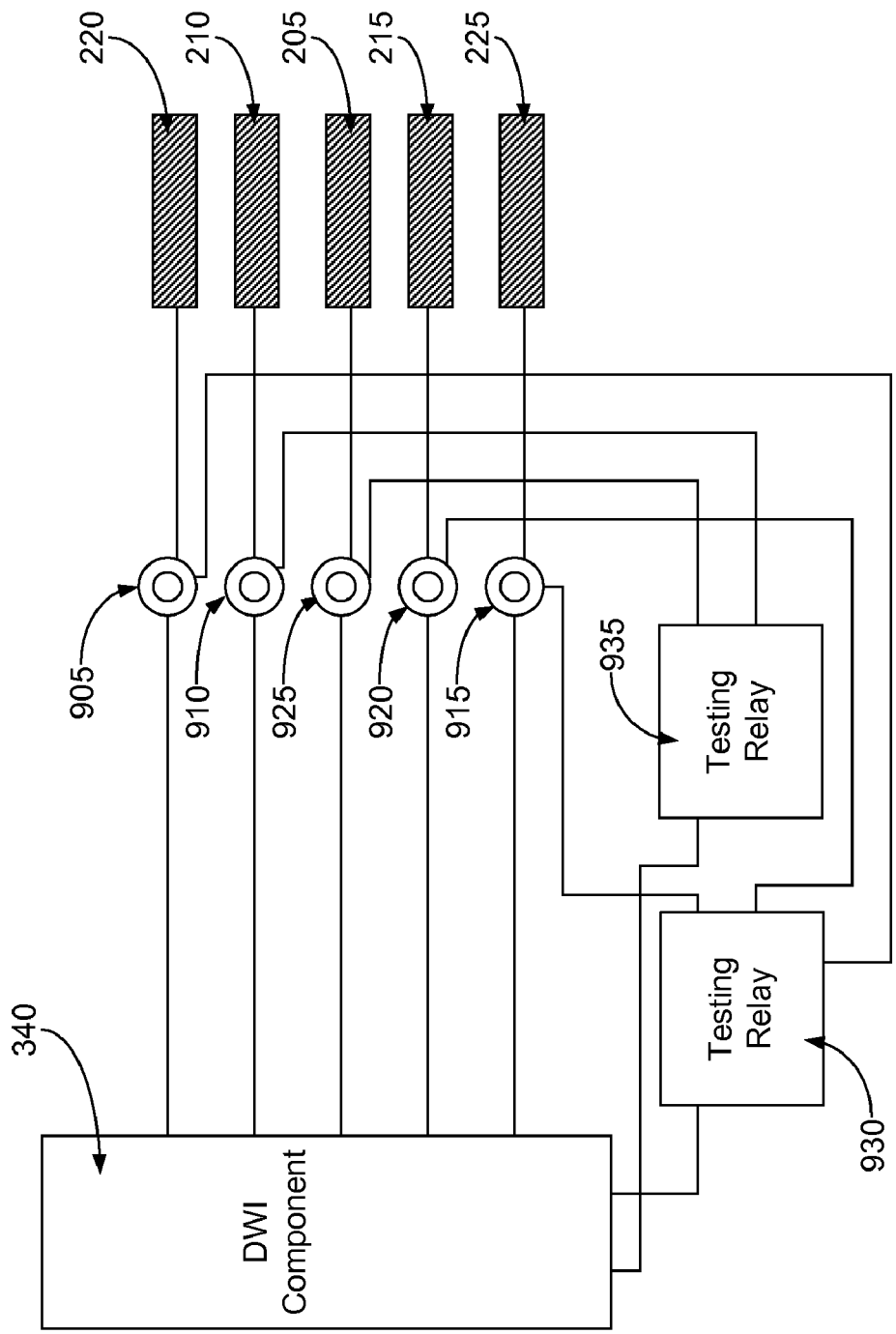
FIG. 9C is a schematic diagram of an example current-based load side wire integrity component that utilizes testing relays in monitoring a wire for miswires and inter-layer shorts, according to an embodiment of the invention.

Additionally, the current-based method of the DWI component 340 may utilize one or more testing relays in conjunction with monitoring the sense circuits 915, 920, 925 for a return signal. The testing relays may be used to short one or more conductors or layers of the flat wire 105 together when making a measurement. The shorts created by the testing relays may assist in measuring the current across any two conductors of the flat wire 105. Accordingly, the testing relays may assist in locating or identifying conductors that have been miswired and/or in localizing flat wire faults. As an example, two testing relays 930, 935 may be used by the DWI component 340 in conjunction with monitoring the flat wire 105 for miswires and inter-layer shorts. FIG. 9C is a schematic diagram of one example of a DWI component 340 that utilizes testing relays 930, 935 in monitoring a flat wire 105 for miswires and inter-layer shorts according to certain embodiments of the invention. As shown in FIG. 9C, when neither of the testing relays 930, 935 is actuated or, in other words, neither of the testing relays 930, 935 is in a closed position, a default state may exist in which both the grounding loop and the return loop are allowed to be completed on the flat wire 105. While neither of the testing relays 930, 935 is actuated, the DWI component 340 may test the flat wire 105 for complete grounding and return conductor loops. When the first testing relay 930 is actuated or in a closed position, the return excitation circuit 910 may be connected or shorted to the ground sense circuit 915, thereby creating half of a loop necessary to check for an inter-layer short between one or more of the return conductors 210, 215 and one or more of the grounding conductors 220, 225. If an inter-layer short exists between one or more of the return conductors 210, 215 and one or more of the grounding conductors 220, 225, then the loop will be complete and the DWI component 340 will detect the inter-layer short. Similarly, when the second testing relay 935 is actuated or in a closed position, the return excitation circuit 910 may be connected or shorted to the electrifiable or hot sense circuit 925, thereby creating half of a loop necessary to check for an inter-layer short between one or more of the return conductors 210, 215 and the electrifiable conductor 205. If an inter-layer short exists between one or more of the return conductors 210, 215 and the electrifiable conductor 205, then the loop will be complete and the DWI component 340 will detect the inter-layer short. When the DWI component 340 completes its testing, then both testing relays 930, 935 may be de-energized back to their original or default states.

Figure 10:
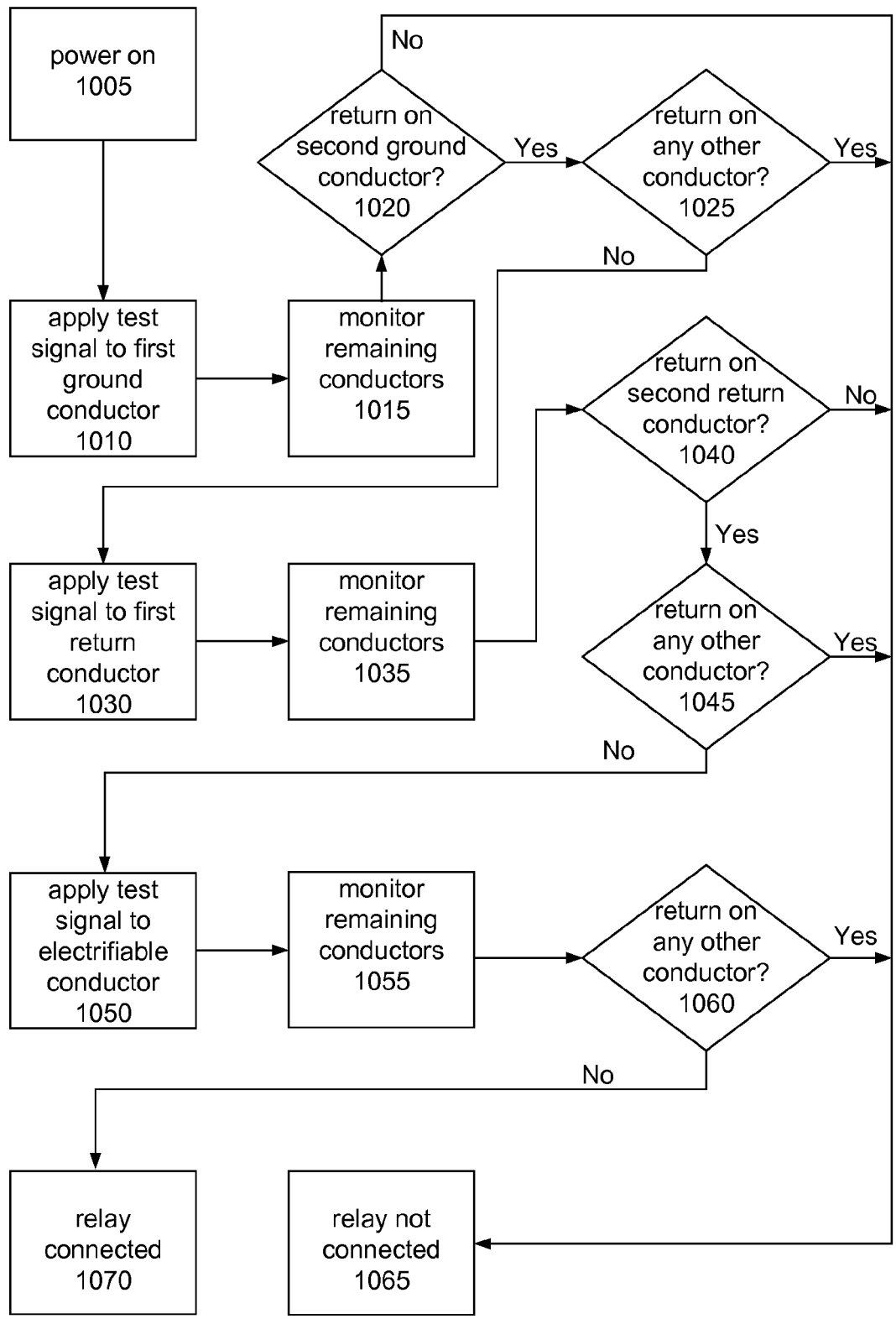
FIG. 10 is a flowchart of one example of the operation of a load side wire integrity component, according to an illustrative embodiment of the invention.

FIG. 10 is a flowchart of one example of the operation of a current-based detection method by a DWI component 340, according to an illustrative embodiment of the invention. The flowchart of FIG. 10 may be associated with the current-based detection method and circuitry described above with reference to FIG. 9B. Thus, the flowchart of FIG. 10 may be applicable to testing flat wire 105; however, a similar method may be utilized to test conventional wire 107. With reference to FIG. 10, if power is applied to the DWI component 340 at block 1005, then the DWI component 340 may go to block 1010. At block 1010, the DWI component 340 may apply a test signal to the first grounding conductor 220 of the flat wire 105. Then, the DWI component 340 may go to block 1015 and monitor the remaining conductors of the flat wire 105 for a return signal. At block 1020, the DWI component may determine whether the grounding conductor loop has been terminated properly by determining whether or not an appropriate return signal is present on the second grounding conductor 225. If the grounding conductor loop is not determined to be properly terminated, then the DWI component 340 may go to block 1065 and prevent the relay 310 from being closed to prevent electrification of the flat wire 105. If, however, the grounding conductor loop is determined to be properly terminated at block 1020, then the DWI component 340 may go to block 1025. At block 1025, the DWI component 340 may determine whether or not a short circuit exists between the grounding conductors 220, 225 and any of the other conductors of the flat wire 105 by determining whether or not a return signal is present on one or more of the electrifiable conductor 205, the first return conductor 210, and the second return conductor 215. If a return signal is detected on any of the conductors other than the grounding conductors 220, 225, a wire fault may be present on the flat wire 105, and the DWI component 340 may go to block 1065 and prevent the relay 310 from being closed to prevent electrification of the flat wire 105. If, however, no return signal is detected on any of the conductors other than the grounding conductors 220, 225, then the DWI component may go to block 1030.

At block 1030, the DWI component 340 may apply a test signal to the first return conductor 210 of the flat wire 105. Then, the DWI component 340 may go to block 1035 and monitor the remaining conductors of the flat wire 105 for a return signal. At block 1040, the DWI component determines whether the return conductor loop has been terminated properly by determining whether or not an appropriate return signal is present on the second return conductor 215. If the return conductor loop is not determined to be properly terminated, then the DWI component 340 may go to block 1065 and prevent the relay 310 from being closed to prevent electrification of the flat wire 105. If, however, the return conductor loop is determined to be properly terminated at block 1040, then the DWI component 340 may go to block 1045. At block 1045, the DWI component 340 may determine whether or not a short circuit exists between the return conductors 210, 215 and any of the other conductors of the flat wire 105 by determining whether or not a return signal is present on one or more of the electrifiable conductor 205, the first grounding conductor 220, and the second grounding conductor 225. If a return signal is detected on any of the conductors other than the return conductors 210, 215, then a wire fault may be present on the flat wire 105, and the DWI component 340 may go to block 1065 and prevent the relay 310 from being closed to prevent electrification of the flat wire 105. If, however, no return signal is detected on any of the conductors other than the return conductors 210, 215, then the DWI component may go to block 1050.

At block 1050, the DWI component 340 may apply a test signal to the electrifiable conductor 205 of the flat wire 105. Then, the DWI component 340 may go to block 1055 and monitor the remaining conductors of the flat wire 105 for a return signal. At block 1060, the DWI component 340 may determine whether or not there is a return signal in any of the other conductors of the flat wire 105. A return signal in any of the other conductors may indicate a miswire of the electrifiable conductor 205 or a short between the electrifiable conductor 205 and one of the other conductors of the flat wire 105. If, at block 1060, a return signal is detected on one of the other conductors of the flat wire 105, then the DWI component 340 may go to block 1065 and prevent the relay 310 from being closed to prevent electrification of the flat wire 105. If, however, no return signal is detected on any of the other conductors of the flat wire 105 at block 1060, then the DWI component 340 may go to block 1070 and allow the relay 310 of the ASD 100 to be closed. Alternatively, a DWI component flag or state may be set, and the flag or state may be used by the ASD 100 in conjunction with the flags or states from other tests to determine whether or not the relay 310 is allowed to close.

The tests performed by the current-based method of the DWI component 340 do not necessarily have to be performed in the order set forth in the logic of FIG. 10, but instead may be performed in any suitable order. Additionally, the DWI component 340 does not have to conduct each test set forth in FIG. 10, but instead may conduct less than all of the tests set forth in FIG. 10. If any test results in the execution of block 1065, then the DWI component 340 may still perform the remaining tests and may record the outcome of each test, or at least the ones that result in a positive miswire or fault indication. Additionally, if a miswire or fault is detected by the DWI component 340, an indicator may be stored by the DWI component 340 or by the control unit 312, and the indicator may include information as to which test(s) resulted in the detection of a miswire. This indicator may then be transmitted by the ASD 100 to another device such as a second ASD 100, a central monitoring device, or a computer. The DWI component 340 and/or the control unit 312 may also cause additional data, for example, measurements data taken by the components of the DWI component 340, to be stored in an appropriate memory, such as the memory 405 of the control unit 312.

Figure 11:
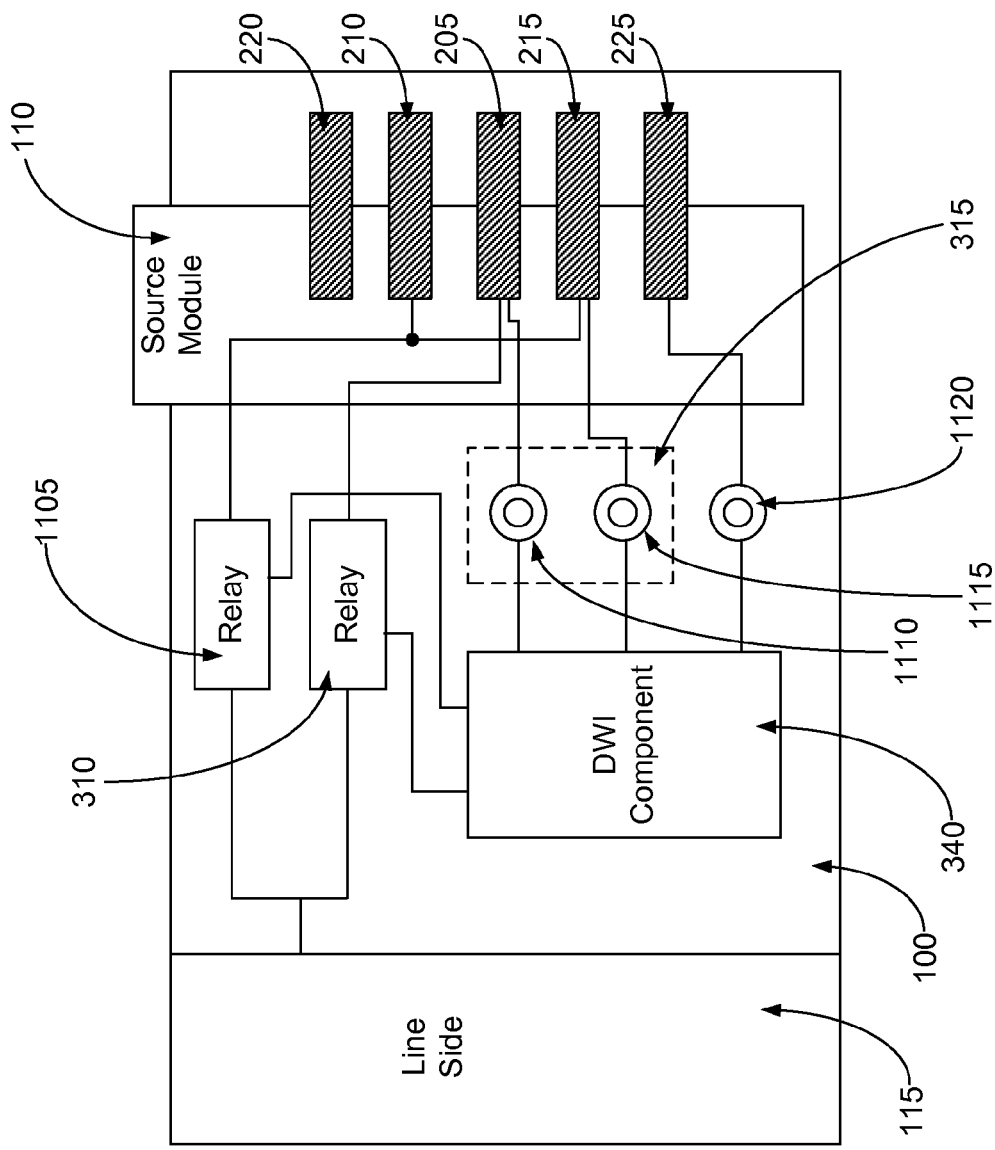
FIG. 11 is a schematic diagram of another example load side wire integrity component that may be incorporated into an ASD, according to an illustrative embodiment of the invention.

FIG. 11 is a schematic diagram of an alternative DWI component 340 that may be incorporated into an ASD 100, according to an embodiment of the invention. As shown, the ASD 100 may include more than one relay 310, 1105 that may be utilized to test the flat wire 105. With reference to FIG. 11, the ASD 100 may control the actuation of a first relay 310 in order to control the communication of an electrical power signal from the line side power source 115 to the electrifiable conductor 315 of the flat wire 105. The ASD 100 may also control the actuation of a second relay 1105 in order to control the communication of an electrical signal from the line side power source 115 to one or more return conductors 210, 215 of the flat wire 105. According to an aspect of the invention, the two relays 310, 1105 may be actuated independently of one another. For example, the second relay 1105 may be utilized in association with the DWI component 340 in order to test the flat wire 105 for miswires and/or wire faults. The second relay 1105 may be closed for a predetermined period of time, for example, one half cycle of the electrical power signal of the line side power source 115, thereby allowing an electrical signal to be communicated onto one or more of the return conductors 210, 215. In certain embodiments, the electrical signal communicated onto one or more of the return conductors 210, 215 may be the electrical power signal communicated from the line side power source 115 or, alternatively, the electrical signal may be an altered version of the line side power source signal. For example, the line side power source signal may be stepped down or stepped up by an appropriate transformer and/or current limited by an appropriate resistor device prior to being communicated onto one or more of the return conductors 210, 215.

Once an electrical signal has been communicated onto one or more of the return conductors 210, 215 of the flat wire 105, one or more sensors 1110, 1115, 1120 associated with the DWI component 340 may be utilized to test the flat wire 105 for return signals. The one or more sensors 1110, 1115, 1120 may be appropriate voltage or current sensors, as previously discussed. For example, the one or more sensors 1110, 1115, 1120 may be current transformers. As shown in FIG. 11, one or more sensors 1110, 1115, 1120 may be utilized to test the electrifiable conductor 205, one or more of the return conductors 210, 215, and one or more of the grounding conductors 220, 225 for return signals. Because the return conductors 210, 215 and the grounding conductors 220, 225 form respective loops if they are properly terminated at the destination module 120, in certain embodiments, a single sensor may be respectively utilized for each pair of conductors. Additionally, in certain embodiments, the sensors 1110, 1115 utilized to test for a return signal on the electrifiable conductor 205 and one or more of the return conductors 210, 215 may be the current sensors utilized by the GFCI component 315.

The DWI component 340 of FIG. 11 may test the flat wire 105 for miswires and/or wire faults in a similar manner to that described above for the return conductors with reference to FIG. 10. For example, following the communication of an electrical signal onto one or more of the return conductors 210, 215, miswires and/or wire faults may be identified by the return signals that are detected by the one or more sensors 1110, 1115, 1120. If a return signal is detected on the electrifiable conductor 205 and/or one or more of the grounding conductors 220, 225, then a miswire and/or wire fault may be present on the flat wire 105. Additionally, if an electrical signal is applied to the first return conductor 210 and a return signal is not detected on the second return conductor 215, then a miswire may be identified in the flat wire 105.

The ASD 100 may include any number of relays and an electrical signal may be communicated onto any conductor(s) of the flat wire 105 for testing. For example, a relay may be utilized to allow an electrical signal to be communicated onto one or more of the grounding conductors 220, 225 of the flat wire 105, and the flat wire 105 may be tested for return signals in a similar manner as that described above with reference to FIG. 11. The use of more than one relay may assist in preventing bounce and wear and tear on one or more of relays. For example, if a relay 1105 is utilized to control the communication of an electrical signal onto one or more of the return conductors 210, 215, then the relay 1105 may not be subject to the bounce and/or wear and tear that the relay 310 utilized in association with the electrifiable conductor 205 is subject to.

Figure 12:
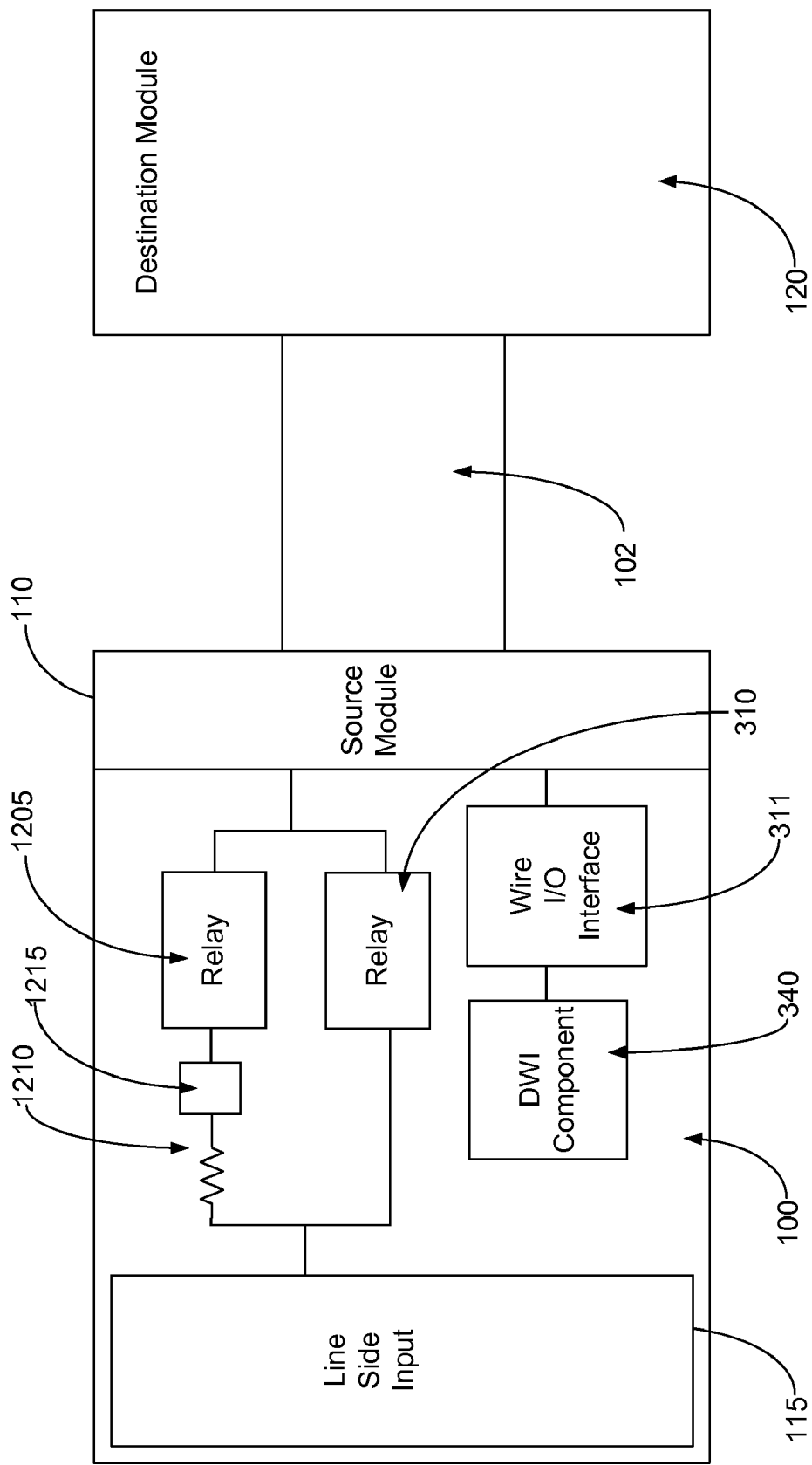
FIG. 12 is a schematic diagram of another example load side wire integrity component that may be incorporated into an ASD, according to an illustrative embodiment of the invention.

FIG. 12 is a schematic diagram of an ASD 100 and a DWI component 340 that may be utilized to detect high impedance shorts or wire faults in a wire 102, according to an embodiment of the invention. The ASD 100 and DWI component 340 illustrated in FIG. 12 may be used to test many different types of wires, such as an electrical flat wire 105 or a conventional wire 102. With reference to FIG. 12, more than one relay 310, 1205 may be incorporated into the ASD 100. A first relay 310 may be utilized to control the communication of an electrical power signal from the line side power source 115 onto the wire 102. A second relay 1205 may be utilized to control the communication of a test signal onto the wire 102. The test signal may be a current limited version of the electrical power signal. For example, the electrical power signal may be passed through an appropriate resistance device 1210 (e.g., a resistor) in order to limit the current of the termination test signal. As desired, the current may be limited to any appropriate value, for example, a current that is between approximately 6 mA and approximately 100 mA. According to an aspect of the invention, the current may be limited to approximately 20 mA. Additionally, other parameters of the test signal may be altered by appropriate circuitry 1215. For example, the voltage of the test signal may be altered before it is communicated onto the wire 102. As an example, the voltage of the test signal may be stepped up to a higher voltage value by a suitable transformer before it is communicated onto the flat wire 100. As another example, the voltage of the test signal may be increased before it is communicated onto the flat wire 100 by an appropriate inversion technique. According to an aspect of the invention, the test signal may have a voltage that is between approximately 120 V and approximately 1000 V, although higher voltage values may be used. Additionally, as desired, the test signal may be either an alternating current signal or a direct current signal, for example, a direct current signal that is obtained by rectifying the electrical power signal received from the line side power source 115. Furthermore, the test signal may have virtually any frequency. For example, the test signal may have a frequency between approximately 50 Hz and approximately one (1) MHz. According to an aspect of the invention, the test signal may have a frequency of approximately 30 KHz.

The use of a high voltage test signal may assist in detecting high impendence shorts or wire faults on the wire 102. For example, a high voltage test signal may assist in detecting an arc flash or other arcing condition on a flat wire 105. The use of a current limited signal may provide for additional safety if there is a wire fault on the wire 102. Additionally, the use of the test signal described with reference to FIG. 12 by the ASD 100 to test the wire 102 may be used as a proactive safety test independently of or in addition to one or more of the other proactive safety tests described herein or apparent to one or ordinary skill in the art.

The test signal may be communicated onto one or more of the conductors of the flat wire 105 by closing the second relay 1205. The second relay 1205 may be closed for a predetermined period of time. Virtually any predetermined period of time may be utilized as desired. Additionally, the test signal may be communicated onto any of the conductors of the wire 102. For example, the test signal may be communicated onto one or more of the return conductors 210, 215 of a flat wire 105, as discussed above with reference to FIG. 11. As another example, the test signal may be communicated onto one or more of the grounding conductors 220, 225 of a flat wire 105. As yet another example, the test signal may be communicated onto the electrifiable conductor 205 of a flat wire 105. Other examples include the communication of a test signal onto at least one conductor of a conventional wire 107, such as onto the electrifiable conductor 250, onto the return conductor 255, or onto the grounding conductor 260. After the test signal has been communicated onto one or more conductors of the wire 102, the DWI component 340 may monitor one or more conductors of the wire 102 for a return signal in a similar manner as that discussed above with reference to FIG. 11. The detection of a return signal may indicate the presence of a miswire and/or a wire fault on the wire 102. For example, if the test signal is communicated onto the first return conductor 210 of a flat wire 105, then the detection of a return signal on the electrifiable conductor 205 and/or one or more of the grounding conductors 220, 225 may indicate a miswire and/or a wire fault on the flat wire 105. If a miswire or wire fault is detected by the DWI component 340, then the relay 310 may be maintained in an opened position, thereby preventing the full electrification of the monitored wire 102. Additionally, the second relay 1205 may be maintained in an opened position. If, however, no miswires or wire faults are detected by the DWI component 340, then the first relay 310 may be permitted to be closed, thereby allowing the full electrification of the wire 102.

As previously mentioned, additional tests may be conducted on the electrifiable conductor of a monitored wire 102, such as the electrifiable conductor 205 of a flat wire 105 or the electrifiable conductor of a conventional wire 107, in order to determine that the electrifiable conductor has been properly terminated. These additional tests are described herein as reactive tests; however, proactive tests may also be utilized prior to the full electrification of the wire 102. These tests may also be associated with the load side wire integrity. Accordingly, the DWI component 340 may include both reactive and proactive elements.

Figure 13:
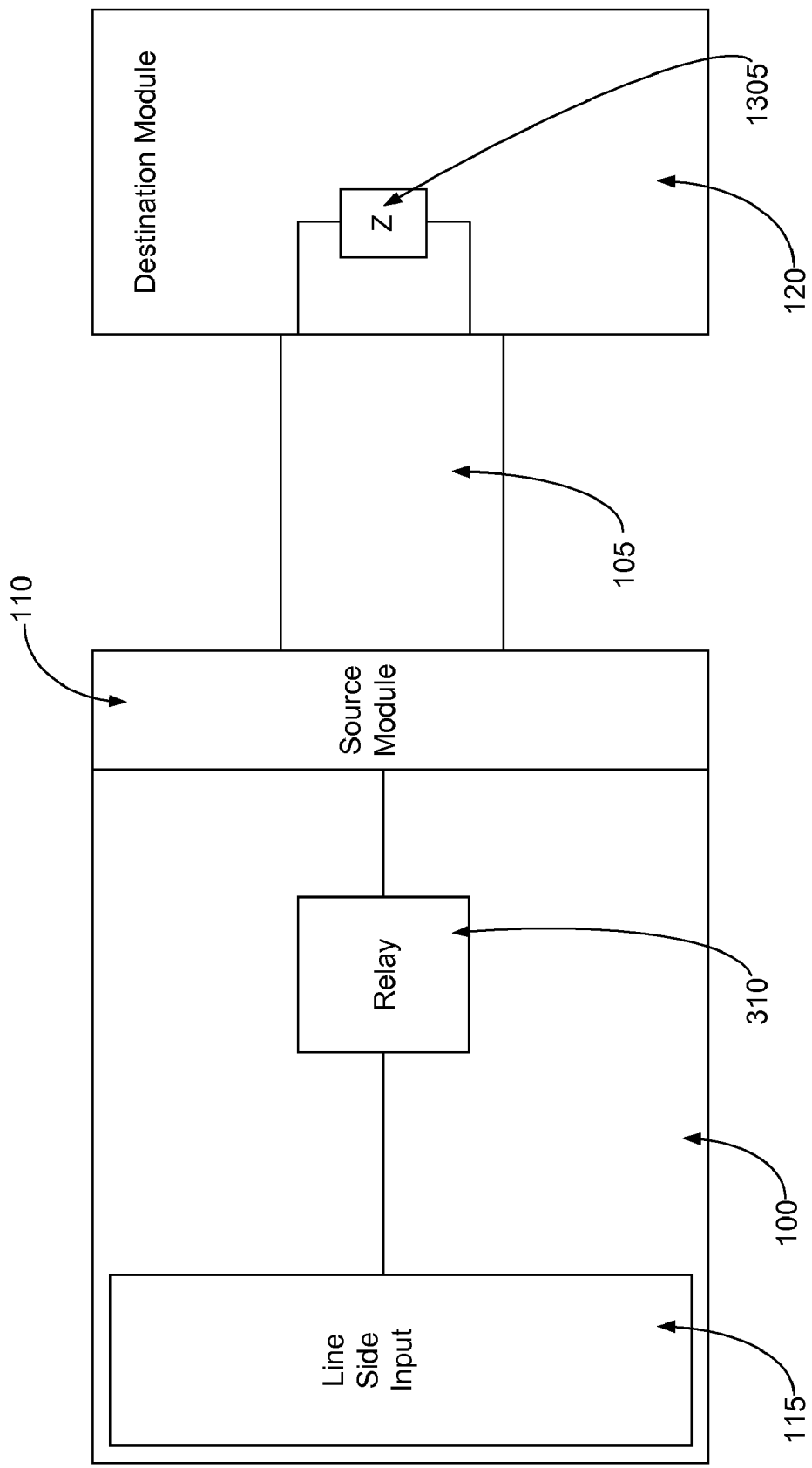
FIG. 13 is a schematic diagram of an example circuit that may be utilized to test for a wire connection at a destination module, according to an embodiment of the invention.

FIG. 13 is a schematic diagram of one example circuit that may be utilized to test for a proper flat wire termination at a destination module 120, according to an embodiment of the invention. FIG. 13 is described herein with reference to flat wire, such as a flat electrical wire 105; however, a similar circuit may be utilized to test other types of wire, such as a conventional wire 107. With reference to FIG. 13, during the electrification of the flat wire 105 and/or after the electrification of the flat wire 105, the ASD 100 may test for a proper termination of the electrifiable conductor 205. In other words, once the relay 310 has been closed, the ASD 100 may test for an appropriate return signal that indicates that the electrifiable conductor 205 is properly terminated at the destination module 120. In order to test for a proper termination of the electrifiable conductor 205 at the destination module 120, an electrical load 1305 may be incorporated into the destination module 120. The electrical load 1305 may be a passive load that is detectable by the ASD 100, for example, one or more LED's, one or more resistors, and/or one or more capacitors. The electrical load 1305 may be connected between the electrifiable conductor 205 and one or more of the return conductors 210, 215 of the flat wire 105. The electrical load 1305 may have virtually any total impedance that is discernable by one or more current sensing devices included in the ASD 100.

Once the relay 310 has been closed and an electrical power signal is communicated onto the flat wire 105, the electrical load 1305 may operate to generate a current on the flat wire 105 that may be detectable by appropriate current sensors of the ASD 100, for example, the current sensors utilized in association with the DWI component 340. The generated current may then be detected by one or more appropriate current sensors associated with the ASD 100 and, based at least in part on the amplitude of the detected current, a determination may be made as to whether the electrifiable conductor 205 and/or one or more of the return conductors 210, 215 have been properly terminated. In other words, if the detected current is above a predetermined threshold value, it may be determined that the electrifiable conductor 205 and/or one or more of the return conductors 210, 215 have been properly terminated. If, however, the detected current is below the predetermined threshold value, it may be determined that the electrifiable conductor 205 and/or one or more of the return conductors 210, 215 are not properly terminated, and the relay 310 may be opened, thereby de-energizing the flat wire 105. Many different predetermined threshold values may be utilized in accordance with the invention, for example, a predetermined threshold value of approximately 20 mA. If an electrical device, such as a lamp or a vacuum cleaner is connected to the destination module 120, then a greater electrical load 1305 may be present on the flat wire 105. As discussed earlier, the over-current protection component 325 may de-energize the flat wire 105 if the current on the flat wire 105 exceeds a maximum allowed current, for example, a current of approximately 15 A.

As an example, once the flat wire 105 has been fully electrified, a 120 VAC signal may be communicated over the electrifiable conductor 205 to the destination module 120. The 120 VAC signal may then be communicated through an electrical load 1305 that is connected between the electrifiable conductor 205 and one or more of the return conductors 210, 215 in the destination module 120, thereby generating a current on the flat wire 105. The current may then be detected at the ASD 100 and compared to a predetermined threshold value in order to verify that the flat wire 105 is terminated properly. If an LED is utilized as part of the electrical load 1305 in the destination module 120, the LED may also provide a visual indication of a proper termination for the flat wire 105. Furthermore, as desired, a similar test as that discussed above with reference to FIG. 13 for the electrifiable conductor 205 may also be conducted on one or more of the other conductors of the flat wire 105.

Although the tests to detect a properly terminated electrifiable conductor are described above as reactive tests, one or more proactive tests may additionally or alternatively be utilized prior to the full electrification of the flat wire 105. For example a voltage test signal may be communicated onto the electrifiable conductor 205 of the flat wire 105 and the voltage test signal may be communicated through a passive load in the destination module 120 prior to being returned to the ASD 100. The passive load may cause a detectable voltage drop in the flat wire 105. An appropriate voltage sensor in the ASD 100 may then detect the voltage drop across the passive load and determine whether or not the electrifiable conductor 205 has been properly terminated.

The destination module 120 may include an appropriate relay that may prevent the voltage test signal from being communicated to an electrical device, such as a lamp or vacuum cleaner. In other words, the passive load may be the only load connected to the flat wire 105 at the destination module 120 during the proactive testing of the flat wire 105. If the voltage of the termination test signal has been stepped up prior to being communicated onto the flat wire 105, it may be easier to detect the electrical load 100. Based at least in part on the voltage detected at the ASD 100, the DWI component 340 and/or the control unit 312 may determine whether or not the electrifiable conductor 205 has been properly terminated. As desired, other conductors of the flat wire 105 may be tested for proper termination utilizing appropriate voltage signals.

As desired in various embodiments, other safety components may be included or incorporated into or associated with the ASD 100. The safety components described herein are merely examples of safety components that may be associated with the ASD 100. Other safety components will be readily apparent to those of ordinary skill in the art. Additionally, the various safety components may incorporate, include, and/or be associated with a wide variety of different logic, software modules, software components, firmware, hardware components, and/or circuitry as desired in various embodiments of the invention.

Additionally, in certain embodiments of the invention, a variety of safety components or other features may be included in a destination device 117. As discussed above, a destination device 117 may include a passive load that assists in the testing of the proper termination of the flat wire 105. The destination device 117 may also include one or more safety components that may be utilized to test wire, such as flat wire 105 or conventional wire 107, that has been connected downstream from the destination device 117, as discussed below with reference to FIG. 19. The one or more safety components that may be included may be similar to one or more of the safety components discussed above for the ASD 100. A destination device 117 may also include a light emitting diode (LED) or another suitable device that may indicate to a user when power is being supplied to the destination device 117. A destination device 117 may also include suitable surge protection devices and associated fuses that may prevent a dangerous high current signal from being passed through the destination device 117. For example, the destination device 117 may include a suitable surge protection device between the electrifiable conductor 205 and the return conductors 210, 215 of a flat wire 105. As another example, the destination device 117 may include a suitable surge protection device between the electrifiable conductor 205 and the grounding conductors 220, 225 of a flat wire 105. As other examples, suitable surge protection may be included between the electrifiable conductor 250 and the return conductor 255 of a conventional wire 107 or, similarly, between the electrifiable conductor 250 and the grounding conductor 260 of a conventional wire 107.

A destination device 117 and/or the ASD 100 may also include a battery backup that permits at least the conducting of proactive tests on the wire 102 in the event of a power outage. The battery backup may be any type of suitable battery, such as a rechargeable battery that may be charged while power is provided to the ASD 100 and/or the destination device 117 from the line side power source 115. Additionally, as previously mentioned, a destination device 117 and/or the ASD 100 may include any number of electrical sockets. Other features that may be incorporated into a destination device 117 will be apparent to those of ordinary skill in the art.

Safety is an important consideration in the design of wiring systems that can carry dangerous voltage levels, especially when there is a possibility of a penetration of an electrifiable conductor, such as the electrifiable conductor 205 of a flat wire 105. Penetration or compromise of a flat wire 105 by objects such as nails, screws, drill bits, knife blades, saw blades, scissors, staples, darts, bullets, toys, etc. should be considered.

The flat wire 105 described herein, for purposes of disclosing the invention, may itself be designed to be safe if it is penetrated. Fire protection and electric shock safety are based on limiting the voltage, and therefore the current in the flat wire 105 while expediting the trip time of a primary safety device such as a circuit breaker or a fuse in a branch circuit main box. Secondary protection may also be provided by the ASD 100 of the invention.

The flat wire 105 may be designed to produce a short between a first grounding conductor 220, a first return conductor 210, an electrifiable conductor 205, a second return conductor 215, and a second grounding conductor 225 (G-N-H-N-G) in that sequence upon penetration. With as much as four times the conductance ultimately tied to earth ground, a voltage divider is formed favoring the ground voltage over the line or hot voltage. Repeated tests show that voltages present at the site of penetrations of the flat wire 105 do not exceed approximately 50 VAC for longer than a primary safety device's trip time, which is typically under 25 milliseconds. Furthermore, the voltage present at the site of penetrations does not exceed approximately 50 VAC for longer than the trip time of a secondary safety device such as the ASD 100, which may be approximately 8 milliseconds.

Penetration may occur through the broadside or the flat surface of a flat wire 100 by sharp objects. Alternatively, penetration may occur through an edge of the flat wire 100 by an object such as a knife blade or drywall saw. In either situation, the resulting short may cause a high current to be produced at a low voltage for a short time (less than the trip time). Startle effect, or sound burst, and localized heating may be minimized due to the nature of the protective layered flat wire 105.

FIGS. 14A-F are a series of diagrams which depict an example of the dynamics of a nail or tack penetration of a live multi-planar flat wire 105. Again, protective layered flat wire 105 has a distinct advantage over conventional wire by assuring that a penetrating object 1400, such as a nail, first passes through a grounding conductor (G1) 220, then a return or neutral conductor (N1) 210 prior to any contact with the hot electrifiable conductor 205.

FIG. 14A depicts a situation in which a penetrating object 1400 has only penetrated one grounding conductor 220 of the flat wire 105. Similarly, FIG. 14B depicts a situation in which a penetrating object 1400 has penetrated only one grounding conductor 220 and one return conductor 210. In both FIGS. 14A and 14B, the electrifiable conductor 205 has not yet been penetrated. Accordingly, in both FIGS. 14A and 14B, there may be no voltage or current present on the penetrating object

1400. Additionally, the current present on the electrifiable conductor 205 of the flat wire 105 may be some normal load current. The normal load current present on the electrifiable conductor 205 may be a current which is less than approximately 15 amps in a standard United States branch application or which is less than approximately 6 amps in a standard European branch application.

FIG. 14C depicts a situation in which the penetrating object 1400 has shorted the electrifiable conductor 205, one of the return conductors 210 and one of the grounding conductors 220. Similarly, FIG. 14D depicts a situation in which the penetrating object 1400 has shorted the electrifiable conductor 205, both of the return conductors 210, 215 and one of the grounding conductors 220. FIG. 14E depicts a situation in which the penetrating object 1400 has shorted the electrifiable conductor 205, both of the return conductors 210, 215 and both of the grounding conductors 220, 225. In each of FIGS. 14C-14E, the short circuit created in the flat wire 105 between the electrifiable conductor 205 and any of the other conductors 210, 215, 220, 225 may act as a voltage divider until a primary safety device such as a circuit breaker or a secondary safety device such as an ASD 100 trips. In each of FIGS. 14C-14E, there may be a relatively low voltage present on the penetrating object 1400. The low voltage may be less than approximately 50 VAC on a standard 120 VAC wire, and the low voltage may be less than approximately 100 VAC on a standard 240 VAC line. Additionally, in each of FIGS. 14C-14E, the current present on the electrifiable conductor 205 may exceed approximately 100 amps until the primary or secondary safety device (ASD) 100 trips. There also may be a current present on either of the grounding conductors 220, 225 and/or on either of the return conductors 210, 215 which will also facilitate the tripping of the ASD 100.

The time for penetrating from an outer grounding layer 220 to an electrifiable conductor 205 (FIGS. 14A-14C) may typically be under one millisecond, which is only a fraction of a typical trip time for a primary safety device such as a circuit breaker. Similarly, the time to continue penetration from an electrifiable conductor 205 to the backside grounding layer 225 (FIGS. 14C-14E) may also be relatively short. The short circuit created during the penetration may be of a continuous nature. The continuous nature of the short circuit may be due to two primary factors: firstly, the conductor contact at the sides of the penetrating object 1400 is maintained by the insulation displacement process during penetration and secondly, by the molten copper in the proximity of the contact area once the short begins.

FIG. 14F depicts a penetration after a penetrating object 1400 has been removed from the flat wire 105. If the circuit breaker has been reset prior to the flat wire 105 being electrified, then some additional damage may be done to the flat wire 105 before the circuit breaker trips again; however, if an ASD 100 is connected to the flat wire 105, then any additional damage may be prevented. The proactive safety components of the ASD 100 may determine that a fault exists on the flat wire 100 prior to allowing the flat wire 100 to be fully electrified. For example, when testing the flat wire 105 prior to electrification, the DWI component 340 of the ASD 100 may determine that a short exists between the conductors or layers of the flat wire 105. The ASD 100 will then prevent the flat wire 100 from being electrified.

Figure 15:
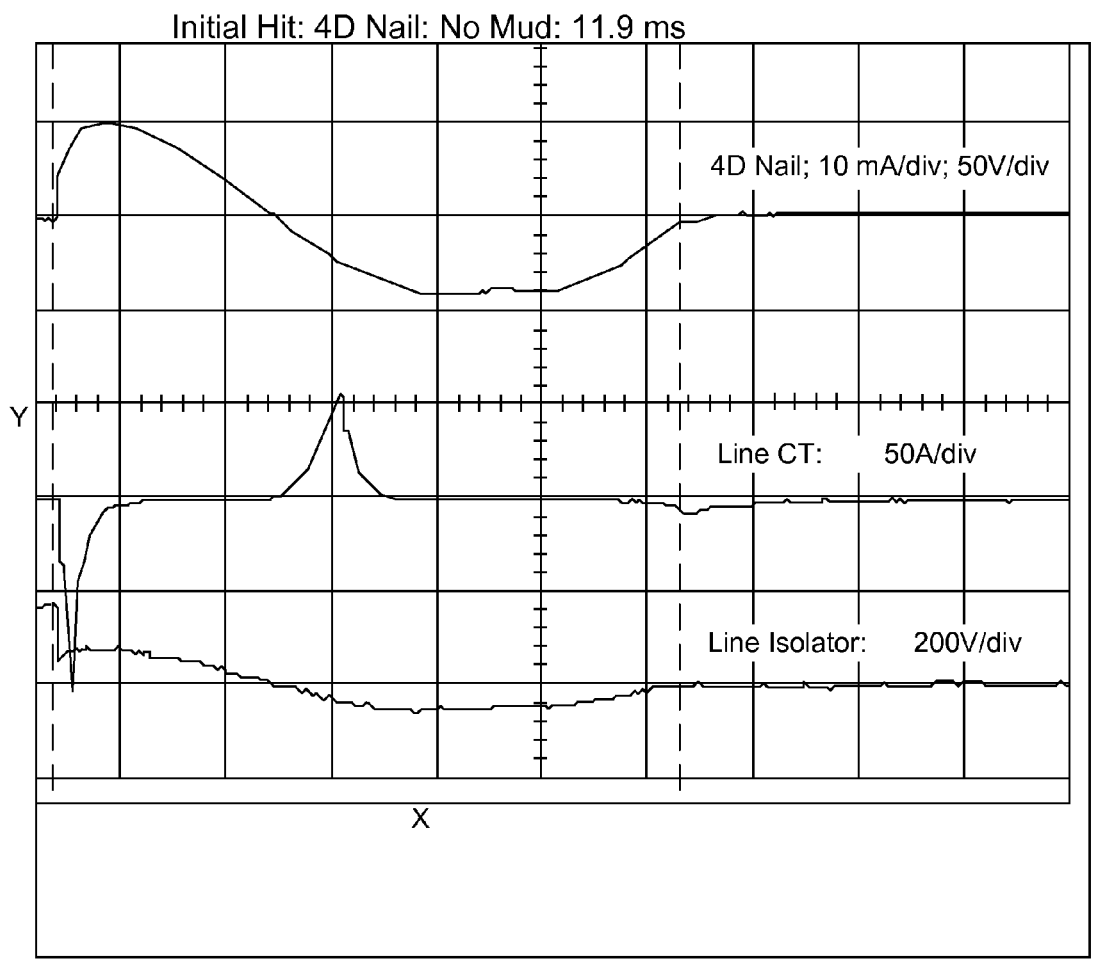
FIG. 15 is a representative graph of the voltage and current waveforms present during a penetration of a flat wire by a nail as provided for in FIGS. 13A-13F.

FIG. 15 is a representative graph of the voltage and current waveforms present during a penetration of a flat wire 105. The voltage waveform present on the penetrating object 1400 and current waveform present on the electrifiable conductor 205 may be captured by an oscilloscope, such as a Gould Ultima 500 oscilloscope. For this example, the penetrating object 1400 was a nail of a 4d common size and the circuit breaker used was a common 20 amp GE circuit breaker. As shown by FIG. 14, the trip time for the circuit breaker may be approximately 12 to 25 milliseconds when the penetrating object 1400 penetrates the flat wire 105. Note that the circuit breaker trip time may be less than the period for one cycle of a standard 120 VAC, 60 Hz electrical wire. The trip time for an ASD 100 connected to the flat wire 105 may also be less than the period for one cycle of a standard 120 VAC, 60 Hz electrical wire. Additionally, the trip time of the ASD 100 may be less than the trip time of the circuit breaker. The trip time of the ASD 100 may be, for example, approximately 8 milliseconds or less, causing the ASD 100 to trip before the tripping of the circuit breaker. After the ASD 100 trips, causing the flat wire 105 to be de-energized, the circuit breaker may or may not trip.

Figures 16A, 16B:
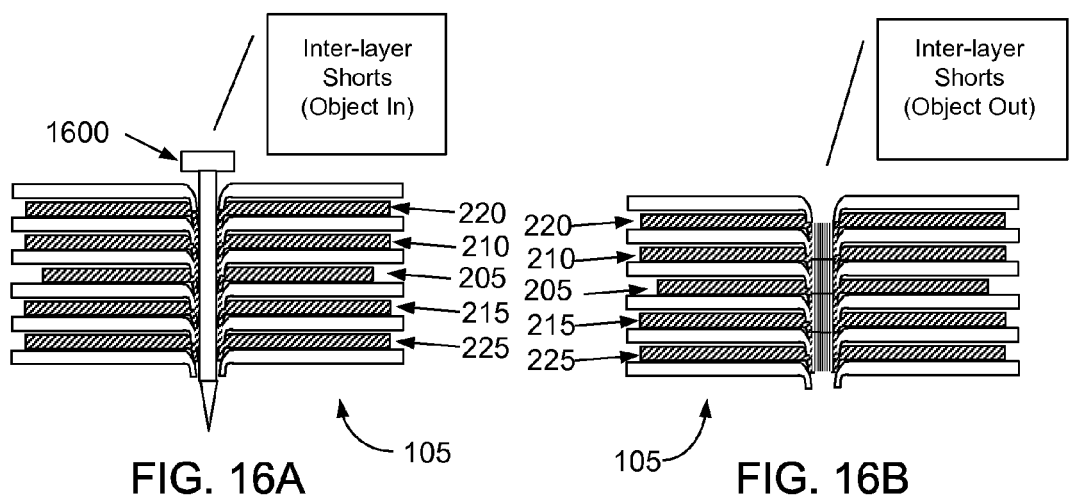
FIGS. 16A-16D are cross-sectional views depicting examples of the dynamics of a penetration of a non-live multi-planar flat wire.

FIGS. 16A-16D are a series of diagrams which depict examples of the dynamics of a penetration of a non-live multi-planar flat wire 105. FIG. 16A shows the inter-layer shorts that occur when a penetrating object 1600, such as a nail, penetrates the flat wire 105. Without electrification, the conductors of the flat wire 105 may not experience additional damage or fusion from high currents; however, multiple inter-layer shorts may be caused. FIG. 16B shows the residual inter-layer shorts after the penetrating object 1600 has been removed from the flat wire 105. The DWI component 340 of an ASD 100 connected to the flat wire 105 may be able to detect this inter-layer short prior to allowing the flat wire 105 to be fully electrified. The DWI component 340 may also be able to determine that the layer loops of the flat wire 105, such as the grounding layer loop or the return conductor layer loop, are incomplete prior to allowing the flat wire 105 to be fully electrified. The proactive safety components of the ASD 100 may prevent flashes or plumes (e.g., arc flashes) which may occur upon electrification of the flat wire 105 by recognizing defects prior to allowing the flat wire 105 to be fully electrified.

If the penetrating object 1600 penetrated the flat wire 105 after the flat wire 105 had been electrified, then the reactive safety components including the GFCI component 315 and the ground current monitoring component 330 may detect the flaw in the flat wire 105 and open the relay 310 of the ASD 100, thereby de-energizing the flat wire 105.

Figures 16C, 16D:
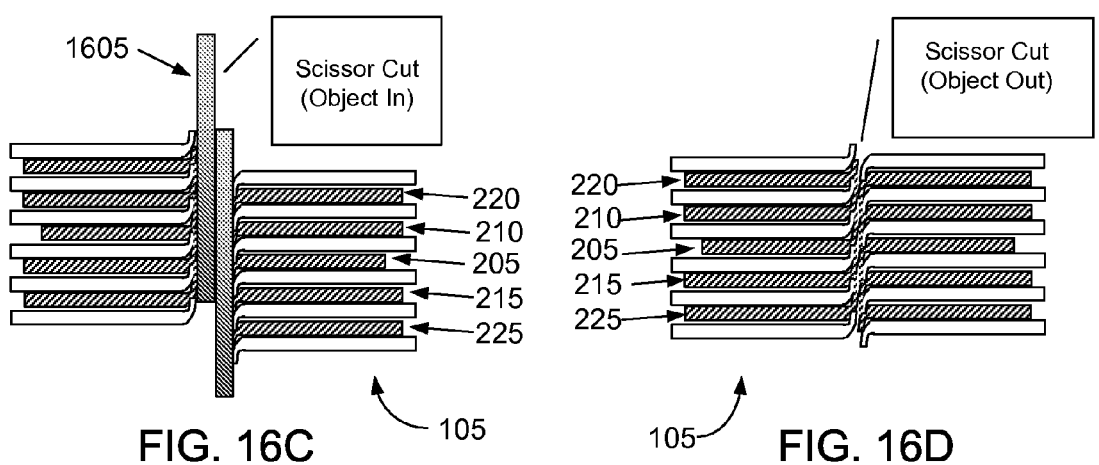

FIG. 16C depicts the transverse cut of a flat wire 105 by a cutting object 1605, such as a pair of scissors. In FIG. 16C, the cutting object 1605 is shown still in the flat wire 105 during the cut. FIG. 16D depicts how a partially cut flat wire 105 section would appear once the cutting object 1605 has been removed. The DWI component 340 of an ASD 100 connected to the flat wire 105 may be able to detect the inter-layer shorts created by the cutting object 1605 prior to allowing the flat wire to be fully electrified. Alternatively, the DWI component 340 may be able to determine that the layer loops of the flat wire 105, such as the grounding layer loop or the return conductor layer loop, are incomplete prior to allowing the flat wire 105 to be fully electrified. The proactive safety components of the ASD 100 may prevent flashes or plumes (e.g., arc flashes) which may occur on the flat wire 105 by recognizing defects prior to allowing the flat wire 105 to be fully electrified.

If the cutting object 1605 cuts the flat wire 105 after the flat wire 105 has been electrified, then the reactive safety components including the GFCI component 315 and the ground current monitoring component 330 may detect the flaw in the flat wire 105 and open the relay 310 of the ASD 100, thereby de-energizing the flat wire 105.

The various safety components of the ASD 100 may share various circuits. Although the various safety components are described herein as individual components, one or more of the safety components may utilize common circuits. For example, the ASD 100 may include only one excitation circuit and one sense circuit that is used as needed by each of the safety components of the ASD 100.

The sharing of circuits by the various components of the ASD 100 may facilitate the construction of a compact device. Accordingly, the ASD 100 may be placed in a compact enclosure such as in a wall box or cavity that is roughly the size of a common electrical outlet. For example, an ASD 100 may be placed in a wall cavity that is the size of the cavity used for an electrical outlet. The ASD 100 may be powered by a conventional in-wall electrical wire. Alternatively, an ASD 100 may be plugged into a conventional wall receptacle outlet and powered by that outlet. If the ASD 100 is to be plugged into an outlet, the source device 103 may include, for example, a plug, such as a traditional three-prong electrical plug, that may be inserted into the outlet. In such a situation, the plug would be the line side power source 115 for a wire system 101, and the line side power source 115 would be incorporated into the source device 103. A wire 102 may then be connected to and monitored by the ASD 100. Additionally, the ASD 100 may have auxiliary receptacles, or plugs, situated on the exterior surface of the ASD 100. These plugs may be common two-prong or three-prong plugs and may be used to power electronic devices.

According to an aspect of the invention, the ASD 100 may be configured to receive power and an electrical power signal from a line side power source 115 that is a standard electrical outlet. Additionally, the ASD 100 may be configured to prevent the communication of the electrical power signal onto the wire 102 without the electrical power signal first being communicated through the ASD 100. Accordingly, the ASD 100 may conduct one or more tests on the wire 102 prior to electrification of the wire 102, during the electrification of the wire 102 and/or subsequent to the electrification of the wire 102.

Figure 17A:
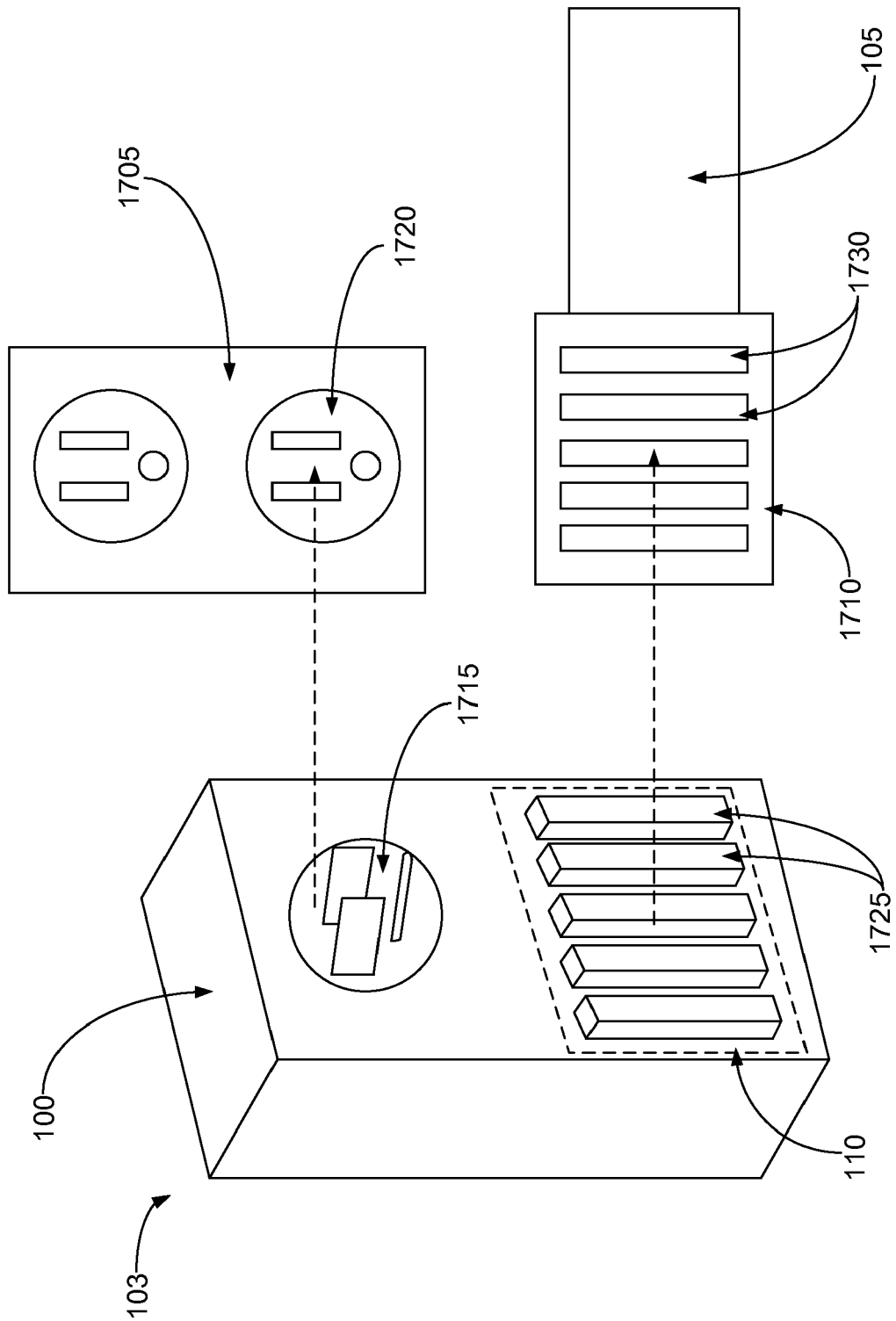
FIG. 17A is a schematic diagram of one example of a source device connection to an electrical outlet and a flat wire, according to an illustrative embodiment of the invention.

FIG. 17A is a schematic diagram of one example of a source device connection to an electrical outlet 1705 and a flat wire 105, according to an illustrative embodiment of the invention. The source device 103 may be connected to a termination device 1710 associated with the flat wire 105. With reference to FIG. 17A, the source device 103 of the ASD 100 may include an electrical plug 1715 that is configured to be plugged into a corresponding socket 1720 of an electrical outlet 1705. Additionally, the source module 110 of the ASD 100 may include one or more source termination points 1725 that are configured to be plugged into one or more corresponding termination plugs 1730 associated with the termination device 1710. The flat wire 105 may be connected to the termination device 1710, and each conductor of the flat wire 105 may be terminated at a respective termination plug 1730 of the termination device 1710. The conductors of the flat wire 105 may be terminated at the termination device 1710 in an appropriate order, for example, in a G-N-H-N-G configuration. For example, a grounding conductor 220 of the flat wire 105 may be terminated first and then the other conductors of the flat wire 105 may be terminated in order until the other grounding conductor 225 is terminated. Given the symmetry of the flat wire 105 example described in this disclosure, the flat wire 105 should be terminated correctly regardless of which grounding conductor 220, 225 is terminated first provided that a G-N-H-N-G configuration is used and that the flat wire 105 conductors are terminated in order starting with a grounding conductor 220, 225.

With continued reference to FIG. 17A, when the ASD 100 is plugged into the electrical outlet 1705, the source termination 1725 points will also be connected to the corresponding termination plugs 1730 of the termination device 1710. When the ASD 100 is unplugged from the electrical outlet 1705, the connection with the termination device 1710 will also be severed. Additionally, the termination device 1710 may be situated remotely from the electrical outlet 1705, requiring the ASD 100 to complete the connection between the line side power source 115 and the flat wire 105. Accordingly, the ASD 100 may test the flat wire 105 prior to the communication of an electrical power signal from the line side power source 115 to the flat wire 105.

As shown in FIG. 17A, the source termination points 1725 are male termination points and the corresponding termination plugs 1730 of the termination device 1710 are female termination points. However, as desired, the source device 103 may include female termination points and the termination device 1710 may include male termination points. Additionally, as desired, other suitable types of connections may be utilized between the source device 103 and the termination device 1710. Additionally, the connections illustrated in FIG. 17A only require the use of one socket 1720 of an electrical outlet 1705. Accordingly, any remaining sockets of the electrical outlet 1705 may be free for use with other devices.

Figure 17B:
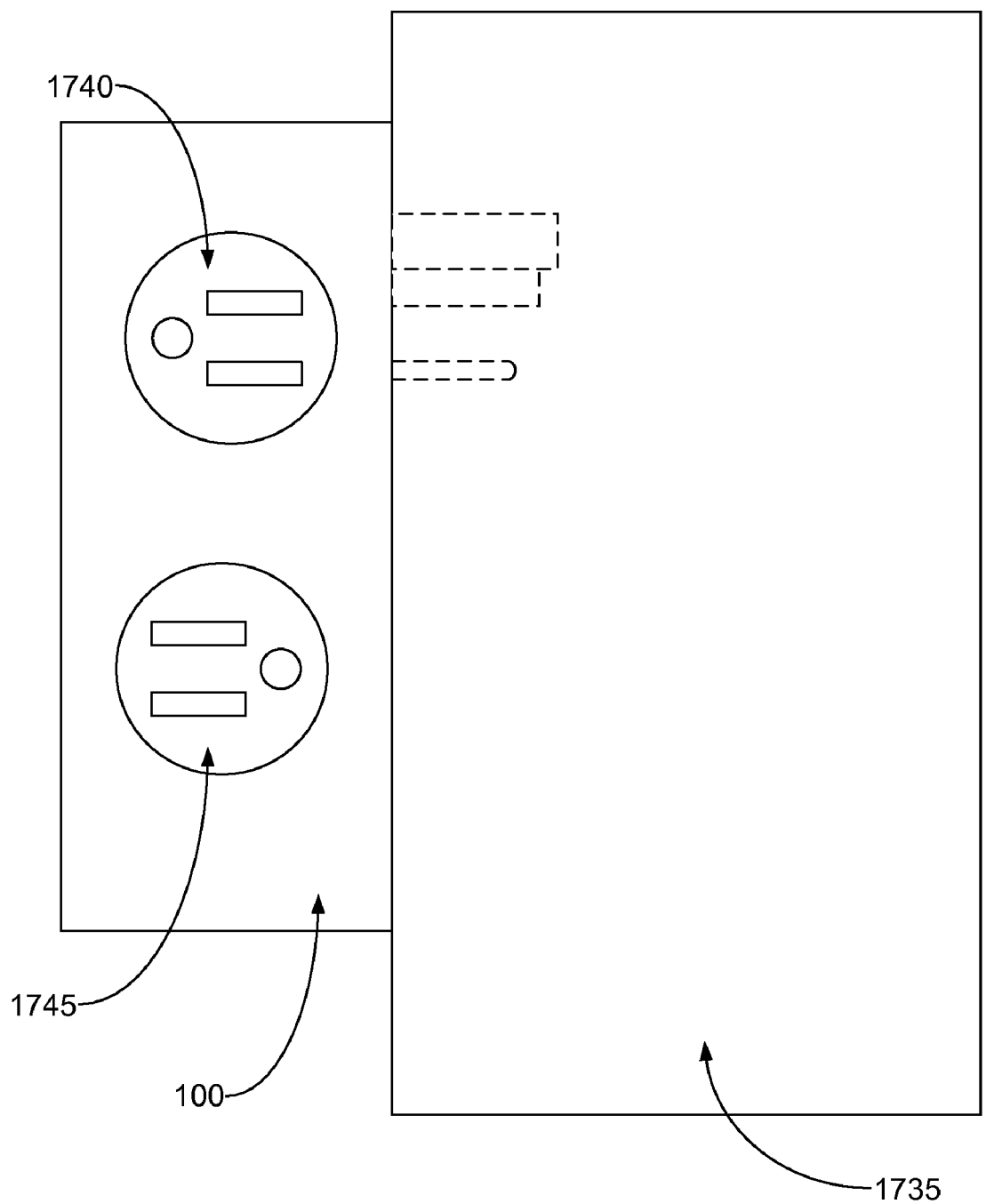
FIG. 17B is a schematic diagram of an example ASD with extender outlets, according to an illustrative embodiment of the invention.

According to another aspect of the invention, the ASD 100 may include or incorporate one or more electrical sockets or extender outlets that permit standard electrical plugs to be plugged into the ASD 100. FIG. 17B is a schematic diagram of an ASD 100 that includes extender outlets, according to an illustrative embodiment of the invention. The ASD 100 of FIG. 17B is illustrated as being plugged into an electrical socket, such as the electrical socket 1705 of FIG. 17A, that is situated on a wall 1735. As desired, the ASD 100 may include any number of extender outlets and the extender outlets may be situated on any surface of the ASD 100. As shown in FIG. 17B, the ASD 100 may include two extender outlets 1740, 1745 on a peripheral surface of the ASD 100 that extends from the front of the ASD 100 to the front surface of the wall 1735. The extender outlets 1740, 1745 may be configured in such a manner that the female connections of the extender outlets 1740, 1745 are situated in a horizontal manner relative to the floor or ceiling of a room. Accordingly, each of the extender outlets 1740, 1745 may permit an electrical plug that includes a transformer to be inserted without contacting the wall 1735. The extender outlets 1740, 1745 may be configured in such a manner that their female connections are situated in any suitable, manner, for example, that of the standard electrical outlet 1705 of FIG. 17A. Additionally, a destination device 117 may include one or more electrical outlets.

Figure 18:
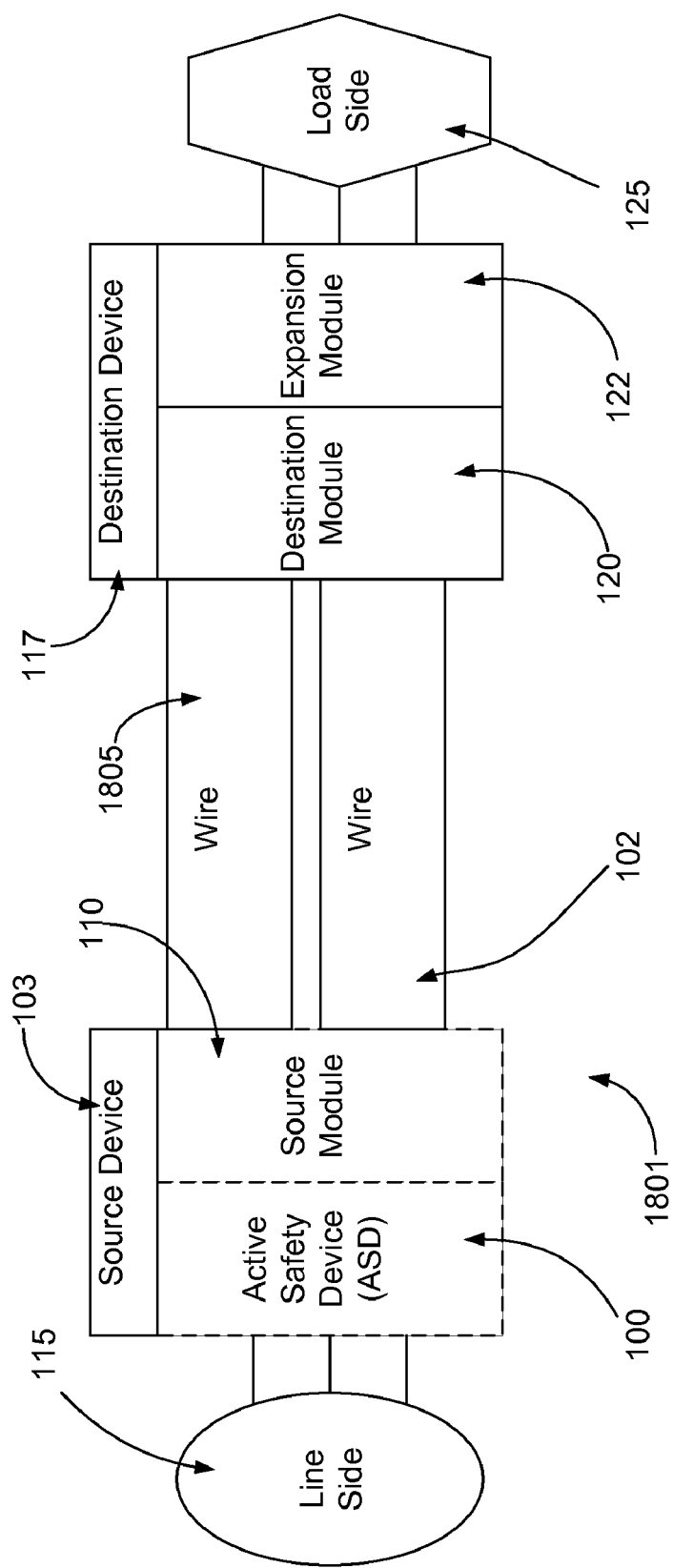
FIG. 18 is a schematic diagram of a wire system including an Active Safety Device (ASD) that monitors two wires connected to the same destination device, according to an illustrative embodiment of the invention.

According to another aspect of the invention, the ASD 100 may be capable of supporting and monitoring more than one wire 102. Multiple wires 102, such as multiple flat wires 105 or multiple conventional wires 107, may extend from the ASD 100 to separate destination modules 120 or separate loads 125. Alternatively or additionally, more than one wire 102 may be disposed between the ASD 100 and a destination device 117 or the load 125, as shown in FIG. 18. Illustrated in FIG. 18 is a schematic diagram of a wire system 1801 including an ASD 100 that monitors two wires 102, 1805 connected to the same destination device 117, according to an illustrative embodiment of the invention. For example, as shown in FIG. 18, both a primary wire 102 and a secondary wire 1805 may extend from the ASD 100 to a destination device 117. If the ASD 100 detects a wire fault or miswire in the primary wire 102, then the ASD 100 may maintain the relay 310 connected to the primary wire 102 in its open position, thereby preventing electrification of the primary wire 102. The ASD 100 may then close a relay connected to the secondary wire 1805 and allow electrification of the secondary wire 1805 in order to power the load 125. The secondary wire 1805 may be monitored by the ASD 100 in the same manner as the primary wire 102. Additionally, the control unit 312 of the ASD 100 or, alternatively, a safety component of the ASD 100, may provide an indication of the change to the secondary wire 1805 to a user. This indication may be any control action such as activating an LED that indicates the change by the ASD 100 to the secondary flat wire 1805. Another control action that may be taken is the transmission of a message indicating the change by the ASD 100 to the secondary flat wire 1805. The message may be transmitted to another ASD 100, to a central hub or control panel, or to another destination, as will be explained in greater detail below.

According to another aspect of the invention, an ASD 100 or source device 103 containing an ASD 100 may be used in conjunction with more than one destination device 117, and the destination devices may be connected in series. FIG. 19 is a schematic diagram of multiple destination devices 117a-n in a serial configuration being supported by a single source device 103, according to an illustrative embodiment of the invention. As shown in FIG. 19, a single source device 103 containing an ASD 100 may monitor a wire 102 that runs from the source device 103 to a series of destination devices 117a-n. Each of the destination devices 117a-n may be an electrical load such as an outlet assembly or receptacle. This type of configuration may also be referred to as an add-a-receptacle configuration or as a daisy chain configuration. Any number of ASD's and/or destination devices may be connected in series. Additionally, a variety of different types of wiring may be connected between any ASD and any destination device, such as flat wire 105 or conventional wire 107. Furthermore, there is no requirement that the same type of wire be utilized throughout the series or daisy chain configuration.

Figure 19:
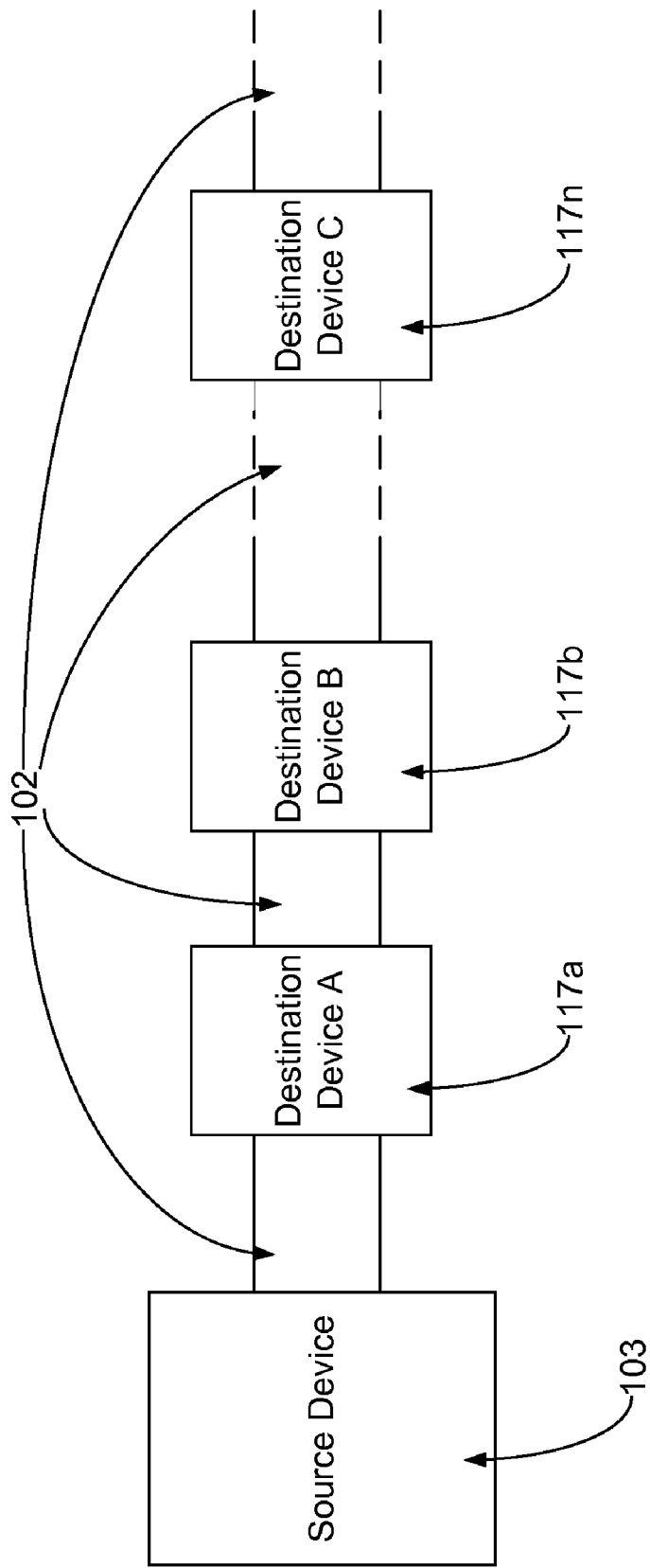
FIG. 19 is a schematic diagram of multiple destination devices in a serial configuration being supported by a single source device, according to an illustrative embodiment of an aspect of the invention.

As shown in FIG. 19, a wire 102 may extend from the source device 103 through each destination device 117a-n. An input segment of the wire 102 may be terminated at each destination device 117a-n and then a new output segment of wire 102 may be used to connect the next destination device 117a-n. For example, a first segment of wire 102 may connect the source module 110 to the destination module 120 of the first destination device 117a, where the first segment of wire 102 is terminated. A separate segment of wire 102 may then connect the first destination device 117a to the second destination device 117b. This pattern may continue until the wire 102 reaches the last destination device 117n. Alternatively, a single segment of wire 102, such as a single segment of flat wire 105 or a single segment of conventional wire 107, may be used to connect all of the destination device 117a-n. Each destination device 117a-n may be connected to the wire 102 with a suitable terminal that connects each conductor of the wire 102 to the destination device 117a-n. Termination points within the destination module 120 and expansion module 122 of each destination device 117, which are used to connect the wire 102 to the destination device 117, may include terminal blocks, crimp-on terminals, plug and socket connectors, insulation displacement connectors (IDC), conductor penetration connectors (CPC), or any other electrical connector as desired in various embodiments.

Each destination device 117a-n may include a relay in communication with and controlled by the ASD 100 for passing the signal carried by the wire 102 on to the next destination device 117a-n. For example, the first destination device 117a may include a relay that passes the electrical power and/or signals carried by the wire 102 on to the second destination device 117b. The wire 102 may be relayed through each destination device 117a-n-1 until the wire 102 reaches the last destination device 117n, at which point no relay is necessary. Optionally, each destination device 117 may include a DWI component 340 that is used to test the wire 102 extending from the destination device 117 to the next downstream destination device. The relays may be time delay relays, meaning that each of the relays may be actuated or closed after it receives power for a minimum period of time. The period of time that each relay needs to receive power before it is actuated may be a period of time that is sufficient for testing the next downstream segment of wire 102, for example, approximately 375 milliseconds. Additionally, the period of time that each relay needs to receive power before it is actuated may be an adjustable period of time. As an alternative to a relay, each destination module 117a-n may include a control unit or other control logic that is in communication with the ASD 100, and that is used to isolate a flaw in the wire 102, as described in greater detail below with reference to destination device 117a-n that include relays.

Additionally, each of the destination devices 117a-n may be in communication with the ASD 100, as described in greater detail below. While the ASD 100 is monitoring the wire 102, if a miswire or fault is detected in the wire 102, then the miswire or fault may be isolated by the ASD 100 by using the relays. As an example, before the relay 310 of the ASD 100 is closed, the ASD 100 may test the wire 102 for miswire or faults. The ASD 100 may first test the first segment of wire 102 that runs between the source module 110 and the destination module 120 of the first destination device 117a. If a miswire or fault is detected, then the ASD 100 may maintain the relay 310 in its open position and prevent electrification of the wire 102. If no miswire or fault is detected in the first segment of the wire 102, then the ASD 100 may test the combined first segment of the wire 102 and the second segment of the wire 102 that connects the first destination device 117a and the second destination device 117b. If a miswire or fault is detected, then the ASD 100 may prevent electrification of the wire 102 or it may transmit a signal to the relay of the first destination device 117a instructing the relay to remain open. The first segment of the wire 102 may then be electrified permitting a load connected to the first destination device 117a to receive power; however, none of the destination devices 117b-n connected down the line from the first destination device 117a will receive power. In this regard, a miswire or fault in the wire 102 may be isolated by the ASD 100, and any destination devices 117a-n connected to the ASD 100 prior to the wire segment containing the miswire or fault are identified and may be permitted to receive power. The other wire segments may be prevented from receiving power. As another example, if the ASD 100 detects a miswire or fault in a wire 102 while the wire 102 is electrified, then the ASD 100 may open its relay 310 and de-energize the wire 102. Then, the ASD 100 may use the method described in the example above to isolate the segment of the wire 102 in which the miswire or fault occurs, and the ASD 100 may allow electrification of the wire 102 up until the segment of the flat wire 105 at which the miswire or fault occurs. As another example, in order to avoid timing delays associated with incremental testing, an entire length of wire 102 (or more than a single wire segment) may be tested prior to electrifying the wire 102. In order to accomplish this, the relays in each of the destination devices 117a-n may be closed and a test signal may be communicated through the wire 102 by the ASD 100. If a miswire or fault is detected in the wire 102, then the incremental method described above may be utilized to isolate the miswire or fault.

Alternatively, if each destination device 117a-n includes a DWI component 340, then each destination device 117a-n may test the next downstream segment of wire 102 before that segment of wire 102 is electrified. The tests performed by the DWI component 340 of each destination device 117a-n may also be used to isolate a miswire or fault in the wire 102 and prevent the miswired or faulty segment of wire 102 and any downstream wire segments and/or electrical loads from receiving electrical power. As an example, the ASD 100 may first test the first segment of wire 102 that runs between the source module 110 and the destination module 120 of the first destination device 117a. If a miswire or fault is detected, then the ASD 100 may maintain the relay 310 in its open position and prevent electrification of the wire 102. If no miswire or fault is detected in the first segment of the wire 102, then the ASD 100 may allow the first segment of the wire 102 to be electrified. Then, the DWI component 340 of the first destination device 117a may test the second segment of the wire 102 that connects the first destination device 117a and the second destination device 117b. If a miswire or fault is detected, then the first destination device 117a may prevent electrification of the second segment of the wire 102 by opening the relay of the first destination device 117a. If, however, no miswire or fault is detected in the second segment of the wire 102, then the first destination device 117a may allow the second segment of the flat wire 105 to be electrified. The destination devices 117b-n downstream from the first destination device 117a may contain the same functionality as the first destination device 117a. Accordingly, a miswire or fault in the wire 102 may be isolated by the ASD 100 and any destination devices 117a-n connected to the ASD 100 prior to the miswired or faulty segment of wire 102 are identified and may be permitted to receive power. The other wire segments are prevented from receiving power. As another example, if the ASD 100 detects a miswire or fault in a wire 102 while the wire 102 is electrified, then the ASD 100 may open its relay 310 and de-energize the wire 102. Then, the ASD 100 and the destination devices 117a-n may use the method described in the example above to isolate the segment of the wire 102 in which the miswire or fault occurs, and the ASD 100 and the destination devices 117a-n may allow electrification of the wire 102 up until the segment of the wire 102 at which the miswire or fault occurs.

Additionally, in certain embodiments of the invention, any segments of the wire 102 that have been isolated may be retested by the ASD 100 and/or the associated destination devices 117a-n at one or more points in time that are subsequent to the time at which a fault or miswire was identified. In this regard, it may be determined whether a fault or miswire remains on the one or more isolated segments of the wire 102. If it is determined that a fault is no longer present, then the one or more isolated segments of the wire 102 may be permitted to receive electrical power. However, if it is determined that a fault is still present, then the one or more isolated segments may remain isolated and not be permitted to receive electrical power. The one or more isolated segments of wire 102 may be continuously or periodically tested in order to determine whether a fault is no longer present. A wide variety of different time intervals may be utilized as desired in certain embodiments of the invention to periodically test the one or more isolated segments. For example, the isolated segments may be tested approximately every one (1) minute, approximately every 10 minutes, or approximately every one (1) hour. As another example, the wire 102 may be continuously monitored to determine whether a fault is no longer present.

Additionally, if multiple segments of wire 102 are used to connect each destination device 117a-n, then the ASD 100 may cause a switch in each destination device 117a-n to be toggled in order to route a signal transmitted over the wire 102 through a secondary wire segment rather than a primary wire segment, as described above with reference to FIG. 17. Using the previous example prior to the electrification of the wire 102, if a miswire or fault existed in a segment of wire 102 that connected the first destination device 117a and the second destination device 117b, then the ASD 100 may cause a switch in the first destination device 117a to be toggled in order to switch the segment of wire 102 that connects the first destination device 117a and the second destination device 117b to a secondary segment of wire 1805 rather than a primary segment of wire 102. At this point, the ASD 100 and/or the destination devices 117a-n may resume testing of the wire 102 by testing the secondary segment of wire 102 that connects the first destination device 117a and the second destination device 117b.

Figure 20:
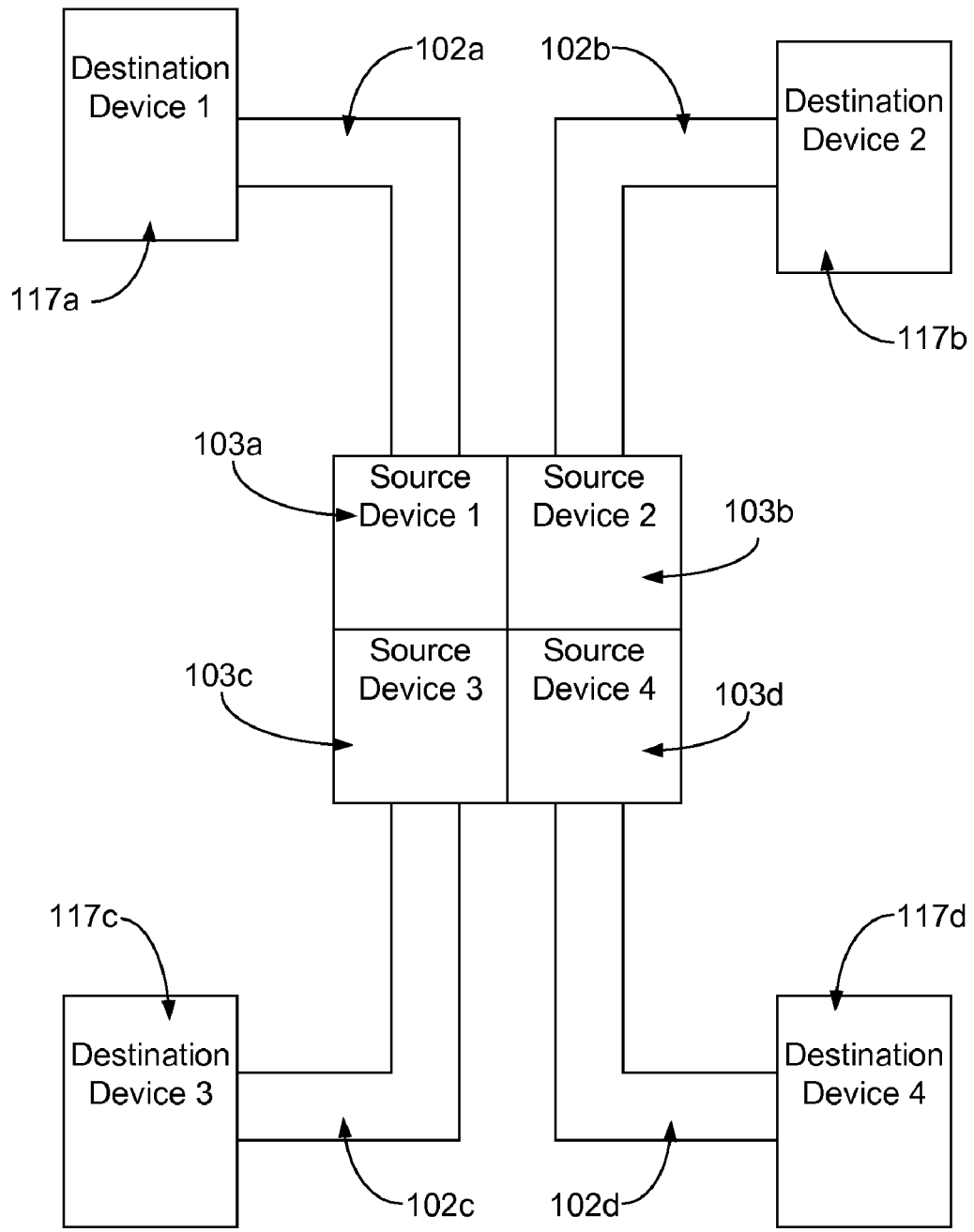
FIG. 20 is a schematic diagram of a system in which multiple source devices form a central device that monitors multiple wires in a room, according to an illustrative embodiment of an aspect of the invention.

FIG. 20 is a schematic diagram of a system in which multiple source devices 103a-d form a central device that monitors multiple wires 102a-d in a room, according to an illustrative embodiment of the invention. The monitored wires may be one or more of a wide variety of different wires, such as flat wires 105 and/or conventional wires 107. Each source device 103 may contain an ASD 100. As shown in FIG. 19, more than one source device 103a-d may be assembled into a single device that is capable of monitoring multiple branches of wire 102a-d extending from the combined device. Accordingly, the combined device may form a central device that is capable of controlling multiple wire branches 102a-d. Each of the wire branches 102a-d may be terminated at a destination device 117a-d. For example, the combined source device 103a-d may be placed in, on, or near one wall of a room and separate wire branches 102a-d may extend from the combined source device to each wall of the room. The individual ASD's within the combined source device may then monitor one or more of the wire branches 102a-d extending from the combined device. Although the central device of FIG. 19 is depicted as a combination of source devices 103a-d, a single device may be utilized in accordance with certain embodiments of the invention to monitor multiple wire branches 102a-d.

Figure 21:
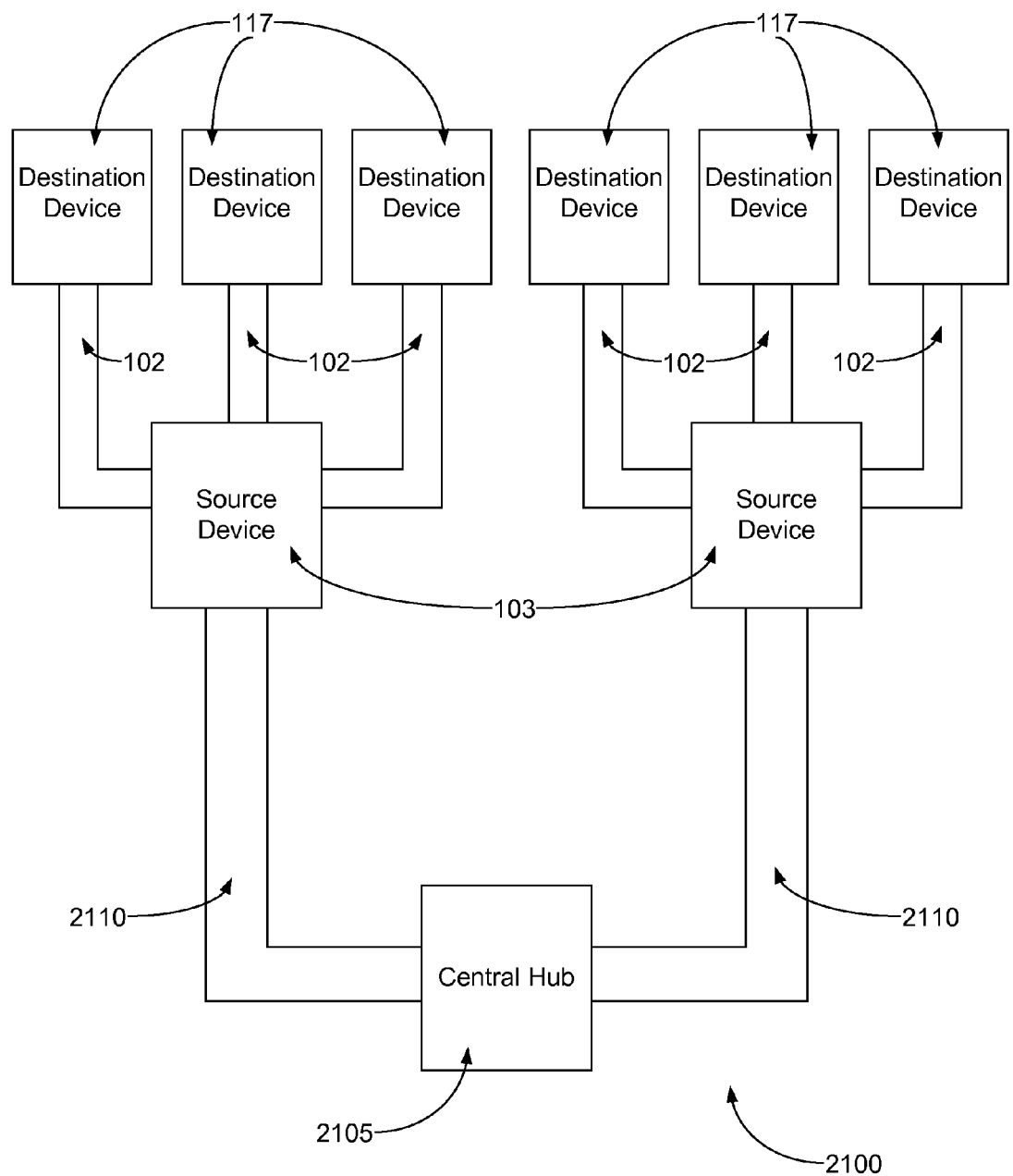
FIG. 21 is a schematic diagram of a network of source devices monitored by a central hub, according to an illustrative embodiment of one aspect of the invention.

FIG. 21 is a schematic diagram of a wire network 2100 that includes a network of source devices 103 monitored by a central hub 2105, according to an illustrative embodiment of the invention. Each of the source devices 103 may include one or more ASD's 100 capable of monitoring wire branches 102 connected to the source devices 103. The wire branches 102 may include one or more different types of wire, such as flat wire 105 and/or conventional wire 107. A network may be established in which one or more electrical wires 2110, which may be conventional wire 107 and/or flat wire 105, are connected between the central hub 2105, which may be associated with a common circuit breaker box, to each room in a building. Each of these electrical wires 2110 may be connected to a source device 103 in a separate room. Accordingly, each source device 103 may be used as a power center that services an entire room.

This method of wiring may be, for example, an inexpensive way to rewire a home using flat wire where in-wall renovation is not practical, such as in some older homes. Once an electrical wire has been extended from the central hub 2105 to a room, the flat wire 105 becomes an economical and feasible way to distribute power to each of the room's walls or to the room's ceiling or floor. Although flat wire 105 may be used in accordance with certain embodiments of the invention to distribute power within a room, other embodiments of the invention may utilize conventional wire 107 and/or other types of wiring to distribute power within a room. The source devices 103 may then facilitate the monitoring of these various types of wiring within the room.

The source devices 103 may act as a power center that services each room by providing a gateway between the electrical wire 2110 and the wire 102 branch circuits within the room. Each of the wire 102 branch circuits may be connected to one or more destination devices 117, as previously described. Each of the source devices 103 shown in FIG. 21 may contain a single ASD 100 capable of monitoring one or more wire 102 branch circuits or, alternatively, each of the source devices 117 may contain more than one ASD 100 for monitoring wire 102 branch circuits, as described with reference to FIG. 20 above.

Within a room, each source device 103 may service any of the walls, ceiling, and floor with a wire 102 branch circuit. Each source device 103 may individually control the wire 102 branch circuits to which it is connected. Additionally, each source device 103 may communicate with branch circuit destination devices 117 over the wire 102 in order to monitor circuit safety and electrification status. As previously discussed, the destination devices 117 may include a relay, detection circuitry, and/or a control unit that is in communication with the source device 117 monitoring the wire branch circuit 102 to which the destination device 117 is connected. Accordingly, any segment of the wire network may be isolated and shut off if a flaw is detected in that segment. Additionally, each source device 117 may be surface mounted on a wall or mounted inside a wall within the room, or situated nearby.

Each source device 103 also may communicate with a central hub 2105. The central hub is preferably located near the circuit breaker box or at least in the building. It also is possible, however, for the central hub 2105 to be situated remotely to the building. The central hub 2105 may collect data from each of the source devices 103 and provide safety and electrification status for all of the branch circuits 102 in the building. The central hub 2105 may also be surface mounted or mounted inside a wall.

If a wire 102 miswire or fault is detected on any given branch circuit, then either the central hub 2105 or the source device 103 controlling that branch circuit, or both, may render that branch circuit unusable and isolate it from the other branches. Alternatively a downstream destination device 117 connected to a source device 103 may render the miswired or faulty branch circuit unusable and isolate it from the other branches. In other words, that branch circuit may not be permitted to be electrified. In this manner, a miswired or faulty branch circuit may be rendered unusable while at least a portion of the other branch circuits are not affected. Therefore, a penetration of a wire 102, such as flat wire 105 or conventional wire 107, or a miswire of the conductors of a wire 102, may only result in power loss in one branch of the wire network 2100.

According to another aspect of the invention, the wire 102 may be used to communicate signals. These signals may be communicated between any device in a wire network or wire branch circuit over the wire 102. Certain embodiments of the invention may communicate signals over flat wire 105 and/or conventional wire 107. For example, with reference to FIG. 20, a signal may be communicated between the ASD 100 in the source device 103 and any of the destination devices 117a-n over the wire 102. Similarly, with reference to FIG. 21, a signal may be transmitted over the wire 102 from one source device 103 to another source device 103 or between the central hub 2105 and one of the source devices 103. Additionally, devices in a wire network or wire branch circuit may be in communication with one another through wires, conductors, or optical fiber external to the wire 102 or, alternatively, through wireless communication means, for example, via a wireless local area network.

A communications signal may be transmitted over any of the conductors of the wire 102. A separate communications signal may be transmitted over each of the individual conductors of the wire 102. A signal may be communicated onto one or more of the conductors of the wire 102 by a suitable excitation circuit, such as, the excitation circuit described above with reference to FIG. 9B for flat wire 105 embodiments. The signal may then be identified and read from the one or more conductors of the wire 102 by a sense circuit, for example, the sense circuit described above with reference to FIG. 9B for flat wire 105 embodiments. As an example utilizing flat wire 105, the grounding conductors 220, 225 of the flat wire 105 may be used for communicating signals. The signal communicated across the grounding conductors 220, 225 may be a low voltage signal in the range of approximately 0.1 and 5.0 volts. Additionally, the frequency of a signal communicated across the grounding conductors 220, 225 may be a frequency at or above approximately 1000 Hz. There is normally no voltage or current present on the grounding conductors 220, 225; therefore, the grounding conductors 220, 225 may beneficially be used to transmit communications signals even when the flat wire 105 has been fully electrified. Similar to the grounding conductors 220, 225, a communications signal may be transmitted over the return conductors 210, 215 of a flat wire 105. The signal communicated across the return conductors 210, 215 may be a low voltage signal in a range of approximately 0.1 to 5.0 volts. Additionally, the frequency of a signal communicated across the return conductors 210, 215 may be a frequency at or above approximately 1000 Hz. A signal may be communicated across the conductors of the flat wire 105 while the flat wire 105 is electrified. As desired, a signal may include an appropriate identifier, for example, a signal header that may be utilized to identify the signal and, therefore, prevent false trips by one or more of the safety components of an ASD 100.

Continuing with the example using a flat wire 105, a communications signal may also be transmitted over the electrifiable conductor 205 of the flat wire 105. The signal communicated across the electrifiable conductor 205 may be a low voltage signal at a voltage of approximately 0.1 to 5.0 volts. Additionally, the frequency of a signal communicated across the electrifiable conductor 205 may be at a frequency at or above approximately 1000 Hz. A signal may be transmitted over the electrifiable conductor 205 both when the flat wire 105 is electrified and when the flat wire 105 is not electrified. In accordance with the flat wire 105 used in conjunction with the present disclosure, an electrified flat wire 105 may carry a voltage signal of approximately 110-130 volts (for North America applications) or approximately 230-250 volts (for European applications) at a frequency of approximately 50-60 Hertz. A communications signal, however, may still be transmitted over the electrifiable conductor 205 using suitable power line carrier (PLC) or broadband over power line (BPL) technology. A PLC or BPL signal transmitted over the electrifiable conductor 205 may be at a voltage of approximately 0.1 to 20 volts. In one embodiment, the voltage of the signal transmitted over the electrifiable conductor 205 may be at a voltage of approximately 0.1 to 5 volts. Additionally, a PLC or BPL signal transmitted over the electrifiable conductor 205 may be at a frequency that is greater than approximately one megahertz (MHz). For example, the frequency may be in a range of approximately 2 to 20 MHz, although frequencies up to and greater than approximately 40 MHz may be used in conjunction with certain embodiments of the invention. Additionally, as discussed above, a signal may include an appropriate identifier.

In certain embodiments of the invention, one or more communications signals may be communicated over one or more of the conductors of a conventional wire, such as wire 107. Communications signals may be communicated over the electrifiable conductor 250, the return conductor 255, and/or the grounding conductor 260 of a conventional wire 107 in a similar manner as that described above in the example using flat wire 105. Additionally, in certain other embodiments of the invention, communications signals may be communicated over one or more conductors of other types of wiring that may be utilized in association with a source device 103, an ASD 100, and/or a destination device 117.

According to another aspect of the invention, communications signals transmitted over one or more of the conductors of a wire 102 may be used to establish communication between devices that are connected by a wire 102. For example, the communications signals may be used to establish communication between two ASD's 100, between an ASD 100 and a destination device 117, or between an ASD 100 and a central hub 2105. Additionally, communication signals may be transmitted over the wire 102 by devices that are connected by the wire 102 according to a communications protocol. For example, the communications signals may be transmitted via a user datagram protocol (UDP), via a transmission control protocol (TCP), or via another suitable protocol as desired. Additionally, a communications signal may be used to establish a connection between two devices connected by a wire 102. The connection established may be point-to-point connection or it may be some other type of connection, such as a peer-to-peer or local area network connection.

Accordingly, example embodiments of the invention can provide the technical effects of creating a system, method, and apparatus that facilitates the monitoring of electrical wire for wire faults, miswires, and/or abnormal conditions. Example embodiments of the invention may further control the electrification of the electrical wire based upon the monitoring. The electrical wire may be monitored prior to electrification, during electrification, and/or after electrification.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general purpose computer, a special-purpose computer, a processor, or other programmable data processing apparatus to produce a particular machine, such that the instructions that execute on the computer, processor, or other programmable data processing apparatus create means for implementing one or more functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer usable medium having a computer readable program code or program instructions embodied therein, said computer readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special purpose hardware and computer instructions.

Many modifications and other embodiments of the invention set forth herein will come to mind to one skilled in the art to which embodiments of the invention pertain having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A source device for use with electrical wire, the source device comprising:
    a line side input configured to connect to a line side power source and receive an electrical power signal from the line side power source;
    a wire connection configured to connect to an electrical wire;
    at least one relay configured to control the communication of the electrical power signal onto the electrical wire; and
    a control unit associated with a line side wire integrity component configured to identify a plurality of conductors associated with the line side power source, the plurality of conductors comprising at least one electrifiable conductor, at least one return conductor, and at least one grounding conductor, wherein the line side wire integrity component is further configured to determine whether the plurality of identified conductors are properly terminated at the line side input and to control the actuation of the at least one relay based upon the determination.

2. The source device of claim 1, wherein the at least one relay and the control unit comprise an active safety device.

3. The source device of claim 1, wherein the control unit is further configured to test the electrical wire for at least one of miswires, wire faults, or abnormal conditions and to control the actuation of the at least one relay based at least in part on the testing of the electrical wire.

4. The source device of claim 3, wherein the control unit identifies a wire fault on the electrical wire, and
wherein the control unit is further configured to test the electrical wire subsequent to the identification of the wire fault and to determine whether the identified wire fault is still present on the electrical wire.

5. The source device of claim 4, wherein the control unit is further configured to electrify the electrical wire if it is determined that the identified wire fault is no longer present on the electrical wire.

6. The source device of claim 5, wherein the electrical wire is electrified by the control unit without receiving any user input.

7. The source device of claim 3, wherein the control unit is associated with at least one reactive safety component that is utilized in the testing of the electrical wire.

8. The source device of claim 7, wherein the at least one reactive safety component tests the electrical wire subsequent to the electrification of the electrical wire.

9. The source device of claim 7, wherein the at least one reactive safety component comprises one or more of a group consisting of a ground fault circuit interrupter, an arc fault circuit interrupter, an over-current protection safety component, and a ground current monitoring safety component.

10. The source device of claim 3, wherein the control unit is associated with at least one proactive safety component that is utilized in the testing of the electrical wire.

11. The source device of claim 10, wherein the at least one proactive safety component tests the electrical wire prior to the electrification of the electrical wire.

12. The source device of claim 10, wherein the at least one proactive safety component comprises a load side wire integrity component that is configured to communicate at least one test signal onto at least one conductor of the electrical wire, to monitor one or more of the conductors for one or more return signals, and to determine whether a miswire or wire fault exists based upon the one or more return signals.

13. An electrical wire system, comprising:
a source device configured to be coupled to a line side power source, wherein the source device comprises an active safety device and a first wire termination;
a destination device, wherein the destination device comprises a second wire termination; and
an electrical wire having a first end coupled to the first wire termination and a second end coupled to the second wire termination;
wherein the active safety device is configured to (i) identify a plurality of conductors associated with the line side power source, the plurality of conductors comprising at least one electrifiable conductor, at least one return conductor, and at least one grounding conductor, (ii) determine whether the plurality of identified conductors are properly terminated at the line side input, and (iii) control the communication of an electrical power signal from the line side power source to the electrical wire based upon the determination.

14. The electrical wire system of claim 13, wherein the active safety device is further configured to monitor the electrical wire for at least one of miswires, wire faults, or abnormal conditions and, based upon the monitoring, to control the communication of the electrical power signal from the line side power source to the electrical wire.

15. A method for monitoring an electrical wire terminated between a source and a destination, the method comprising:
identifying a plurality of line side conductors connected to the source opposite the electrical wire, the plurality of conductors comprising at least one electrifiable conductor, at least one return conductor, and at least one grounding conductor;
determining, based at least in part on the monitoring, whether the plurality of identified conductors are properly terminated at the source; and
controlling communication of an electrical power signal from a power source to the electrical wire based at least in part on results of the determination.

16. The method of claim 15, further comprising:
testing one or more conductors of the electrical wire for at least one of miswires, wire faults or abnormal conditions; and
controlling communication of the electrical power signal from the power source to the electrical wire based at least in part on results of the testing.

17. The method of claim 16, wherein testing one or more conductors of the electrical wire comprises testing one or more conductors of an electrified wire, and further comprising:
identifying at least one wire fault or abnormal condition on the one or more conductors; and
in response to identifying at least one wire fault or abnormal condition, de-energizing the electrical wire by ceasing the communication of the electrical power signal onto the electrical wire.

18. The method of claim 17, further comprising:
conducting additional testing on the one or more conductors of the electrical wire; and
determining, based at least in part on the additional testing, whether the identified at least one wire fault or abnormal condition is still present on the electrical wire.

19. The method of claim 16, wherein testing one or more conductors of the electrical wire comprises testing one or more conductors of the wire prior to electrifying the wire, and further comprising:
identifying at least one wire fault or abnormal condition on the one or more conductors; and
in response to identifying the at least one wire fault or abnormal condition, preventing the electrification of the wire.

* * * * *